United States Patent
Yang et al.

(10) Patent No.: US 7,223,323 B2
(45) Date of Patent: *May 29, 2007

(54) MULTI-CHEMISTRY PLATING SYSTEM

(75) Inventors: Michael X. Yang, Palo Alto, CA (US); Ming Xi, Palo Alto, CA (US); Russell C. Ellwanger, San Jun Bautista, CA (US); Eric B. Britcher, Rancho Cucamonga, CA (US); Bernardo Donoso, San Jose, CA (US); Lily L. Pang, Fremont, CA (US); Svetlana Sherman, San Jose, CA (US); Henry Ho, San Jose, CA (US); Anh N. Nguyen, Milpitas, CA (US); Alexander N. Lerner, San Jose, CA (US); Allen L. D'Ambra, Burlingame, CA (US); Arulkumar Shanmugasundram, Sunnyvale, CA (US); Tetsuya Ishikawa, Saratoga, CA (US); Yevgeniy Rabinovich, Fremont, CA (US); Dmitry Lubomirsky, Cupertino, CA (US); Yeuk-Fai Edwin Mok, San Francisco, CA (US); Son T. Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 218 days.

This patent is subject to a terminal disclaimer.

(21) Appl. No.: 10/616,284

(22) Filed: Jul. 8, 2003

(65) Prior Publication Data

US 2004/0016637 A1    Jan. 29, 2004

Related U.S. Application Data

(63) Continuation-in-part of application No. 10/438,624, filed on May 14, 2003, application No. 10/616,284, which is a continuation-in-part of application No. 10/268,284, filed on Oct. 9, 2002.

(60) Provisional application No. 60/463,970, filed on Apr. 18, 2003, provisional application No. 60/463,860, filed on Apr. 18, 2003, provisional application No. 60/463,862, filed on Apr. 18, 2003, provisional application No. 60/463,956, filed on Apr. 18, 2003, provisional application No. 60/448,575, filed on Feb. 18, 2003, provisional application No. 60/435,121, filed on Dec. 19, 2002, provisional application No. 60/398,345, filed on Jul. 24, 2002.

(51) Int. Cl.
*C25B 9/12* (2006.01)
*C35D 3/38* (2006.01)
*B08B 3/02* (2006.01)

(52) U.S. Cl. ............... 204/242; 204/228.8; 204/275.1; 205/157; 205/191; 134/26; 134/148; 134/151; 134/153

(58) Field of Classification Search ............... 204/232, 204/240, 282, 286.1, 287, 224 R, 224 M, 204/242, 267, 228.8, 275.1; 134/61, 66, 134/149, 153, 157, 902, 26, 148, 151; 205/157, 205/291

See application file for complete search history.

(56) References Cited

U.S. PATENT DOCUMENTS

| | | |
|---|---|---|
| 4,296,672 A | 10/1981 | Inhofer |
| 4,469,564 A | 9/1984 | Okinaka et al. |
| 4,632,851 A | 12/1986 | Broadbent et al. |
| 4,840,820 A | 6/1989 | Schultz et al. |
| 5,071,591 A | 12/1991 | Sheridan |
| 5,162,079 A | 11/1992 | Brown |
| 5,224,504 A | 7/1993 | Thompson et al. |
| 5,252,196 A | 10/1993 | Sonnenberg et al. |
| 5,287,237 A | 2/1994 | Kitada et al. |
| 5,435,903 A | 7/1995 | Oda et al. |
| 5,482,680 A | 1/1996 | Wilkinson et al. |
| 5,486,264 A | 1/1996 | Ghandour |
| 5,489,341 A | 2/1996 | Bergman et al. |
| 5,516,418 A | 5/1996 | Doss et al. |
| 5,573,023 A | 11/1996 | Thompson et al. |
| 5,597,460 A | 1/1997 | Reynolds |
| 5,620,581 A | 4/1997 | Ang |

| | | |
|---|---|---|
| 5,643,456 A | 7/1997 | Smith et al. |
| 5,656,386 A | 8/1997 | Scherer et al. |
| 5,705,050 A | 1/1998 | Sampson et al. |
| 5,714,521 A | 2/1998 | Kedem et al. |
| 5,731,678 A | 3/1998 | Zila et al. |
| 5,744,019 A | 4/1998 | Ang |
| 5,785,833 A | 7/1998 | Vaughan |
| 5,837,120 A | 11/1998 | Forand et al. |
| 5,883,762 A | 3/1999 | Calhoun et al. |
| 5,984,341 A | 11/1999 | Kass et al. |
| 5,996,241 A | 12/1999 | Thompson et al. |
| 6,014,817 A | 1/2000 | Thompson et al. |
| 6,024,856 A | 2/2000 | Haydu et al. |
| 6,080,291 A | 6/2000 | Woodruff et al. |
| 6,090,260 A | 7/2000 | Inoue et al. |
| 6,099,702 A | 8/2000 | Reid et al. |
| 6,099,711 A | 8/2000 | Dahms |
| 6,099,712 A | 8/2000 | Ritzdorf et al. |
| 6,113,771 A | 9/2000 | Landau |
| 6,126,798 A | 10/2000 | Reid et al. |
| 6,132,857 A | 10/2000 | Champenois et al. |
| 6,136,163 A | 10/2000 | Cheung et al. |
| 6,156,167 A | 12/2000 | Patton et al. |
| 6,167,893 B1 | 1/2001 | Taatjes et al. |
| 6,179,983 B1 | 1/2001 | Reid et al. |
| 6,197,181 B1 | 3/2001 | Chen |
| 6,228,231 B1 | 5/2001 | Uzoh |
| 6,228,232 B1 | 5/2001 | Woodruff et al. |
| 6,248,222 B1 | 6/2001 | Wang |
| 6,254,742 B1 | 7/2001 | Hanson et al. |
| 6,261,433 B1 | 7/2001 | Landau |
| 6,267,853 B1 | 7/2001 | Dordi et al. |
| 6,270,635 B1 | 8/2001 | Woo |
| 6,273,110 B1 | 8/2001 | Davis et al. |
| 6,280,291 B1 | 8/2001 | Gromko et al. |
| 6,280,582 B1 | 8/2001 | Woodruff et al. |
| 6,290,833 B1 | 9/2001 | Chen |
| 6,309,981 B1 | 10/2001 | Mayer et al. |
| 6,319,387 B1 | 11/2001 | Krishnamoorthy et al. |
| 6,322,674 B1 | 11/2001 | Berner et al. |
| 6,322,678 B1 | 11/2001 | Woodruff et al. |
| 6,334,937 B1 | 1/2002 | Batz, Jr. et al. |
| 6,347,837 B1 | 2/2002 | Watson et al. |
| 6,368,475 B1 | 4/2002 | Hanson et al. |
| 6,374,837 B2 | 4/2002 | Scranton et al. |
| 6,379,522 B1 | 4/2002 | Landau |
| 6,383,352 B1 | 5/2002 | Shyu et al. |
| 6,391,166 B1 | 5/2002 | Wang |
| 6,395,101 B1 | 5/2002 | Scranton et al. |
| 6,395,152 B1 | 5/2002 | Wang |
| 6,409,892 B1 | 6/2002 | Woodruff et al. |
| 6,415,804 B1 * | 7/2002 | Pascal et al. ............... 134/182 |
| 6,423,642 B1 | 7/2002 | Peace et al. |
| 6,432,293 B1 | 8/2002 | Ogata et al. |
| 6,432,821 B1 | 8/2002 | Dubin et al. |
| 6,436,249 B1 | 8/2002 | Patton et al. |
| 6,440,295 B1 | 8/2002 | Wang |
| 6,503,375 B1 | 1/2003 | Maydan et al. |
| 6,518,184 B1 | 2/2003 | Chambers et al. |
| 6,521,102 B1 | 2/2003 | Dordi |
| 6,527,920 B1 | 3/2003 | Mayer et al. |
| 6,551,479 B1 | 4/2003 | Graham et al. |
| 6,551,487 B1 | 4/2003 | Reid et al. |
| 6,558,518 B1 * | 5/2003 | Sendai et al. ........... 204/224 R |
| 6,569,299 B1 | 5/2003 | Reid et al. |
| 6,576,110 B2 | 6/2003 | Maydan |
| 6,586,342 B1 | 7/2003 | Mayer et al. |
| 6,589,401 B1 | 7/2003 | Patton et al. |
| 6,589,874 B2 | 7/2003 | Andricacos et al. |
| 6,592,736 B2 | 7/2003 | Fulton et al. |
| 6,736,952 B2 | 5/2004 | Emesh et al. |
| 6,740,221 B2 | 5/2004 | Cheung et al. |
| 6,773,571 B1 | 8/2004 | Mayer et al. |
| 6,790,773 B1 | 9/2004 | Drewery et al. |
| 6,800,187 B1 | 10/2004 | Reid et al. |
| 6,884,335 B2 | 4/2005 | Webb et al. |
| 2001/0015321 A1 | 8/2001 | Reid |
| 2001/0032788 A1 * | 10/2001 | Woodruff et al. ........... 205/687 |
| 2001/0052465 A1 | 12/2001 | Dordi |
| 2002/0033340 A1 | 3/2002 | Cheung et al. |
| 2002/0063097 A1 | 5/2002 | Fukunaga et al. |
| 2002/0074233 A1 | 6/2002 | Ritzdorf et al. |
| 2002/0096508 A1 | 7/2002 | Weaver et al. |
| 2003/0000850 A1 | 1/2003 | Horkans |
| 2003/0010640 A1 | 1/2003 | Kholodenko |
| 2003/0029726 A1 | 2/2003 | Kovarsky et al. |
| 2003/0057098 A1 | 3/2003 | Sendai |
| 2003/0070695 A1 | 4/2003 | Emami et al. |
| 2003/0085133 A1 | 5/2003 | Totsuka et al. |
| 2003/0116445 A1 | 6/2003 | Sun et al. |
| 2003/0159937 A1 | 8/2003 | Grandikota et al. |
| 2004/0016636 A1 * | 1/2004 | Yang et al. ................. 204/237 |
| 2004/0016637 A1 | 1/2004 | Yang et al. |
| 2004/0016647 A1 | 1/2004 | Yang et al. |
| 2004/0074761 A1 | 4/2004 | Herchen et al. |
| 2004/0074762 A1 | 4/2004 | Keigler et al. |
| 2004/0118694 A1 | 6/2004 | Yang et al. |
| 2004/0134775 A1 | 7/2004 | Yang et al. |
| 2004/0149573 A1 | 8/2004 | Herchen |
| 2004/0192066 A1 | 9/2004 | Lubomirsky et al. |
| 2004/0195110 A1 | 10/2004 | Srinivasan et al. |
| 2004/0200725 A1 | 10/2004 | Yahalom |
| 2004/0206628 A1 | 10/2004 | Lubomirsky et al. |
| 2004/0209414 A1 * | 10/2004 | Mok et al. .................. 438/200 |
| 2004/0217005 A1 | 11/2004 | Yang et al. |

FOREIGN PATENT DOCUMENTS

| | | |
|---|---|---|
| WO | WO-98/27585 | 6/1998 |
| WO | WO 2001/096632 A3 | 12/2001 |
| WO | WO 2004/003410 A1 | 1/2004 |
| WO | WO 2005/007933 A1 | 1/2005 |

OTHER PUBLICATIONS

Colombo; "Wafer Back Surface Film Removal," Central R&D, SGS-Thomson Microelectronics, Agate Italy.

Pitney, "Ney Contact Manual" Oct. 1974.

Semitool Product Catalog (on-line) Oct. 27, 1998.

Singer, "Copper Has Enormous Benefits When Compared to Aluminum, but its Implementation Requires Some Fundamental Changes in Process Technologies," Semiconductor International Jun. 1998.

Singer, "Wafer Processing," Semiconductor International Jun. 1998.

PCT International Search Report from International Application No. PCT/US 2004/022183, dated Oct. 15, 2004.

PCT Notification Concerning Transmittal of Copy of International Preliminary Report on Patentability date Jan. 19, 2006 for PCT/US04/022183. (APPM/007669PC.03).

PCT Written Opinion of the International Searching Authority dated Jan. 19, 2006 for PCT/US04/022183. (APPM/007669PC.03).

International Search Report dated Aug. 22, 2005 regarding International Application No. PCT/US2005/016123 (APPM/007669PC04).

Taiwan Office Action for Taiwanese Patent Application No. 94115101, Dated Oct. 31, 2006 (APPM/007669.TAIW.04).

PCT International Search Report and the Written Opinion for International Application No. PCT/US04/12012 dated Sep. 5, 2006. (APPM/007669PC02).

* cited by examiner

Primary Examiner—Hoy King
Assistant Examiner—Lois Zheng
(74) *Attorney, Agent, or Firm*—Patterson & Sheridan, LLP

(57) ABSTRACT

Embodiments of the invention generally provide an electrochemical plating system. The plating system includes a substrate loading station positioned in communication with a mainframe processing platform, at least one substrate plating cell positioned on the mainframe, at least one substrate bevel cleaning cell positioned on the mainframe, and a stacked substrate annealing station positioned in communication with at least one of the mainframe and the loading station, each chamber in the stacked substrate annealing station having a heating plate, a cooling plate, and a substrate transfer robot therein.

1 Claim, 27 Drawing Sheets

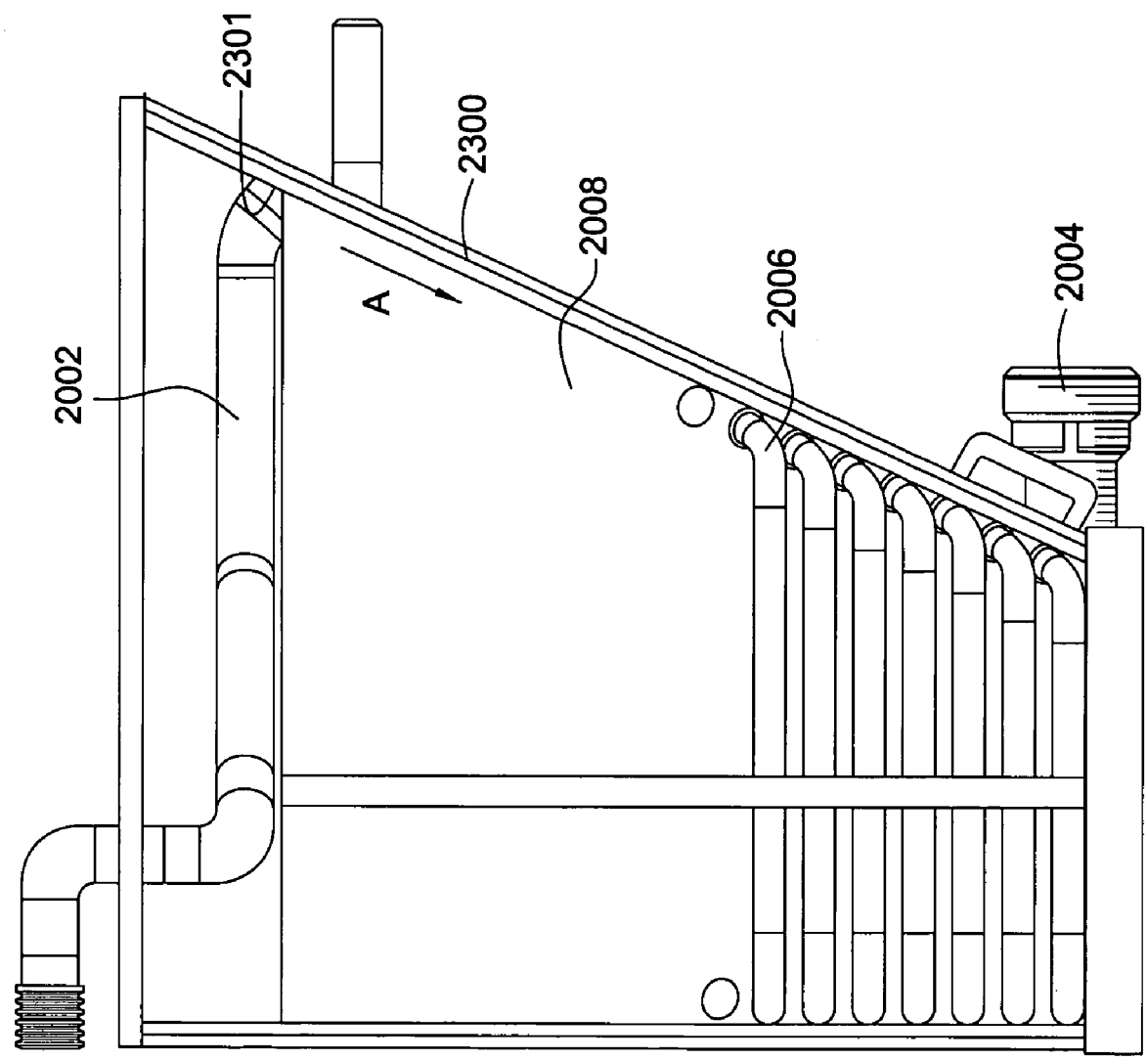

MULTI-CHEMISTRY PLATING SYSTEM

CROSS-REFERENCE TO RELATED APPLICATIONS

This application is a continuation-in-part of co-pending U.S. patent application Ser. No. 10/438,624, filed May 14, 2003, which claims benefit of U.S. Provisional Patent Application Ser. No. 60/435,121, filed Dec. 19, 2002. This application is also a continuation-in-part of co-pending U.S. patent application Ser. No. 10/268,284, filed Oct. 9, 2002, which claims benefit of U.S. Provisional Patent Application Ser. No. 60/398,345, filed Jul. 24, 2002. This application also claims priority under § 119 to the following U.S. provisional applications:
1) U.S. Provisional Patent Application Ser. No. 60/398,345, filed Jul. 24, 2002;
2) U.S. Provisional Patent Application Ser. No. 60/435,121, filed Dec. 19, 2002;
3) U.S. Provisional Patent Application Ser. No. 60/448,575, filed Feb. 18, 2003;
4) U.S. Provisional Patent Application Ser. No. 60/463,956, filed Apr. 18, 2003;
5) U.S. Provisional Patent Application Ser. No. 60/463,862, filed Apr. 18, 2003;
6) U.S. Provisional Patent Application Ser. No. 60/463,860, filed Apr. 18, 2003;
7) U.S. Provisional Patent Application Ser. No. 60/463,970, filed Apr. 18, 2003; and Each of the aforementioned related patent applications are hereby incorporated by reference in their entirety.

BACKGROUND OF THE INVENTION

1. Field of the Invention

Embodiments of the invention generally relate to an electrochemical plating system.

2. Description of the Related Art

Metallization of sub-quarter micron sized features is a foundational technology for present and future generations of integrated circuit manufacturing processes. More particularly, in devices such as ultra large scale integration-type devices, i.e., devices having integrated circuits with more than a million logic gates, the multilevel interconnects that lie at the heart of these devices are generally formed by filling high aspect ratio, i.e., greater than about 4:1, interconnect features with a conductive material, such as copper. Conventionally, deposition techniques such as chemical vapor deposition (CVD) and physical vapor deposition (PVD) have been used to fill these interconnect features. However, as the interconnect sizes decrease and aspect ratios increase, void-free interconnect feature fill via conventional metallization techniques becomes increasingly difficult. Therefore, plating techniques, i.e., electrochemical plating (ECP) and electroless plating, have emerged as promising processes for void free filling of sub-quarter micron sized high aspect ratio interconnect features in integrated circuit manufacturing processes.

In an ECP process, for example, sub-quarter micron sized high aspect ratio features formed into the surface of a substrate (or a layer deposited thereon) may be efficiently filled with a conductive material. ECP plating processes are generally two stage processes, wherein a seed layer is first formed over the surface features of the substrate (generally through PVD, CVD, or other deposition process in a separate tool), and then the surface features of the substrate are exposed to an electrolyte solution (in the ECP tool), while an electrical bias is applied between the seed layer and a copper anode positioned within the electrolyte solution. The electrolyte solution generally contains ions to be plated onto the surface of the substrate, and therefore, the application of the electrical bias causes these ions to be plated onto the biased seed layer, thus depositing a layer of the ions on the substrate surface that may fill the features.

Once the plating process is completed, the substrate is generally transferred to at least one of a substrate rinsing cell or a bevel clean cell. Bevel edge clean cells are generally configured to dispense an etchant onto the perimeter or bevel of the substrate to remove unwanted metal plated thereon. The substrate rinse cells, often called spin rinse dry cells, generally operate to rinse the surface of the substrate (both front and back) with a rinsing solution to remove any contaminants therefrom. Further the rinse cells are often configured to spin the substrate at a high rate of speed in order to spin off any remaining fluid droplets adhering to the substrate surface. Once the remaining fluid droplets are spun off, the substrate is generally clean and dry, and therefore, ready for transfer from the ECP tool. The bevel clean cells generally operate to clean the bevel of the substrate by dispensing an etchant solution onto the bevel while the substrate is rotated under the fluid dispensing nozzle. The etchant solution operates to clean the bevel of any unwanted materials generated during plating processes.

Thereafter, the cleaned/rinsed substrate is often transferred to an annealing chamber where the substrate is heated to a temperature sufficient to anneal the deposited film. However, the throughput of conventional plating systems may be limited by the availability of the annealing chamber, as an annealing process for a semiconductor substrate after plating may take several minutes. Further, once the annealing process is completed, the annealed substrate generally takes several minutes to cool down to a temperature that allows for transfer of the substrate to another processing chamber or device.

Embodiments of the invention generally provide an electrochemical plating system having multiple plating cells capable of using multiple chemistries, a substrate rinsing cell, a substrate cleaning cell, and a two position annealing chamber, all of which are in communication with the electrochemical plating system.

SUMMARY OF THE INVENTION

Embodiments of the invention generally provide an electrochemical plating system. The plating system includes a substrate loading station positioned in communication with a mainframe processing platform, at least one substrate plating cell positioned on the mainframe, at least one substrate bevel cleaning cell positioned on the mainframe, and a stacked substrate annealing station positioned in communication with at least one of the mainframe and the loading station, each chamber in the stacked substrate annealing station having a heating plate, a cooling plate, and a substrate transfer robot positioned therein.

Embodiments of the invention generally provide an electrochemical plating system that includes a substrate loading station positioned in communication with a mainframe processing platform, at least one substrate plating cell positioned on the mainframe, at least one substrate bevel cleaning cell positioned on the mainframe, and a stacked substrate annealing station positioned in communication with at least one of the mainframe and the loading station, each chamber in the stacked substrate annealing station having a heating plate and a cooling plate positioned therein.

Embodiments of the invention further provide a multi-chemistry plating system. The plating system includes a plurality of plating cells positioned on a common platform, a cleaning cell positioned on the platform, an annealing chamber positioned in communication with the platform, and a multi-chemistry fluid delivery system positioned in communication with the platform and in fluid communication with the plurality of plating cells, the fluid delivery system being configured to mix and distribute a plurality of fluid solutions to each of the plurality of plating cells.

Embodiments of the invention further provide an electrochemical plating system having a central mainframe with a substrate transfer robot positioned thereon. The mainframe includes means for mixing multiple plating chemistries in communication with the mainframe, a plurality of electrochemical plating cells positioned on the mainframe, means for delivering multiple chemical solutions to each of the plurality of electrochemical plating cells, the means for delivering being in fluid communication with the means for mixing, means for removing unwanted deposits from a bevel of a substrate, means for rinsing and drying the substrate, and means for annealing the substrate.

Embodiments of the invention further provide a multi-chemistry electrochemical plating system. The system includes an electrochemical plating cell positioned on a processing platform. The electrochemical plating cell includes a cell body configured to contain a plating solution and having an overflow weir positioned thereon, an anode positioned in the cell body, an ionic membrane positioned across the cell body at a position above the anode and below the overflow weir, the ionic-membrane separating an anolyte compartment below the membrane from a catholyte compartment above the membrane, and a porous diffusion member positioned in the cell body above the membrane and below the overflow weir. The system further includes a substrate cleaning cell positioned on the processing platform, and a stacked substrate annealing station positioned in communication with the processing platform.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 23 illustrates a partial perspective and sectional view of an exemplary tank of the invention.

DETAILED DESCRIPTION OF THE PREFERRED EMBODIMENT

Embodiments of the invention generally provide a multi-chemistry electrochemical plating system configured to plate conductive materials onto semiconductor substrates.

The plating system generally includes a substrate loading area in communication with a substrate processing platform. The loading area is generally configured to receive substrate containing cassettes and transfer substrates received from the cassettes to the processing platform for processing. The loading area generally includes a robot configured to transfer substrates to and from the cassettes and to the processing platform or a substrate annealing chamber positioned in communication with the loading area, processing platform, or a link tunnel positioned between the loading station and the processing platform. The processing platform generally includes at least one substrate transfer robot and a plurality of substrate processing cells, i.e., ECP cells, bevel clean cells, spin rinse dry cells, substrate cleaning cells, and/or electroless plating cells. The system of the invention allows for introduction of a dry substrate into a wet processing platform, wherein plating, cleaning (surface and bevel), drying, and annealing processes may be conducted on a unitary system platform. The plating process may utilize multiple plating chemistries and the output of the system is a dry, clean (both surface and bevel), and annealed substrate.

Figure 1:
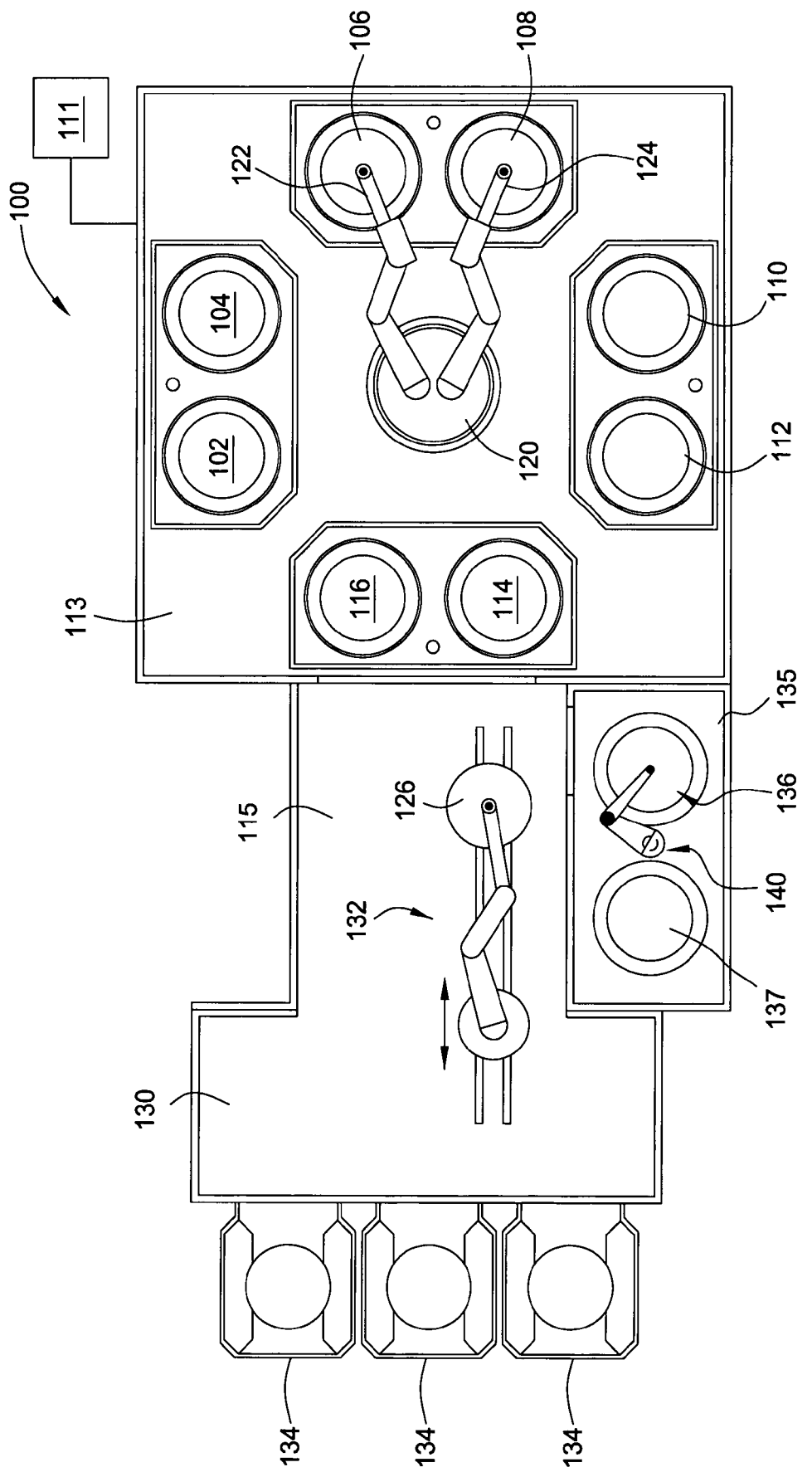
FIG. 1 is a top plan view of one embodiment of an electrochemical plating system of the invention.

FIG. 1 illustrates a top plan view of an ECP system 100 of the invention. ECP system 100 includes a factory interface (FI) 130, which is also generally termed a substrate loading station. Factory interface 130 includes a plurality of substrate loading stations configured to interface with substrate containing cassettes 134. A robot 132 is positioned in factory interface 130 and is configured to access substrates contained in the cassettes 134. Further, robot 132 also extends into a link tunnel 115 that connects factory interface 130 to processing mainframe or platform 113. The position of robot 132 allows the robot to access substrate cassettes 134 to retrieve substrates therefrom and then deliver the substrates to one of the processing cells 114, 116 positioned on the mainframe 113, or alternatively, to the annealing station 135. Similarly, robot 132 may be used to retrieve substrates from the processing cells 114, 116 or the annealing chamber 135 after a substrate processing sequence is complete. In this situation robot 132 may deliver the substrate back to one of the cassettes 134 for removal from system 100.

The anneal station 135, which will be further discussed herein, generally includes a two position annealing chamber, wherein a cooling plate/position 136 and a heating plate/position 137 are positioned adjacently with a substrate transfer robot 140 positioned proximate thereto, e.g., between the two stations. The robot 140 is generally configured to move substrates between the respective heating 137 and cooling plates 136. Further, although the anneal chamber 135 is illustrated as being positioned such that it is accessed from the link tunnel 115, embodiments of the invention are not limited to any particular configuration or placement. As such, the anneal station 135 may be positioned in direct communication with the mainframe 113, i.e., accessed by mainframe robot 120, or alternatively, the annealing station 135 may be position in communication with the mainframe 113, i.e., the annealing station may be positioned on the same system as mainframe 113, but may not be in direct contact with the mainframe 113 or accessible from the mainframe robot 120. For example, as illustrated in FIG. 1, the anneal station 135 may be positioned in direct communication with the link tunnel 115, which allows for access to mainframe 113, and as such, the anneal chamber 135 is illustrated as being in communication with the mainframe 113.

As mentioned above, ECP system 100 also includes a processing mainframe 113 having a substrate transfer robot 120 centrally positioned thereon. Robot 120 generally includes one or more arms/blades 122, 124 configured to support and transfer substrates thereon. Additionally, the robot 120 and the accompanying blades 122, 124 are generally configured to extend, rotate, and vertically move so that the robot 120 may insert and remove substrates to and from a plurality of processing locations 102, 104, 106, 108, 110, 112, 114, 116 positioned on the mainframe 113. Similarly, factory interface robot 132 also includes the ability to rotate, extend, and vertically move its substrate support blade, while also allowing for linear travel along the robot track that extends from the factory interface 130 to the mainframe 113. Generally, process locations 102, 104, 106, 108, 110, 112, 114, 116 may be any number of processing cells utilized in an electrochemical plating platform. More particularly, the process locations may be configured as electrochemical plating cells, rinsing cells, bevel clean cells, spin rinse dry cells, substrate surface cleaning cells (which collectively includes cleaning, rinsing, and etching cells), electroless plating cells, metrology inspection stations, and/or other processing cells that may be beneficially used in conjunction with a plating platform. Each of the respective processing cells and robots are generally in communication with a process controller 111, which may be a microprocessor-based control system configured to receive inputs from both a user and/or various sensors positioned on the system 100 and appropriately control the operation of system 100 in accordance with the inputs.

In the exemplary plating system illustrated in FIG. 1, the processing locations may be configured as follows. Processing locations 114 and 116 may be configured as an interface between the wet processing stations on the mainframe 113 and the dry processing regions in the link tunnel 115, annealing chamber 135, and the factory interface 130. The processing cells located at the interface locations may be spin rinse dry cells and/or substrate cleaning cells. More particularly, each of locations 114 and 116 may include both a spin rinse dry cell and a substrate cleaning cell in a stacked configuration. Locations 102, 104, 110, and 112 may be configured as plating cells, either electrochemical plating cells or electroless plating cells, for example. Locations 106, 108 may be configured as substrate bevel cleaning cells. Additional configurations and implementations of an electrochemical processing system are illustrated in commonly assigned U.S. patent application Ser. No. 10/435,121, filed on Dec. 19, 2002 entitled "Multi-Chemistry Electrochemical Processing System", now abandoned which is incorporated herein by reference in its entirety.

Figure 2:
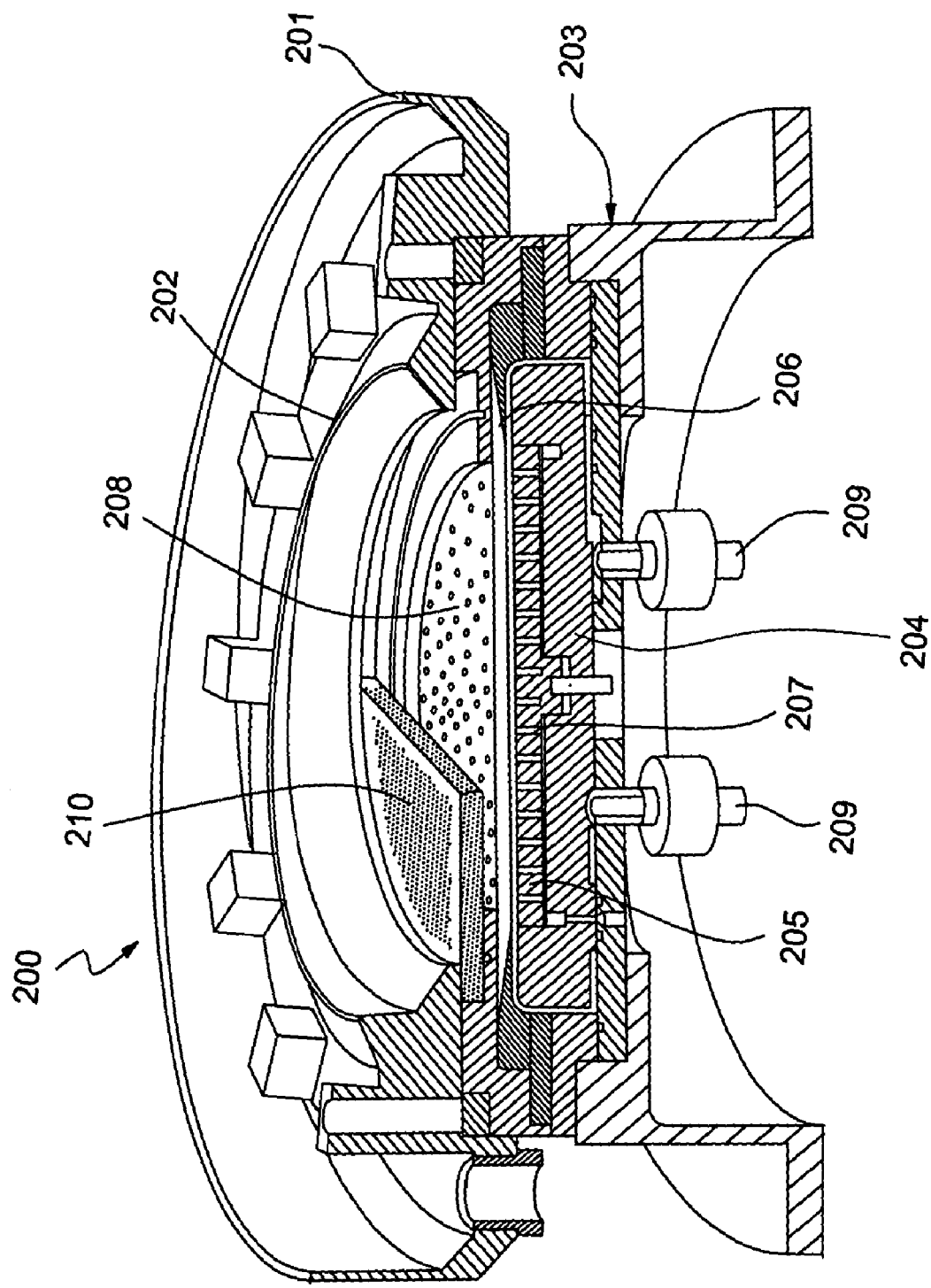
FIG. 2 illustrates an exemplary embodiment of a plating cell used in the electrochemical plating cell of the invention.

FIG. 2 illustrates a partial perspective and sectional view of an exemplary plating cell 200 that may be implemented in processing locations 102, 104, 110, and 112. The electrochemical plating cell 200 generally includes an outer basin 201 and an inner basin 202 positioned within outer basin 201. Inner basin 202 is generally configured to contain a plating solution that is used to plate a metal, e.g., copper, onto a substrate during an, electrochemical plating process. During the plating process, the plating solution is generally continuously supplied to inner basin 202 (at about 1 gallon per minute for a 10 liter plating cell, for example), and therefore, the plating solution continually overflows the uppermost point (generally termed a "weir") of inner basin 202 and is collected by outer basin 201 and drained therefrom for chemical management and recirculation. Plating cell 200 is generally positioned at a tilt angle, i.e., the frame portion 203 of plating cell 200 is generally elevated on one side such that the components of plating cell 200 are tilted between about 3° and about 30°, or generally between about 4° and about 10° for optimal results. The frame member 203 of plating cell 200 supports an annular base member on an upper portion thereof. Since frame member 203 is elevated on one side, the upper surface of base member 204 is generally tilted from the horizontal at an angle that corresponds to the angle of frame member 203 relative to a horizontal position. Base member 204 includes an annular or disk shaped recess formed into a central portion thereof, the annular recess being configured to receive a disk shaped anode member 205. Base member 204 further includes a plurality of fluid inlets/drains 209 extending from a lower surface thereof. Each of the fluid inlets/drains 209 are generally configured to individually supply or drain a fluid to or from either the anode compartment or the cathode compartment of plating cell 200. Anode member 205 generally includes a plurality of slots 207 formed therethrough, wherein the slots 207 are generally positioned in parallel orientation with each other across the surface of the anode 205. The parallel orientation allows for dense fluids generated at the anode surface to flow downwardly across the anode surface and into one of the slots 207. Plating cell 200 further includes a membrane support assembly 206. Membrane support assembly 206 is generally, secured at an outer periphery thereof to base member 204, and includes an interior region, configured to allow fluids to pass therethrough. A membrane 208 is stretched across the support 206 and operates to fluidly separate a catholyte chamber and anolyte chamber portions of the plating cell. The membrane support assembly may include an o-ring type seal positioned near a perimeter of the membrane, wherein the seal is configured to prevent fluids from traveling from one side of the membrane secured on the membrane support 206 to the other side of the membrane. A diffusion plate 210, which is generally a porous ceramic disk member is configured to generate a substantially laminar flow or even flow of fluid in the direction of the substrate being plated, is positioned in the cell between membrane 208 and the substrate being plated. The exemplary plating cell is further illustrated in commonly assigned U.S. patent application Ser. No. 10/268,284, which was filed on Oct. 9, 2002 under the title "Electrochemical Processing Cell", claiming priority to U.S. Provisional Application Ser. No. 60/398,345, which was filed on Jul. 24, 2002, both of which are incorporated herein by reference in their entireties.

Figure 3:
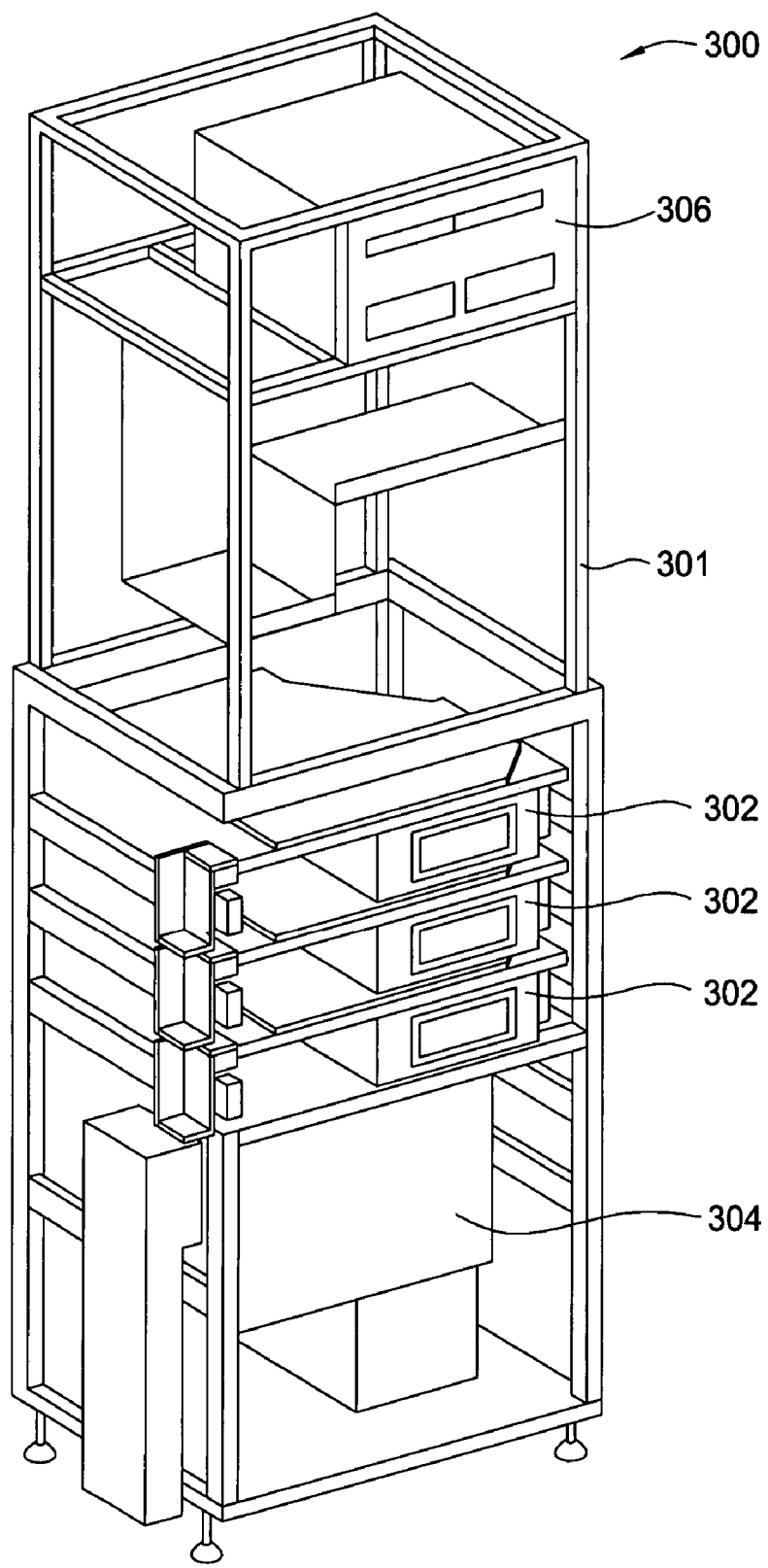
FIG. 3 illustrates a perspective view of an exemplary annealing system of the invention.

FIG. 3 illustrates a perspective view of an exemplary stacked annealing system 300 of the invention. The stacked annealing system 300 may be positioned at the annealing station 135 described in FIG. 1, or at another location on a processing platform, as desired. Annealing system 300 generally includes a frame 301 configured to support the various components of the annealing system 300. At least one annealing chamber 302 is positioned on the frame member 301 at a height that facilitates access thereto by a robot in the processing system, i.e., mainframe robot 120 or factory interface robot 132. In the illustrated embodiment, the annealing system 300 includes three (3) annealing chambers 302 stacked vertically on top of one another. However, embodiments of the invention are not intended to be limited to any particular number of annealing chambers or any particular spacing or orientation of the chambers relative to each other, as various spacings, numbers, and orientations may be implemented without departing from the scope of the invention. The annealing system 300 includes an electrical system controller 306 positioned on an upper portion of the frame member 301. The electrical system controller 306 generally operates to control the electrical power provided to the respective components of the annealing system 300, and in particular, the electrical system controller 306 operates to control the electrical power delivered to a heating element of the annealing chamber 302 so that the temperature of the annealing chamber may be controlled. Annealing system further includes fluid and gas supply assembly 304 positioned on the frame member 301, generally below the annealing chambers 302. The fluid and gas supply assembly 304 is generally configured to supply an annealing processing gas, such as nitrogen, argon, helium, hydrogen, or other inert gases that are amenable to semiconductor processing annealing, to the respective annealing chambers 302. Fluid and gas supply assembly 304 is also configured to supply and regulate fluids delivered to the annealing chamber 302, such as a cooling fluid used to cool the chamber body 302 and/or annealed substrates after the heating portion of the annealing process is completed. The cooling fluid, for example, may be a chilled or cooled water supply. Supply assembly 304 may further include a vacuum system (not shown) that is individually in communication with the respective annealing chambers 302. The vacuum system may operate to remove ambient gases from the annealing chambers 302 prior to beginning the annealing process and may be used to support a reduced pressure annealing process. Therefore, the vacuum system allows for reduced pressure annealing processes to be conducted in the respective annealing chambers 302, and further, varying reduced pressures may be simultaneously used in the respective annealing chambers 302 without interfering with the adjoining chamber 302 in the stack.

Figure 4:
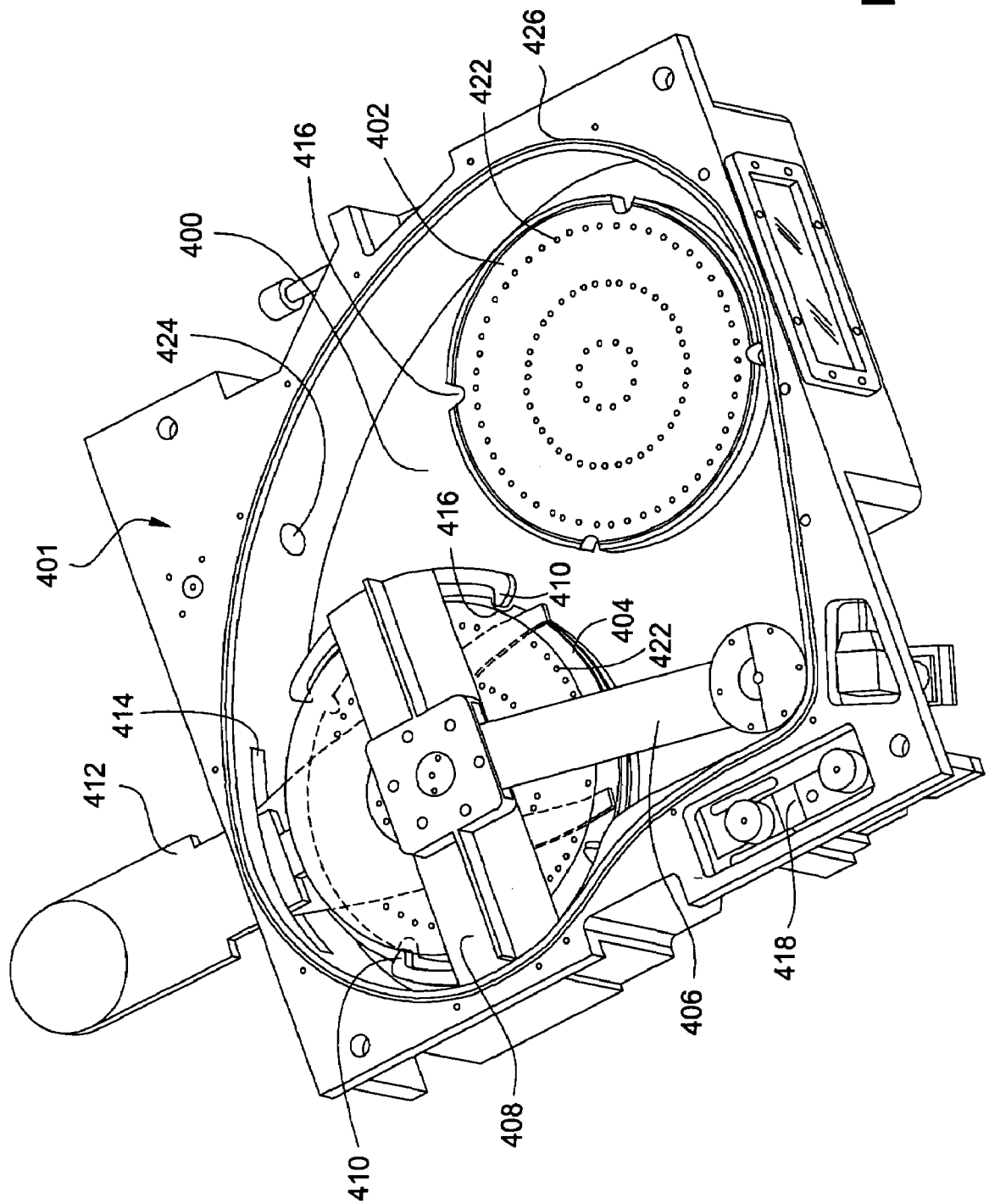
FIG. 4 illustrates a top perspective view of an exemplary annealing chamber of the invention.

FIG. 4 illustrates a top perspective view of an exemplary annealing chamber 302 of the invention with the cover or lid portion of the chamber removed so that the internal components are visible. The annealing chamber 302 generally includes a chamber body 401 that defines an enclosed processing volume 400. The enclosed processing volume 400 includes a heating plate 402 and a cooling plate 404 positioned therein proximate each other. A substrate transfer mechanism 406 is positioned adjacent the heating and cooling plates and is configured to receive a substrate from outside the processing volume 400 and transfer the substrate between the respective heating and cooling plates during an annealing process. The substrate transfer mechanism 406 generally includes pivotally mounted robot assembly having a substrate support member/blade 408 positioned at a distal end of a pivotal arm of the robot. The blade 408 includes a plurality of substrate support tabs 410 that are spaced from the blade 408 and configured to cooperatively support a substrate thereon. Each of the support tabs, 410 are generally, spaced vertically (generally downward) from a main body portion 408 of the blade, which generates a vertical space between blade 408 and tabs 410. This spacing allows for a substrate to be positioned on the tabs 410 during a substrate loading process, which will be further described herein. Further, each of the heating and cooling plates 402, 404 include a corresponding number of notches 416 formed into the outer perimeter thereof, wherein the notches 416 are spaced and configured to cooperatively receive tabs 410 therein when the blade member 408 is lowered toward to the respective heating and cooling plates 402, 404.

Figure 5:
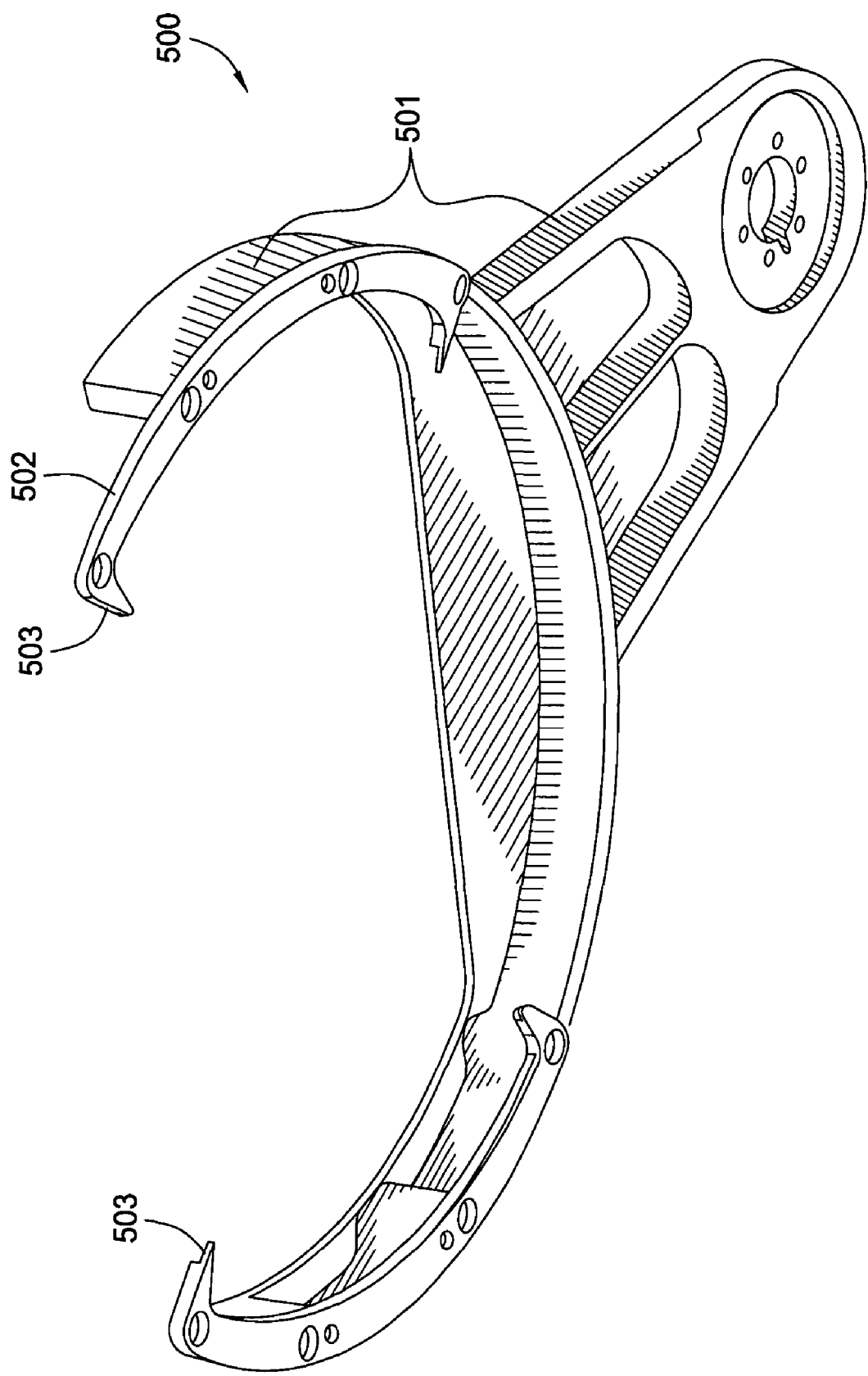
FIG. 5 illustrates a bottom perspective view of an exemplary robot blade of the invention.

In another embodiment of the invention, the transfer mechanism 406 includes a reinforced blade member 500, as illustrated in FIG. 5. The blade member 500 includes a unitary frame member 501 that is configured to maintain it's structural shape, i.e., the unitary blade member 501 is shaped and designed for minimal movement in the structure itself (wiggle, bending, bowing, etc.). The unitary frame member 501 includes a substrate supporting ring or member 502 attached to a lower portion of the frame member 501. The substrate support member 502 includes substrate support tabs 503 (similar to the tabs 410 illustrated in FIG. 4) that are positioned radially inward with respect to the frame member 501. The tabs, in similar fashion to tabs 410, are spaced and configured to support a substrate thereon, as well as be received in the notches 416 of the respective heating and cooling plates.

The body 401 of the annealing chamber, which may be manufactured from aluminum, for example, generally defines an interior processing volume 400. Outer body 401 generally includes a plurality of fluid conduits (not shown) formed therethrough, wherein the fluid conduits are configured to circulate a cooling fluid to reduce the temperature of the outer body 401. The cooling fluid may be supplied to the fluid conduits formed into the outer body 401 and circulated through the outer body 401 by cooling fluid connections 420.

The cooling plate 404 generally includes a substantially planar upper surface configured to support a substrate thereon. The upper surface includes a plurality of vacuum apertures 422, which are selectively in fluid communication with a vacuum source (not shown). The vacuum apertures 422 may generally be used to generate a reduced pressure at the upper surface of the cooling plate 404 in order to secure or vacuum chuck a substrate to the upper surface. The interior portion of the cooling plate may include a plurality of fluid conduits formed therein, wherein the fluid conduits are in fluid communication with the cooling fluid source used to cool the chamber body 401. When the fluid conduits are implemented into the cooling plate, the cooling plate may be used to rapidly cool a substrate positioned thereon. Alternatively, the cooling plate may be manufactured without the cooling passages formed therein, and in this embodiment, the cooling plate may be used to cool a substrate at a slower rate than the embodiment where the cooling plate is essentially chilled by the cooling conduits formed therein. Further, as noted above, the cooling plate 404 includes a plurality of notches 416 formed into the perimeter of the plate 404, wherein the notches 416 are spaced to receive the tabs 410 of the substrate support blade 408 when the blade is lowered into a processing position.

The heating plate 402, in similar fashion to the cooling plate 404, also includes a substantially planar upper substrate support surface. The substrate support surface includes a plurality of vacuum apertures 422 formed therein, each of the vacuum apertures 422 being selectively in fluid communication with a vacuum source (not shown). As such, the vacuum apertures 422 may be used to vacuum chuck or secure a substrate to the heating plate 402 for processing. The interior of the heating plate 402 includes a heating element (not shown), wherein the heating element is configured to heat the surface of the heating plate 402 to a temperature of between about 100° C. to about 500° C. The heating element may include, for example, an electrically driven resistive element or a hot fluid conduit formed into the heating plate 402, wherein the hot fluid is also configured to heat the surface of the heating plate 402. Alternatively, the annealing chambers of the invention may utilize an external heating device, such as lamps, inductive heaters, or resistive elements, positioned above or below the heating plate 402. Further, as noted above, the heating plate 402 includes a plurality of notches 416 formed into the perimeter of the plate 402, wherein the notches 416 are spaced to receive the tabs 410 of the substrate support blade 408 when the blade is lowered into a processing position.

Figure 6:
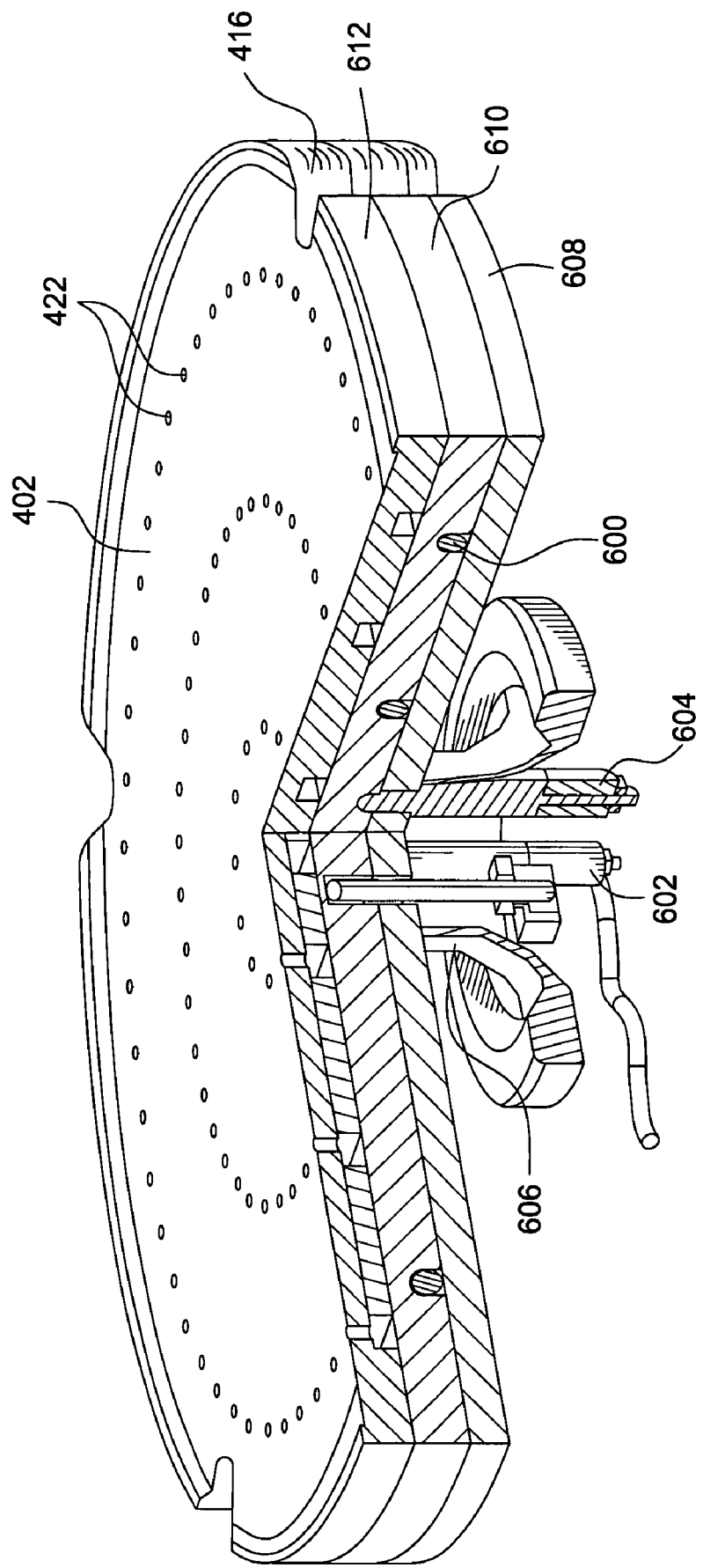
FIG. 6 illustrates a perspective view with a partial sectional view of the heating plate of the annealing chamber.
Figure 7:
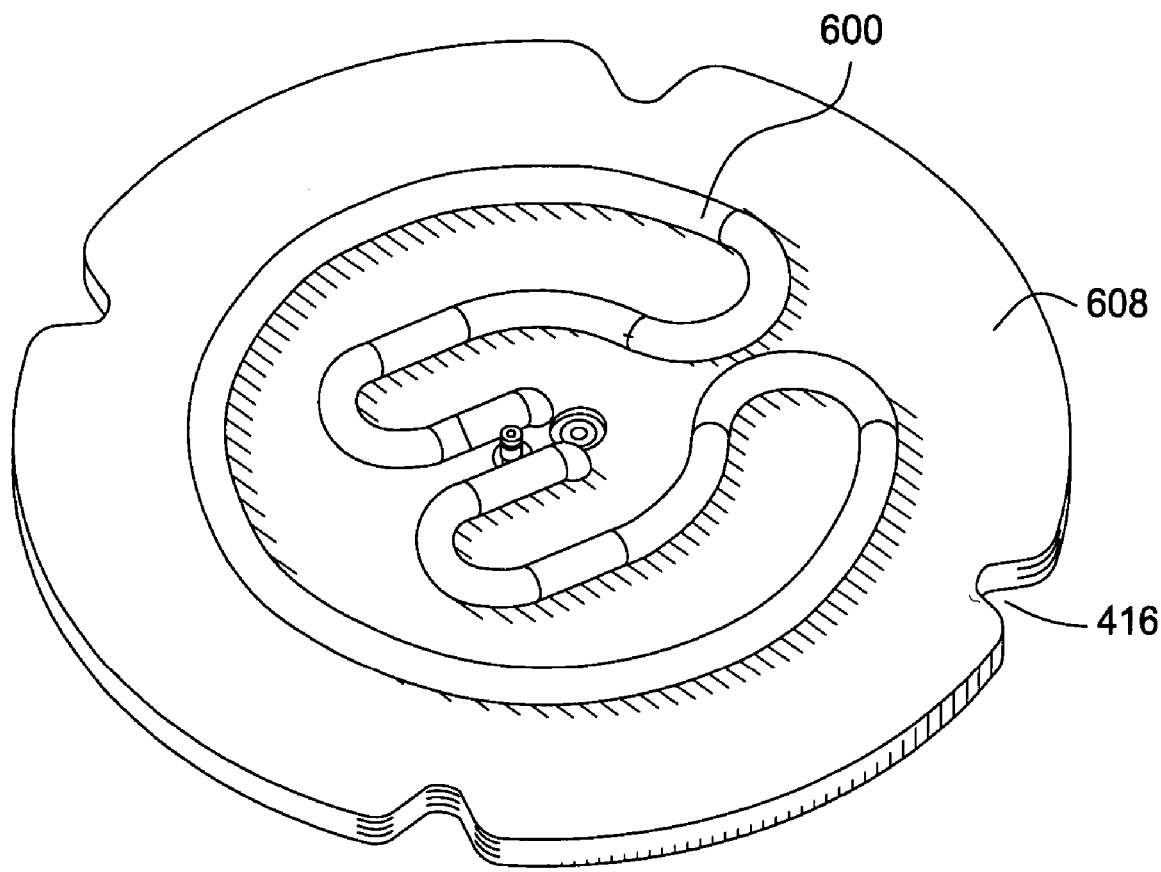
FIG. 7 illustrates a perspective view of a lower portion of the heating plate.

FIG. 6 illustrates a perspective view with a partial sectional view of the heating plate 402. The sectional view of plate 402 illustrates a heating plate base member 608 that has a resistive heating element 600 positioned thereon. The resistive heating element is encased in the interior portion 610 of the heating plate 402, as illustrated in FIG. 7. More particularly, the interior portion 610 includes a channel formed therethrough, wherein the channel is sized and spaced to receive the heating element 600. A top plate 612 is positioned above the interior portion 610. The top, interior, and base members 608 are generally manufactured from a metal having desirable thermal conductivity properties, such as aluminum, for example. Additionally, the three sections of the plate 402 may be brazed together to form a unitary heat transferring plate 402. The lower portion of the plate 402, i.e., the bottom of the base member 608, includes a stem 606 that supports the plate 402. The stem is generally of a substantially smaller diameter than the plate member 402, which minimizes thermal transfer to the chamber base or walls. More particularly, the stem member generally has a diameter of less than about 20% of the diameter of the heating plate 402. Additionally, the lower portion of the stem 606 includes a thermocouple 604 for measuring the temperature of the heating plate 402 and a power connection 602 to conduct electrical power to the heating element 600.

The annealing chamber may include a pump down aperture 424 positioned in fluid communication with the processing volume 400. The pump down aperture 424 is selectively in fluid communication with a vacuum source (not shown) and is generally configured to evacuate gases from the processing volume 400. Additionally, the annealing chamber generally includes at least one gas dispensing port 426 or gas dispensing showerhead positioned proximate the heating plate 402. The gas dispensing port is selectively in fluid communication with a processing gas source, i.e., supply source 304, and is therefore configured to dispense a processing gas into the processing volume 400. The gas dispensing port 426 may also be a gas showerhead assembly positioned in the interior of the annealing chamber, for example. The vacuum pump down aperture 424 and the gas dispensing nozzle may be utilized cooperatively or separately to minimize ambient gas content in the annealing chamber, i.e., both of the components or one or the other of the components may be used.

The annealing chamber 302 includes a substrate transfer mechanism actuator assembly 418 that is in communication with the robot 406. The actuator 418 is generally configured to control both pivotal movement of the blade 408, as well as the height or Z position of the blade relative to the heating or cooling member. An access door 414, which may be a slit valve-type door, for example, is generally positioned in an outer wall of the body portion 401. The access door 414 is generally configured to open and allow access into the processing volume 400 of the annealing chamber 302. As such, access door 412 may be opened and a robot 412 (which may be robot 132 from the exemplary F1 or the exemplary mainframe substrates transfer robot 120 illustrated in FIG. 1, for example) may enter into the processing volume 400 to drop off or retrieve a substrate from one of the annealing chambers 302.

More particularly, the process of inserting a substrate into the annealing chamber includes, for example, positioning the blade 408 over the cooling plate 404 in a loading position, i.e., a position where the tabs 410 are vertically positioned at a location above the upper surface of the cooling plate 404. As briefly noted above, the blade 408 and tabs 410 are positioned relative to each other such that there is a vertical space between the upper surface of the tabs 410 and the lower surface of the blade 408. This vertical space is configured to allow a robot blade 412 having a substrate supported thereon to be inserted into the vertical space and then lowered such that the substrate is transferred from the blade 412 to the substrate support tabs 410. Once the substrate is supported by the tabs 410, the external robot blade 412 may be retracted from the processing volume 400 and the access door 414 may be closed to isolate the processing volume 400 from the ambient atmosphere. In this embodiment, once the door 414 is closed, a vacuum source in communication with the pump down aperture 424 may be activated and caused to pump a portion of the gases from the processing volume 400. During the pumping process, or shortly thereafter, the process gas nozzle(s) 426 may be opened to allow the processing gas to flood the processing volume 400. The process gas is generally an inert gas that is known not to react under the annealing processing conditions. This configuration, i.e., the pump down and inert gas flooding process, is generally configured to remove as much of the oxygen from the annealing chamber/processing volume as possible, as the oxygen is known to cause oxidation to the substrate surface during the annealing process. The vacuum source may be terminated and the gas flow stopped when the chamber reaches a predetermined pressure and gas concentration, or alternatively, the vacuum source may remain activated during the annealing process and the gas delivery nozzle may continue to flow the processing gas into the processing volume.

In another embodiment of the invention, a vacuum source is not used to purge the processing volume of unwanted gases, i.e., oxygen containing gases. Rather, a positive processing gas pressure is used to minimize the oxygen content in the processing volume 400. More particularly, the gas supply 426 to the processing volume 400 may be activated anytime when the door 414 is opened, so that a positive pressure is built up in the processing volume. This positive pressure causes an outward flow of gas from the annealing chamber when the door 414 is opened, which minimizes the amount of oxygen entering the processing volume 400. This process may be combined with a vacuum pump down process to increase the likelihood of removing the oxygen from the processing volume.

Once the substrate is positioned on the blade member 408, the substrate may be lowered onto the cooling plate 404 or heating plate 402. The process of lowering the substrate onto either the heating plate 402 or the cooling plate 404 generally includes positioning the blade member 408 above the respective plate such that the substrate support tabs 410 are positioned above the notches 416 formed into the perimeter of the plates. The blade member 408 may then be lowered such that the tabs 410 are received in the notches 416. As the substrate support tabs 410 are received in the notches 416, the substrate supported on the tabs 410 is transferred to the upper surface of the respective heating or cooling plate. The transfer process generally includes activating the vacuum apertures 422 formed into the plate upper surfaces, so that a substrate is secured to the surface without movement when placed thereon. The heating plate is generally heated to a predetermined annealing temperature, such as between about 150° C. and about 400° C., before the substrate is positioned thereon. Alternative temperature ranges for the heating plate include between about 150° C. and about 250° C., between about 150° C. and about 325° C., and between about 200° C. and about 350° C., for example. The substrate is positioned on the heating plate 402 for a predetermined period of time and annealed, generally between about 15 seconds and about 120 seconds, for example, depending on the desired annealing temperature and the time required to generate the desired structure in the layer deposited on the substrate.

Once the heating portion of the annealing process is completed, the substrate is transferred to the cooling plate 404. The transfer process includes terminating the vacuum chucking operation and lifting the blade member 408 upward until the tab members 410 engage and support the substrate thereon, i.e., wherein the tabs 410 lift the substrate off of the heating plate surface. The blade member 408 may then be pivoted from the heating plate 402 to the cooling plate 404. Once above the cooling plate 404, blade 408 may be lowered to position the substrate onto the cooling plate 404. In similar fashion to the lowering process described below, the substrate may be lowered onto the cooling plate while the vacuum apertures 422 are simultaneously operating to secure the substrate to the upper surface of the cooling plate 404.

The cooling plate is generally maintained at a reduced temperature, such as between about 15° C. and about 40° C., and therefore, the cooling plate operates to receive or sink heat from the substrate positioned thereon or proximate thereto. This process may be used to cool the substrate from the annealing temperature down to less than about 70° C., or more particularly, between about 50° C. and about 100° C. in less than 1 minute, or more particularly, in less than about 15 seconds. More particularly, the cooling plate may be used to rapidly cool the substrate to between about 50° C. and about 70° C. in less than about 12 seconds. Once the substrate is cooled to the desired temperature, the blade 408 may be used to raise the substrate off of the cooling plate 404. With the substrate raised, the door 414 may be opened and the outside robot blade 412 may be brought into the processing volume and used to remove the substrate from the blade member 408. Once the substrate is removed, another substrate may be positioned in the annealing chamber and the annealing process described above repeated.

In another embodiment of the invention, the substrate temperature may be gradually ramped up to the annealing temperature or down to the cooled substrate temperature. More particularly, robot arm 406 may be lowered to a position just above the heating plate 402, i.e., spaced apart from the plate 402 by an air gap or space. The air gap between the substrate and the heating plate 402 functions as a thermal buffer to slow the temperature increase of the substrate. For example, heating plate 402 may be heated to about 210° C. and then the substrate may be positioned about 1 mm to about 5 mm away from the heating plate 402. The heat from the plate 402 slowly transfers to the substrate (slowly relative to the rate of heat transfer if the substrate were positioned directly onto the heating plate 402) across the air gap or space between the substrate and the heating plate 402. The ramp time to the annealing temperature may further be adjusted by adjusting the spacing of the substrate, i.e., if a faster ramp time is desired, then the substrate may be positioned closer to the heating plate. Similarly, positioning the substrate farther away from the heating plate, i.e., increasing the air gap, may be used to decrease the ramp time. The time to ramp may be between about 10 seconds and about 45 seconds, for example. Once the substrate temperature ramps up to the annealing temperature, then the substrate may be lowered onto the heating plate 402 for the remainder of the annealing process. Similarly, the robot may be positioned spaced from the cooling plate in order to ramp the cooling temperature down, if desired.

Figure 8:
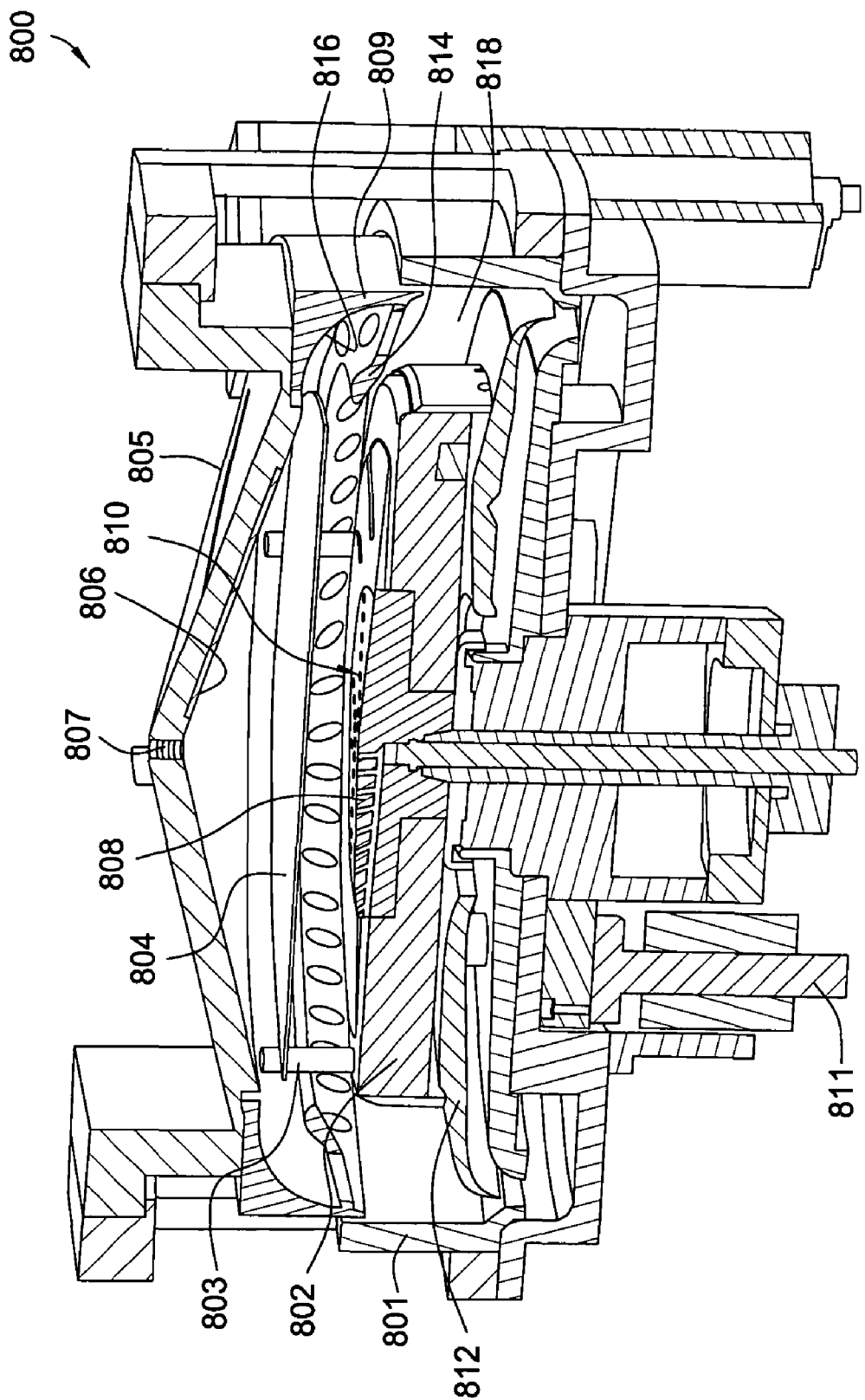
FIG. 8 illustrates a partial perspective and sectional view of an exemplary substrate spin rinse dry cell of the invention.

FIG. 8 illustrates a partial perspective and sectional view of an exemplary substrate spin rinse, dry cell 800 of the invention. The spin rinse dry cell 800 (SRD) includes a fluid bowl/body 801 supported on a frame that may be attached to a plating system, such as the mainframe 113 illustrated in FIG. 1. The SRD 800 further includes a rotatable hub 802 centrally positioned in the fluid bowl 801. Hub 802 includes a generally planar upper surface that has a plurality of backside fluid dispensing nozzles 808 formed thereon and at least one gas dispensing nozzle 810 formed thereon (also shown in FIG. 5 as nozzles 503). A plurality of upstanding substrate support fingers 803 are positioned radially around the perimeter of hub 802. In the illustrated embodiment of the invention, four fingers 803 are shown (see FIG. 12), however, the invention is not limited to any particular number of fingers. Fingers 803 are configured to rotatably support a substrate 804 at the bevel edge thereof for processing in SRD 800. The upper portion of SRD 800 includes lid member 805, which is generally dome shaped, that operates to enclose a processing space below the dome 805 and above the hub 802. Further, dome member 805 includes at least one gas nozzle 807 positioned therein that is configured to dispense a processing gas into the processing space, and a fluid manifold 806 configured to dispense a processing fluid therefrom onto the substrate 804 secured to the fingers 803. At least one side of the SRD 800 includes a door or opening (not shown) that may be selectively opened and closed to provide access to the processing area of SRD 800. The lower portion of SRD 800 includes an annular shield member 812 positioned around the perimeter of the basin. The shield 812 is positioned below and radially outward of the substrate support member 802, and therefore, is configured to shed fluid outwardly to the perimeter of the basin. Additionally, shield 812 is configured to be vertically actuatable, as will be further discussed herein.

Figure 9:
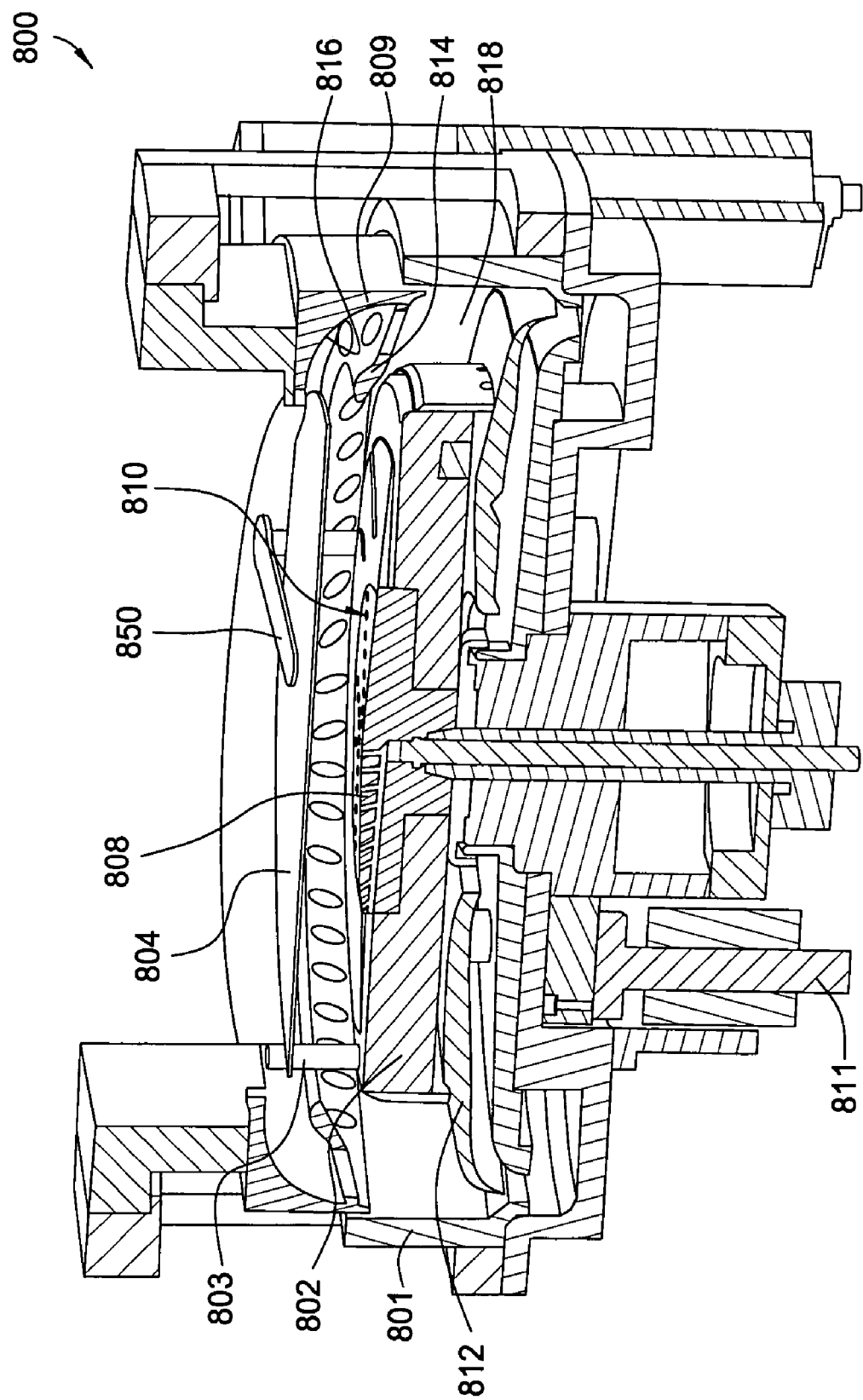
FIG. 9 illustrates a partial perspective and sectional view of another exemplary substrate spin rinse dry cell of the invention.

In another embodiment of the invention, the processing space is not confined at an upper portion by a lid or upper member. In this embodiment, the processing cell 800 would include a lower drain basin and upstanding side walls, however, the upper portion of the processing space would generally be open. Further, in this embodiment the fluid dispensing nozzle or manifold would generally be positioned or mounted on the upstanding side wall portion of the cell. For example, a fluid dispensing arm may be pivotally mounted to the side wall such that a distal end of the arm having a fluid dispensing nozzle positioned thereon may be pivoted to a position over a substrate being processed in the cell. The pivotal motion of the arm is, generally in a plane that is parallel and above the substrate being processed, and therefore, the pivotal movement of the arm allows for the nozzle positioned on the end of the arm to be positioned over specific radial positions on the substrate, i.e., over the center of the substrate or over a point that is a specific radius from the center of the substrate, for example. Aside from the repositioning of the fluid dispensing nozzle, this embodiment of the invention is structurally similar to the previous embodiment and functions in a similar manner. For example, FIG. 9 illustrates a partial perspective and sectional view of another exemplary substrate spin rinse dry cell of the invention. In this embodiment of the invention, the SRD cell is substantially similar to the cell illustrated in FIG. 8, except that the SRD cell illustrated in Figure.9 does not include a lid 805. As such, the SRD cell illustrated in FIG. 9 is not enclosed during the rinsing process. Another difference between the SRD cell illustrated in FIG. 8 and the embodiment illustrated in FIG. 9 is that the SRD illustrated in FIG. 9 includes a pivotally mounted fluid dispensing nozzle 850, which operates to replace the fluid dispensing manifold 806 formed into the lid 805. The nozzle 850 is configured to pivot outward over the substrate surface and dispense a processing fluid, generally deionized water, onto the substrate surface proximate the center of the substrate. Additionally, cell wall 809, along with the attached shield 814 and curved surface 816 may be raised and lowered to facilitate loading and unloading of substrates. For example, when a substrate is loaded, wall 809 may be lowered to allow for access to the substrate support fingers 803. When processing begins, then the wall 809 may be raised to position the catch cup 814 and curved wall 816 next to the substrate so the that the fluid spun off of the substrate may be captured and airflow over the perimeter of the substrate controlled, as will be further discussed herein.

Figure 10B:
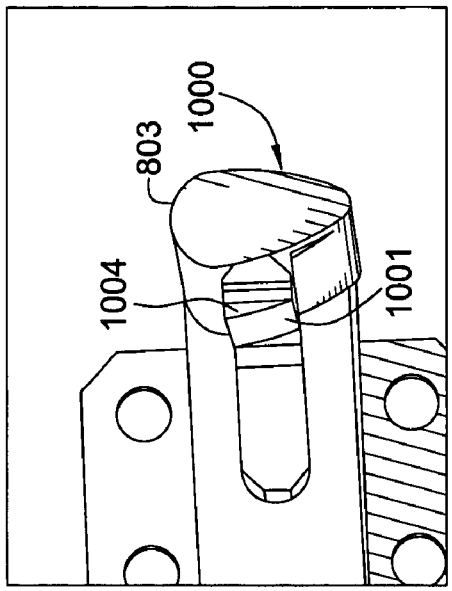
FIG. 10b illustrates a top perspective view of an exemplary substrate engaging finger for the spin rinse dry cell of the invention, wherein the finger is in the open position.
Figure 10D:
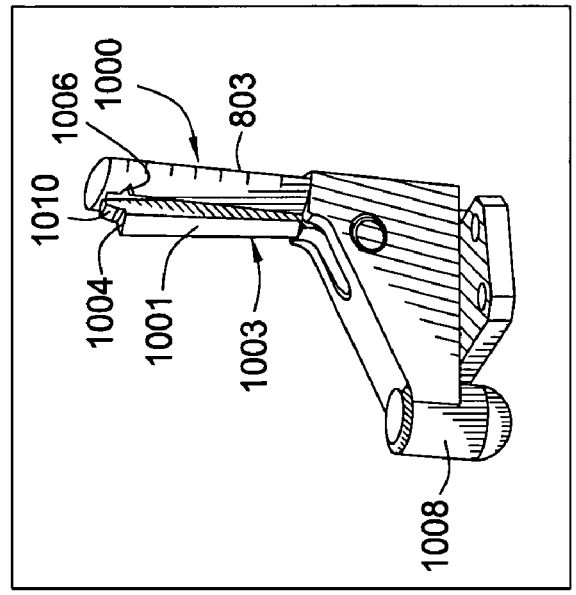
FIG. 10d illustrates a side perspective view of an exemplary substrate engaging finger for the spin rinse dry cell of the invention, wherein the finger is in the open position.
Figure 10A:
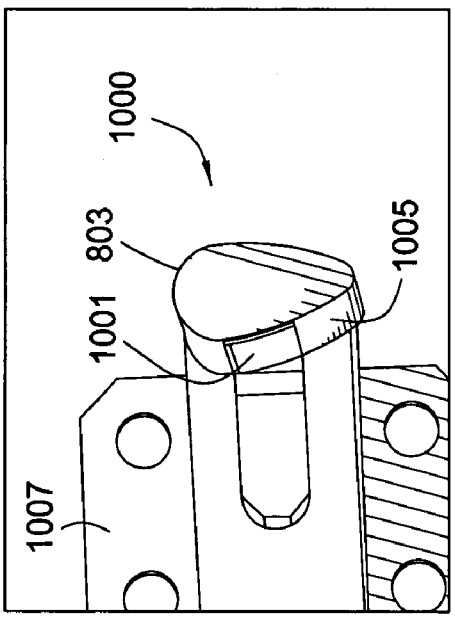
FIG. 10a illustrates a top perspective view of an exemplary substrate engaging finger for the spin rinse dry cell of the invention, wherein the finger is in the closed position.

FIGS. 10A–10D illustrate more detailed views of the finger members 803 of the exemplary SRD 800. More particularly, FIG. 10A illustrates a top perspective view of an exemplary substrate engaging finger 803 in a closed position. The substrate engaging finger assembly generally includes a base 1007 having an upstanding pivotally mounted airfoil/clamp member 1000 extending therefrom. The finger assembly further includes a lower actuator portion 1008 (shown in FIG. 10C) positioned inward of the upstanding airfoil portion 1000 and pivotally mounted about a pivot point 1002. The airfoil 1000 is generally a wing shaped member when viewed from the top that is configured to be rotated within the processing space, while generating a minimal amount of airflow disturbance. The leading edge of the airfoils 1000, i.e., the side of the airfoil that the air first contacts when the fingers 803 are rotated, is generally rounded to provide a minimal drag and turbulence path for air contacting the finger 803 to pass by the finger 803 without generating turbulence or unwanted airflows in the processing space. The trailing edge of the airfoil 1000, i.e., the edge of the airfoil opposite the rounded or leading edge, is generally smaller in cross section than the rounded edge, as shown in FIG. 10A. The leading edge and the trailing edge are connected by a generally smooth and sometimes arcing or curving surface 1005. As such, the airflow over the airfoil 800 when it is rotated is smooth and generates minimal turbulent air effects in the processing space. The smooth surface 1005 includes a horizontally oriented notch or channel 1006, wherein the notch is sized and configured to receive and engage the bevel edge of the substrate 804 during processing. The channel 1006 generally extends horizontally across surface 1005, i.e., in a direction that is generally orthogonal to the vertical axis of airfoil 1000.

Figure 10C:
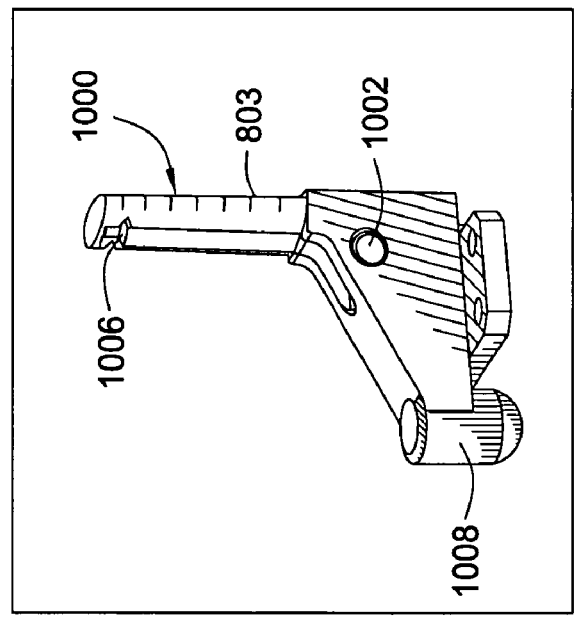
FIG. 10c illustrates a side perspective view of an exemplary substrate engaging finger for the spin rinse dry cell of the invention, wherein the finger is in the closed position.

Fingers 803 further include an inner fixed post 1001 that is rigidly attached to the base member 1007. Posts 1001 extend upward through an exposed channel formed into the inner surface 1005 of the pivotally mounted airfoil members 1000. Thus, posts 1001 remain stationary, while airfoils 1000 are pivotally mounted via pivot member 1002, as illustrated in FIG. 10C. Further, the upper terminating end of post 1001 includes a substrate supporting surface 1004 formed thereon. The support surface 1004 includes a generally horizontal portion configured to support a substrate thereon, a vertical or angled portion positioned radially outward of the horizontal portion to maintain the substrate at a position radially inward of the post 1001 and to guide the substrate onto the support surface 1004, and a horizontal notch or slot 1006 that engages the bevel of a substrate 804 supported by the post 1001 and the airfoil 1000.

FIG. 10B illustrates a top perspective view of the finger 803 in an open or loading position. More particularly, when the finger member is in the open position the airfoil 1000 is pivoted outward such that the upper surface of the fixed post 1001 is exposed. The airfoil 1000 may be pivoted to this position via movement of the actuator portion 1008 upward. This movement causes the upper terminating end of the airfoil 1000 to pivot outward as a result of the placement of the pivot point 1002. The result of the pivotal movement of the airfoil 1000 is that the upper substrate supporting surface of the post member 1001 is positioned such that a substrate may be positioned thereon.

FIG. 10D illustrates the finger assembly in the open position from a side view, which illustrates how the upper surface 1004 of post 1001 extends from the airfoil 1000 such that the substrate support surface 1004 is positioned to support the edge of a substrate. FIG. 10D illustrates a side perspective view and FIG. 10A illustrates a plan view of the finger assembly in the closed or processing position. The closed position generally corresponds to a position of the post 1001 relative to the airfoil 1000 where the substrate 804 is secured to the hub 802 (via fingers 803) for processing. Similarly, the open position generally corresponds to the position of post 1001 relative to the airfoil 1000 where the upper substrate support portions 1004 of post 1001 are positioned to receive a substrate thereon. Thus, the open position is essentially a substrate loading position and the closed position is essentially a substrate processing position. In the closed position (FIGS. 10A and 10C) the substrate is supported at the bevel edge by the horizontal slot 1006 of the airfoil 1000, which is pivoted inward about pivot point 1002 to engage the substrate for processing.

The process of actuating the finger members generally includes mechanically engaging and vertically moving the lower actuator portion 1008. For example, vertical or upward movement of the lower actuator portion 1008 causes the airfoil member 803 to pivot outward to expose the substrate support post 1001. The lower actuator portion is vertically actuated via vertical actuation of the shield member 812, which is positioned to mechanically engage the lower actuator portion. Thus, when the substrate is being loaded onto the fingers, shield 812 is raised to open the fingers to a substrate receiving/loading position. Once the substrate is loaded, then shield 812 may be lowered and the substrate engaged by slots 1006 for the rinsing process. The unloading process may be conducted in substantially the same manner.

Figure 11:
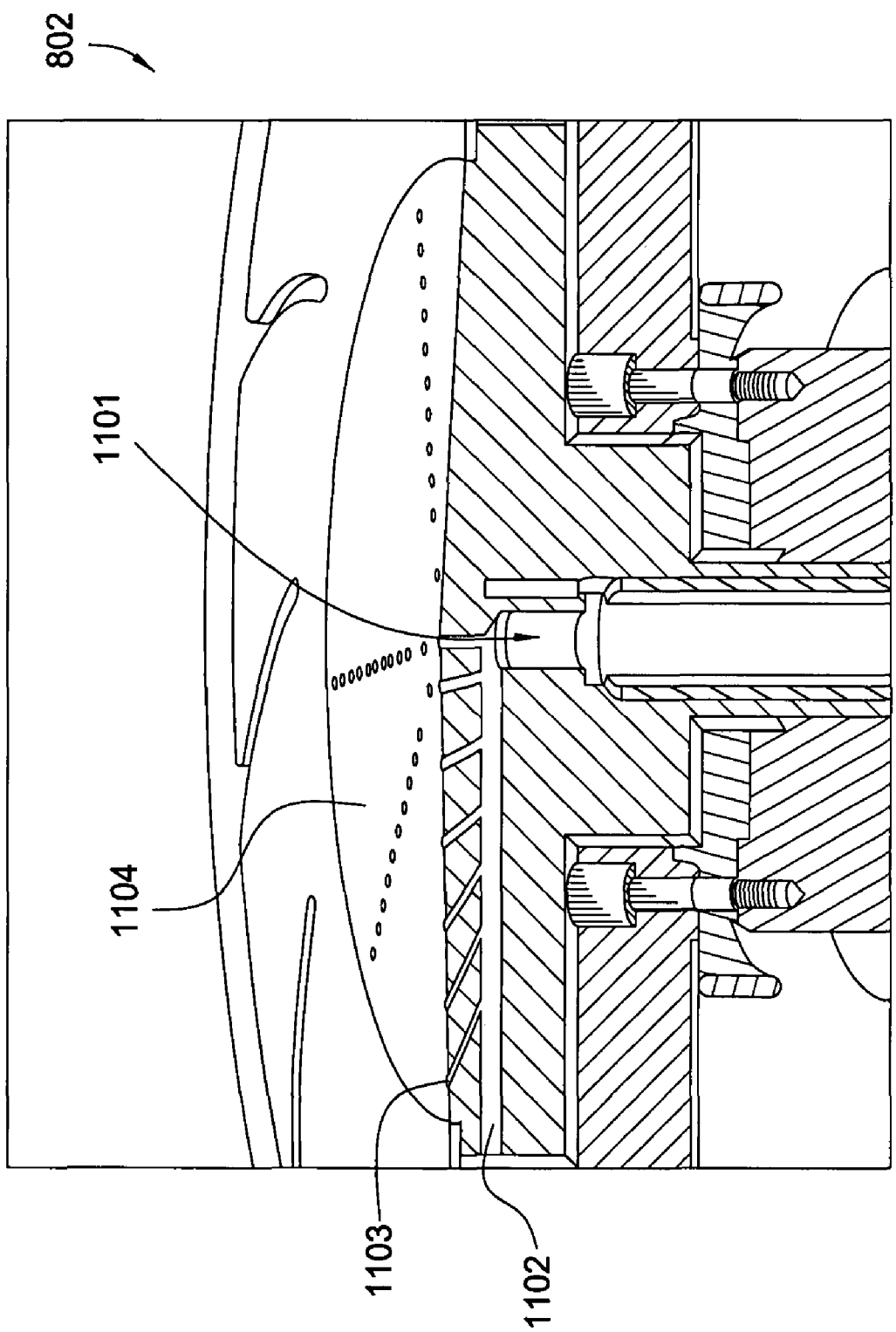
FIG. 11 illustrates a sectional view of an exemplary hub assembly of the invention.

FIG. 11 illustrates a partial sectional view of the hub 802 illustrated in FIG. 2. Hub 802 is generally rotatably mounted via a central support member positioned on the underside of the hub 802. The interior portion of the central support member includes a conduit 1101 configured to communicate a rinsing fluid to a plurality of fluid dispensing apertures 1103 formed onto the upper surface 1104 of the hub 802 via a fluid dispensing manifold 1102. Additionally, the central support member generally includes a second conduit (not shown) formed therein that is configured to communicate a drying gas to a plurality of gas dispensing purge ports 1104. Further, embodiments of the invention contemplate that the fluid and gas conduits may be combined into a single conduit, wherein a valve assembly is used to switch between fluid and gas supplied to the single conduit.

Figure 12:
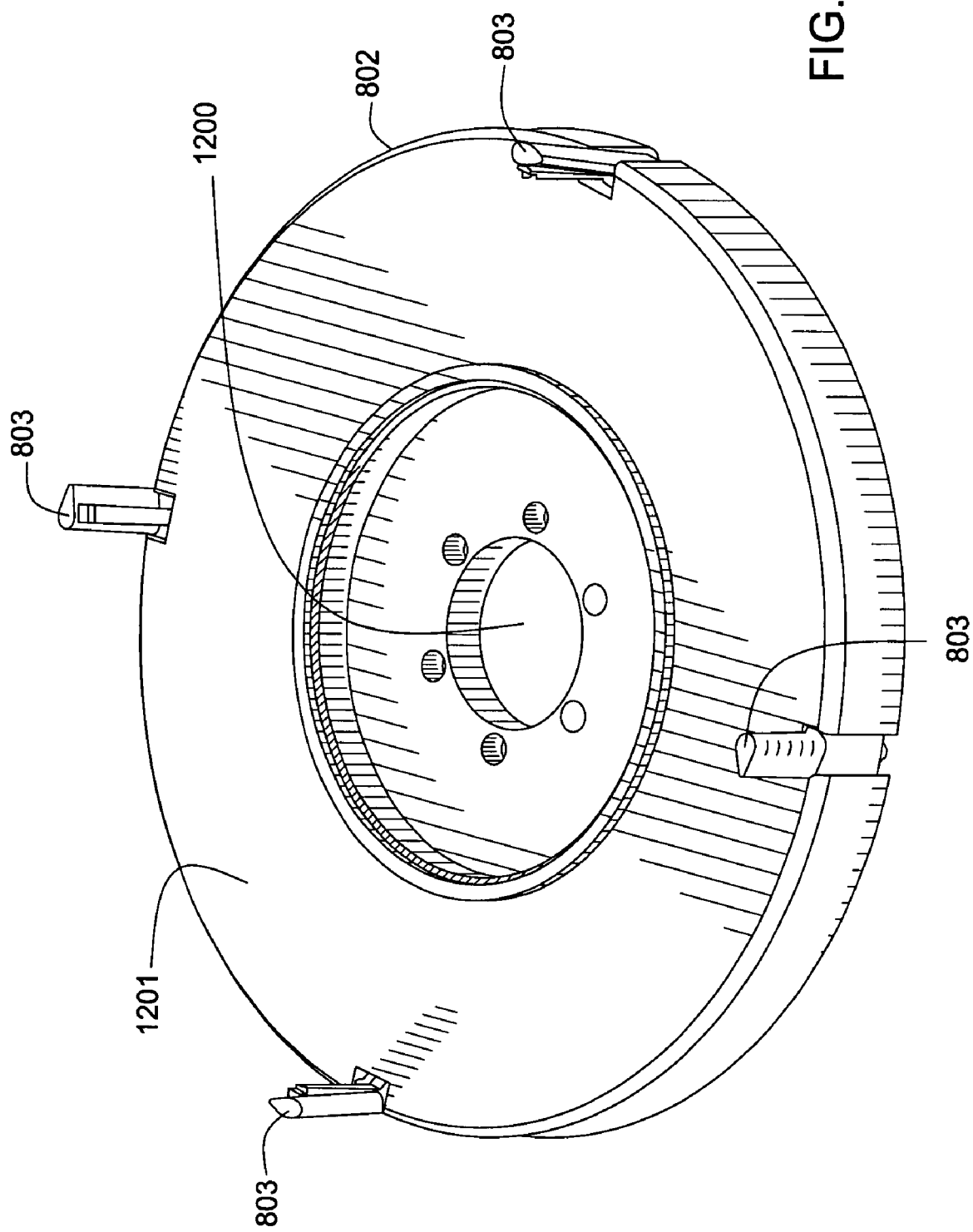
FIG. 12 illustrates a top perspective view of a lower portion of the hub assembly.

FIG. 12 illustrates a top perspective view of a lower portion of the hub assembly 802. More particularly, although hub assembly 802 may be a unitary element, embodiments of the invention also contemplate that the hub assembly 802 may include separate elements that rotate independently. For example, FIG. 12 illustrates an exemplary lower portion of a hub assembly 802. The exemplary lower portion is generally a disk shaped member having a central aperture 1200 formed therein. The outer portion of the lower disk shaped member includes an upper planar surface 1201 and the plurality of substrate engaging fingers 803 positioned radially around the perimeter. In this configuration, the gas, and fluid delivery apertures formed into surface 1104, as illustrated in FIG. 11, may be positioned in the central aperture 1200 on an element that is separate from the disk shaped member illustrated in FIG. 12. In this configuration the central portion of the hub 802 (the portion represented by surface 1104 that may be positioned in aperture 1200) may be fixed, while the outer portion of the hub 802 (the portion represented by the disk shaped member illustrated in FIG. 12) may rotate with respect to the fixed inner portion. This allows the fluid and gas dispensing nozzles dispense their respective fluids over the entire area of the substrate, as the respective members are rotating relative to each other.

In operation, the spin rinse dry cell 800 generally operates to receive a substrate therein, rinse the substrate with a rinsing fluid, and dry the substrate via spinning the substrate to centrifugally urge fluid off of the substrate surface, while also dispensing a drying gas into the cell containing substrate to further facilitate the drying process. A substrate may be positioned in the cell 800 via the door, which may be positioned on one side of cell 800, or alternatively, cell 800 may include more than one door positioned on, for example, opposing sides of the cell, such that substrate may be brought into cell 800 on one side and taken out of cell 800 on another side. Substrates are generally positioned in cell 800 by a substrate transfer robot that generally supports the substrates from the underside, and therefore, when the substrate is transferred into the cell 800, it is generally positioned above the fingers 803 in a face up configuration. The fingers 803 are actuated to the open position, i.e., the position where the upper surface 1004 of the fixed post 1001 is exposed. With the upper surface 1004 exposed, the robot may lower the substrate onto the plurality of fingers 803 such that the substrate is supported by the upper surface 1004 of each of the fingers 803. The upper portion of the fixed posts may include an inwardly inclining surface 1010 that is configured to guide the substrate inwardly or center the substrate on the respective posts 1001. Once the substrate is positioned on the horizontal surfaces 1004, the robot blade may retract from cell 800 and the door may be closed to isolate the interior processing volume of cell 800 from the ambient atmosphere.

Once a substrate is positioned on the upper surface 1004 of the substrate support fingers 803, the substrate support fingers 803 may be actuated to engage the bevel edge of the substrate. More particularly, the lower portion 1008 of fingers 803 may be actuated downward, thus causing the upper terminating end to pivot inwardly towards the substrate supported on surface 1004. As the upper terminating end of airfoil 1000 pivots inwardly, the horizontal notch or groove 1006 (illustrated in FIGS. 10C and 10D) engages the bevel edge of the substrate, thus securing the substrate between the respective fingers 803. The engagement of the bevel edge of the substrate by the airfoil grooves 1006 removes the substrate from being supported by the upper surfaces 1004 of the fixed post members 1001, and supports the substrate for processing exclusively via engagement of the bevel edge by the horizontal notches or slots 1006, which are configured to minimally contact the substrate surfaces.

Once the substrate is secured to the substrate support fingers 803, processing may begin. Generally, processing in cell 800 will include rinsing and drying the substrate positioned therein. The rinsing and drying processes generally includes rotating the substrate, and therefore, fingers 803 are generally secured to a rotatable-type hub 802, as illustrated in FIG. 8. Once the substrate is rotating, fluid dispensing nozzles may dispense a rinsing fluid onto the front, back, or both sides of the rotating substrate. Fluid dispensed onto the front side of the substrate may be dispensed by manifold 806 positioned in the lid member 805, while fluid dispensed on the back side of the substrate may be dispensed by the fluid apertures 1103 formed into the hub 802. Although various rinsing solutions suitable for semiconductor processing are contemplated within the scope of the invention, DI is an exemplary rinsing solution that may be dispensed onto the substrate in order to rinse the surface thereof. Further, and since the substrate is rotating during the process of dispensing the rinsing fluid thereon, the fluid is generally urged radially outward toward the perimeter of the substrate. In this manner that fluid flows off of the bevel edge of the substrate and is collected in the bottom of cell 800. Higher rotation speeds of the hub 802 will cause the fluid to flow outward and off of the substrate surface in a nearly horizontal manner, while lower rotation speeds may be used to allow the rinsing fluid to travel outward across the surfaces of the substrate and slightly wrap around the bevel of the substrate before being spun off by centrifugal force.

Once the substrate is rinsed for a predetermined period of time, the rinsing process may be discontinued. This generally corresponds to discontinuing the rinsing fluid flow to the substrate, however, generally, the substrate rotation is maintained after the rinsing fluid dispensing process is terminated. This continual rotation operates to urge any remaining droplets of the rinsing fluid that may be adhering or clinging to the substrate surface radially outward and off of the substrate surface. Further, a drying gas may be dispensed into the processing area and directed to the substrate surface in order to further facilitate the removal of any remaining fluid from the substrate surface. For example, nitrogen may be dispensed into the processing volume via the upper purge nozzle 807 and the lower purge apertures 1104 while the substrate is being spun dry.

Once the drying process is complete, the substrate may be removed from the cell 800. This process generally includes reversing the substrate entry process, and more particularly, generally includes opening one of the doors to allow access to the substrate by a robot. Once the door is opened, a robot blade may enter into the processing volume below the substrate and be brought into a position proximate the substrate. The substrate support fingers 803 may then be actuated to the open position, i.e., actuator 1008 may be urged upward such that the upper terminating end of airfoil 1000 is pivoted outward to disengage the substrate from the horizontal groove or slot 1006. The substrate may then be positioned on the upper surface 1004 of the inner fixed posts 1001. The robot blade may then be actuated upward to lift the substrate off of surfaces 1004 and remove the substrate from the processing volume via the door.

An exemplary spin rinse dry process may generally include a multi-step process. The first step (prerinse top) of the process includes rotating the substrate between about 900 rpm and about 1700 rpm, generally about 1300 rpm, for about 2 to about 6 seconds, while between about 1000 ml and about 1500 ml of a rinsing solution, are dispensed onto the production surface or topside of the substrate. The second step (prerinse top and back) includes rotating the substrate between about 100 rpm and about 140 rpm while dispensing between about 1000 ml and about 1500 ml of rinsing solution onto the production surface and between about 600 ml and about 1000 ml of rinsing solution onto the backside of the substrate in about 6 seconds. The third step (backside clean) includes rotating at between about 40 rpm and about 90 rpm and dispending between about 200 ml and about 500 ml of chemistry, generally H2O2 and H2SO4, onto the backside of the substrate while dispensing between about 1000 ml and about 1500 ml of rinsing solution onto the production surface for about 15 seconds, which generally operates to clean the backside of the substrate. The fourth step (post rinse) includes dispensing between about 1000 ml and about 1500 ml of rinsing solution onto the production surface, while dispensing between about 600 ml and about 1000 ml of rinsing solution onto the backside of the substrate while rotating at between about 40 rpm and about 90 rpm for between about 10 seconds and about 16 seconds. The fifth step (bulk fluid spin off) includes terminating fluid flow to both sides and rotating the substrate between about 400 rpm and about 600 rpm for between about 3 seconds and about 6 seconds with a backside gas purge (nitrogen) flowing at a rate of between about 2 and about 4 cfm. The sixth step (bulk fluid spin off) includes rotating the substrate at between about 600 rpm and about 900 rpm while gas purging the backside of the substrate (nitrogen) at a flow rate of between about 2 and about 4 cfm for about 4 seconds. The seventh step (dry) includes rotating the substrate between about 2000 rpm and about 3000 rpm for between about 10 seconds and about 20 seconds with no gas and no fluid flow.

Additionally, the SRD cell of the invention is configured to generate an airflow pattern that prevents backflow or backsplash of the rinsing fluid onto the substrate, as this is known to hinder efficient drying of substrates. The SRD cell is configured to minimize backflow of air, i.e., flow of air toward the center of the substrate, via a catch cup shield 814 and a contoured outer surface 816 of the cell, as illustrated in FIG. 8. Specifically, the catch cup shield extends radially inward from the cell wall 809 and is positioned such that a distal terminating annulus of the shield 814 terminates at a point radially outward of the substrate and just below the lower surface of the substrate. The contoured portion of the wall 816 is shaped such that the upper portion of the contour terminates above the substrate and the lower terminating portion of the contour terminates below the lower surface of the substrate, generally into a backside or end opposite the annulus end of the catch cup 814. This configuration allows for the fluid that is spun off of the substrate to be received by the catch cup 814 and allowed to flow downward through the catch cup 814 via a plurality of holes formed therein. Additionally, the radially outwardly projecting, (spiraling) airflow generated by the rotation of the substrate is also channeled above the catch cup and directed downwardly by the contoured surface 816. The airflow travels through the holes and may be evacuated from the chamber from below via a reduced pressure region 818. Therefore, the configuration of the SRD cell of the invention generates a radially outward airflow that does not reverse direction toward the center of the substrate, which prevents fluid mist from returning to the substrate surface and prolonging the drying process.

Figure 13:
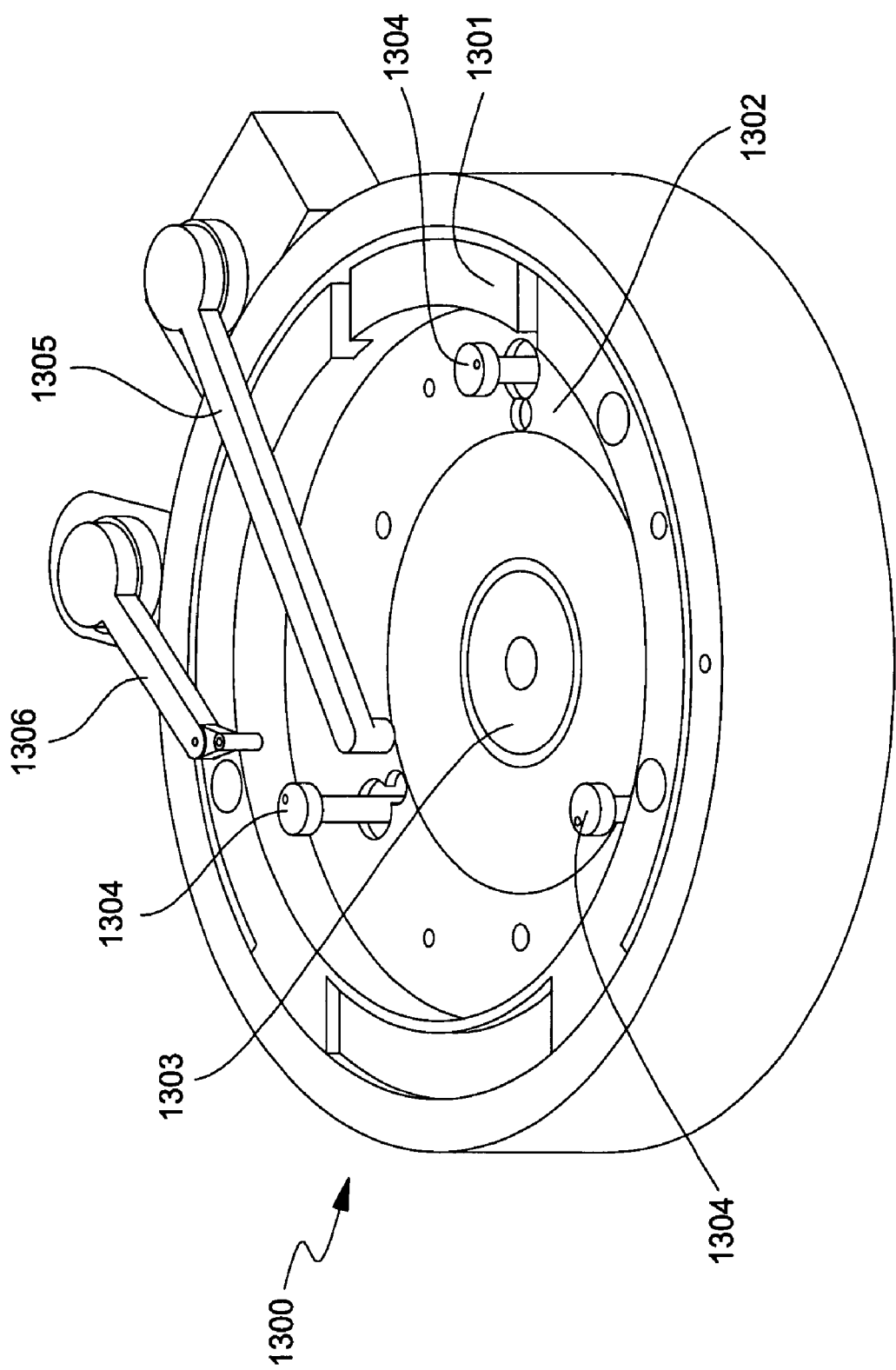
FIG. 13 illustrates a top perspective view of an exemplary bevel clean cell of the invention.

FIG. 13 illustrates a top perspective view of an exemplary bevel clean cell or chamber 1300 of the invention. As noted above, bevel clean cell 1300 may be positioned at any one of the processing locations 102, 104, 106, 108, 110, 112, 114, and 116, indicated on system 100. However, in the present exemplary embodiment of the invention, bevel clean cells 1300 are generally positioned at processing locations 106 and 108. FIG. 13 is a top perspective view of the exemplary bevel clean cell 1300, and FIG. 13 generally illustrates the upper components of the exemplary bevel clean cell 1300. These components generally include a cell bowl or chamber having an upstanding wall portion 1301 and drain basin 1302 in communication with the lower portion of wall 1301. The cell bowl is generally manufactured from a plastic material, a nylon-type material, or metal material coated with a non metal. The material is generally selected to be non reactive with semiconductor processing etchant solutions. Drain basin 1302 is generally configured to receive a processing fluid thereon, and channel the processing fluid to a fluid drain (not shown). A central portion of basin 1302 includes a substrate chuck 1303. The substrate chuck 1303, which generally may be any type of substrate chuck used in semiconductor processing, is configured to be rotatable and/or vertically actuatable. More particularly, substrate chuck 1303 may be a vacuum chuck having at least one vacuum aperture formed into the upper surface thereof, wherein the vacuum aperture is selectively in fluid communication with a vacuum source, such that the vacuum source and vacuum aperture may cooperatively operate to secure a substrate to substrate chuck 1303 via application of negative pressure to a volume between the substrate chuck 1303. Substrate chuck 1303 is generally supported by a mechanical mechanism positioned below drain basin 1302, wherein the mechanical mechanism is configured to impart both rotational movement to chuck 1303, as well as optional vertical movement to chuck 1303, i.e., the mechanical mechanism is configured to optionally raise and lower chuck 1303 to engage and disengage substrates positioned on the substrate centering pins 1304, as will be further discussed herein. Further, the drain basin may include a shield or cover positioned over the surface of the basin, wherein the shield or cover includes apertures formed therein for components that extend upward therethrough.

The upper portion of wall 1301 generally includes a curved member (similar to curved portion 809 illustrated in the exemplary SRD of FIG. 8). The curved member operates to generate an outward and downward air flow around the perimeter of the substrate when the substrate is rotated, which operates to prevent backsplash or misting of the substrate surface by the processing fluids, which are generally acidic and known to cause defects in plated layers. More particularly, when rotating, the substrate essentially acts like a pump pushing air outward across the surface of the substrate in the direction of the wall. In conventional cells, a region of high pressure developed near the perimeter of the cell, which caused the airflow to reverse and flow upward and back over the substrate surface. The curved wall channels the air flow into a region of low pressure generated by a vacuum pump, for example, and thus, eliminates the high pressure region and the backsplash associated therewith. Without the downwardly curving surface of the wall, the outward airflow is allowed to travel upward when it hits the wall reverse direction toward the center of the substrate. This reverse flow carries the fluid suspended in the airflow back over the surface of the substrate. Thus the curved wall is configured to channel the outwardly moving airflow downward into an area of reduced pressure for capture without reversing direction or traveling back over the surface of the substrate.

Drain basin 1302 also includes a plurality of substrate centering pins 1304 extending upward therefrom. Centering pins 1304 are generally positioned radially around the perimeter of drain basin/shield 1302 in an equal spacing arrangement, for example. However, the pins 1304 may be positioned in any desired spacing arrangement. For example, in the embodiment illustrated in FIG. 13, three substrate centering pins 1304 are positioned around the perimeter of drain basin 1302 at 120° increments, however, the pins 1304 may be positioned at 20°, 180°, and 340°, for example. The substrate centering pins 1304 are generally supported by a substrate centering mechanism positioned below basin 1302, which will be further discussed herein, that is configured to both vertically actuate pins 1304 and rotationally actuate pins 1304 about a longitudinal axis of pins 1304, which generally corresponds with the rotational center of pins 1304. Bevel clean cell 1300 further includes at least one rinsing solution dispensing arm 1305, along with at least one etching solution dispensing arm 1306. Generally, both arms 1305 and 1306 are pivotally mounted to a perimeter portion of bevel clean cell 1300, and include a longitudinally extending arm having at least one fluid dispensing nozzle positioned on a distal terminating in thereof. The nozzles are positioned to dispense the respective processing fluids onto a first or upper side of a substrate positioned on the support member 1303. More particularly, When the processing cell 1300 is configured as a face-up processing cell, i.e., when substrates are positioned in the cell with the production surface facing away from basin 1302, then the fluid dispensing nozzles are configured to dispense their respective fluids onto the production surface of the substrate. The operation of arms 1305 and 1306 is generally controlled by a system controller, which is configured to precisely position (via pivotal actuation and/or vertical actuation of the respective arms) the distal end of the respective arms over a specified radial position of a substrate being processed, which allows for fluid dispensed from the nozzles positioned at the respective ends of the arms to be dispensed onto precise radial locations of a substrate being processed in bevel clean cell 1300. Additionally, although two arms are illustrated in the present exemplary embodiment for separately dispensing the rinsing solution, which may be deionized water, and the etching solution, which may be an acid, embodiments of the invention are not intended to be limited to any particular number of fluid dispensing arms. More particularly, other embodiments of the invention may implement a single pivotally mounted to arm having both rinsing solution dispensing nozzles and etchant solution dispensing nozzles positioned to thereon. In this configuration, however, the placement of the respective rinsing solution nozzles and the etching solution nozzles becomes more important, as bevel clean processes generally require precise dispensing of the etchant solution onto the exclusion zone of the substrate being processed, i.e., onto the outer 2–5 mm perimeter of the substrate. Further, each of arms 1305 and 1306 may include a mechanism configured to prevent fluid dripping from the nozzles when the nozzles are not activated from touching the substrate. For example, the nozzles may include a vacuum port or suck up valve (not shown) that is configured to receive unwanted fluid drips during off times. Alternatively, nozzles may include a gas aperture that is configured to blow unwanted droplets of fluid away from the substrate surface.

Figure 14:
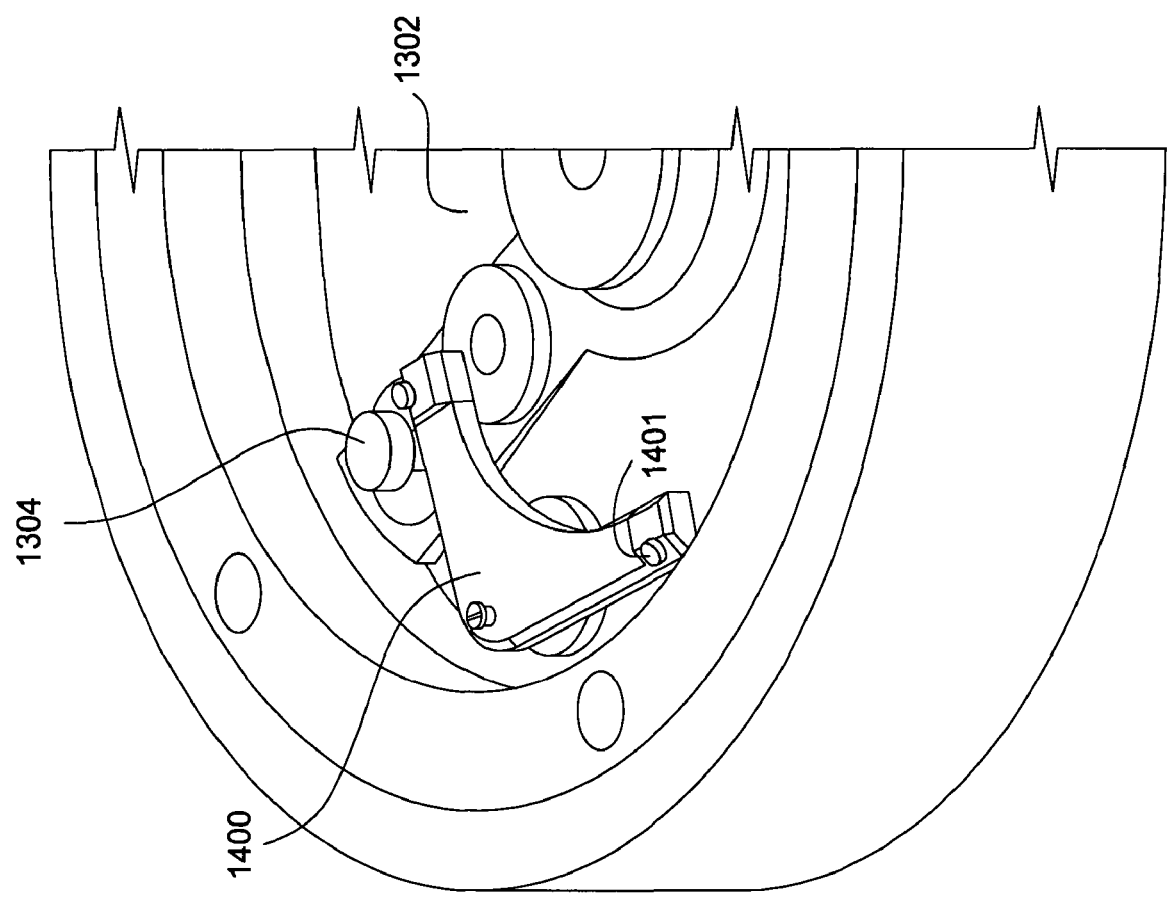
FIG. 14 illustrates a top perspective view of an exemplary backside fluid dispensing manifold for the bevel clean cell of the invention.

FIG. 14 illustrates a top perspective view of an exemplary backside fluid dispensing manifold 1400 of the invention. The backside fluid dispensing manifold 1400 is generally positioned on the fluid drain basin 1302 between substrate centering pins 1304. Manifold 1400 generally includes a V-shaped structure having 2 distal terminating ends. Each of the respective ends includes a fluid dispensing nozzle 1401 positioned to thereon. Manifold 1400 may be vertically actuated and pivotally actuated to particularly position the respective fluid dispensing nozzles 1401 with respect to the substrate being processed the cell 1300. This configuration allows for the pivotally mounted fluid dispensing arms 1305 and 1306 to dispense processing fluids onto the production or front side of the substrate, while manifold of 1400 may simultaneously dispense processing fluids onto the nonproduction or backside of the substrate.

Figure 15:
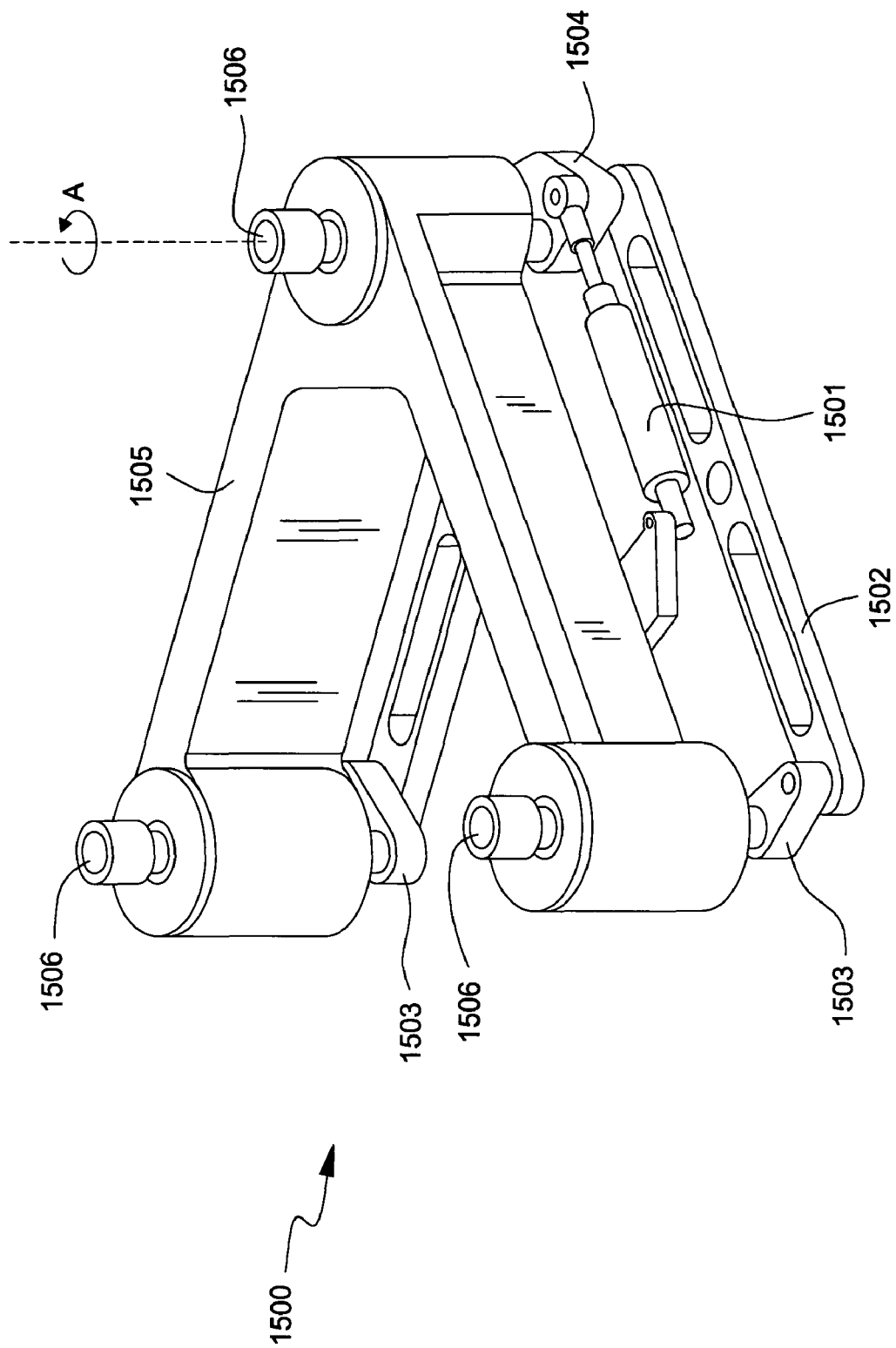
FIG. 15 illustrates a perspective view of an exemplary substrate centering mechanism of the invention.

FIG. 15 illustrates a perspective view of an exemplary substrate centering mechanism 1500 of the invention. The centering mechanism 1500 is generally positioned below basin 1302, and includes a frame member 1505 having a plurality of receptacles 1506 configured to receive and secure the substrate centering pins 1304 therein. Frame 1505 may be in communication with an actuation mechanism configured to move the frame member 1505 and the associated components, i.e., to raise and lower the frame member 1505. In the illustrated exemplary embodiment, frame 1505 includes three receptacles 1506 configured to receive the substrate centering pins 1304. A lower portion of each of receptacles 1506 extends through frame member 1505 out the opposing side, as illustrated in FIG. 15. Further, each of receptacles 1506 are rotatably mounted within frame 1505, such that the receptacles 1506 may be rotated in the, direction indicated by arrow "A" above the receptacles, and as such, cause the substrate centering pins 1304 secured in the receptacles to also rotate. With the lower portion of each of the receptacles 1506 that extends below frame 1505 generally includes an actuation arm or eccentric cam member 1503, 1504 attached thereto. Each of the actuation arms 1503, 1504 are also connected to another one of the actuation arms 1503 via connection member or linkage 1502, which may be a solid linkage, belt, hydraulic member, etc. Further, a selectively activated actuation device 1501 is mechanically in communication with a primary arm member 1504, and is configured to selectively impart pivotal movement thereto.

Since each of the receptacles 1506 are rotatably mounted within their respective portions of frame member 1505, and since each of the lower extending portions of receptacles 1506 include an actuator 1503 and linkage 1502 attached thereto, actuation of the primary arm member 1504 by actuator 1501 causes pivotal movement to actuator arm 1504, directly causes the other arms 1503 and corresponding receptacles 1506 to correspondingly pivot with the primary arm 1504. More particularly, each receptacle 1506 receives a substrate centering pan 1304, and when actuator 1501 pivots via primary arm 1504, the corresponding receptacles 1506 above arms 1504 are also pivoted. Further, since linkage 1502 can ask the secondary pivot arms 1503 to the primary pivot arms 1504, pivotal movement of the primary pivot arm 1504 translates to a corresponding pivotal movement to the secondary pivot arm 1503, which directly results in pivotal or rotational movement of the receptacles 1506 positioned above the secondary arms 1503. This configuration allows for each of the substrate centering pins to be rotatably actuated simultaneously, and for the actuation/rotation to be identical between the three substrate centering pins. Further, each of the receptacles 1506 may be vertically actuated, via, for example, vertical movement of the entire centering mechanism 1500, or alternatively, via vertical slidable movement of the receptacles 1506 within frame 1505.

Actuator 1501 is generally an actuator configured to rotate the substrate centering posts 1304 to engage and center a substrate between the respective posts without exerting excessive pressure on the substrate. For example, each of the posts 1304 includes a centering pin that operates to engage and slide the substrate to a centered position, as will be further discussed herein. Once the substrate is slidably positioned at the center location, the centering pins continue to mechanically engage the substrate to maintain the substrate in, the centered position. However, in conventional centering mechanisms, the strength and configuration of the actuator caused the substrate to bow as a result of the forces being applied to the perimeter of the substrate by the centering posts once the substrate was centered. Further, once the substrate bowed, even if the actuator were released, the lack of biasing pressure against the substrate by the actuator causes the substrate to shift from center. Therefore, to address this problem, the inventors have replaced the conventional actuator 1501 with a frictionless actuator. The frictionless actuator 1501 operates similarly to conventional actuators during the centering process however, once the substrate is centered, the frictionless actuator overcomes the bowing and shifting off center challenges associated with conventional actuators. For example, once the substrate is centered, frictionless actuators can be released without movement or a substantial change in drive pressure of the actuator. Further, frictionless actuators are capable of centering the substrate without squeezing the substrate to the point of bowing Airpot Corporation of Norwalk, Conn. manufactures instrument quality pneumatic actuators and Airpel Anti-Stiction Air Cylinders, for example, may be used to advantage as actuator 1501. These devices are generally manufactured using a graphite piston and borosilicate glass cylinder combination in which each piston is selectively matched to fit the cylinder with extremely close tolerances. This configuration provides low friction between the cylinder and piston, and therefore the actuator is responsive to forces as low as only a few grams and actuation pressures of less than 0.2 psi. Further, the starting and running friction are nearly identical, which prevents uneven or uncontrolled starts and provides uniform smoothness throughout the full stroke of the device. As such, using the, frictionless-type actuator, once the substrate is centered, the frictionless actuator may be released without encountering reverse movement or slipping of the substrate. Alternatives to the frictionless actuator include motors, voice coils, electro-ceramics, etc.

Figure 16:
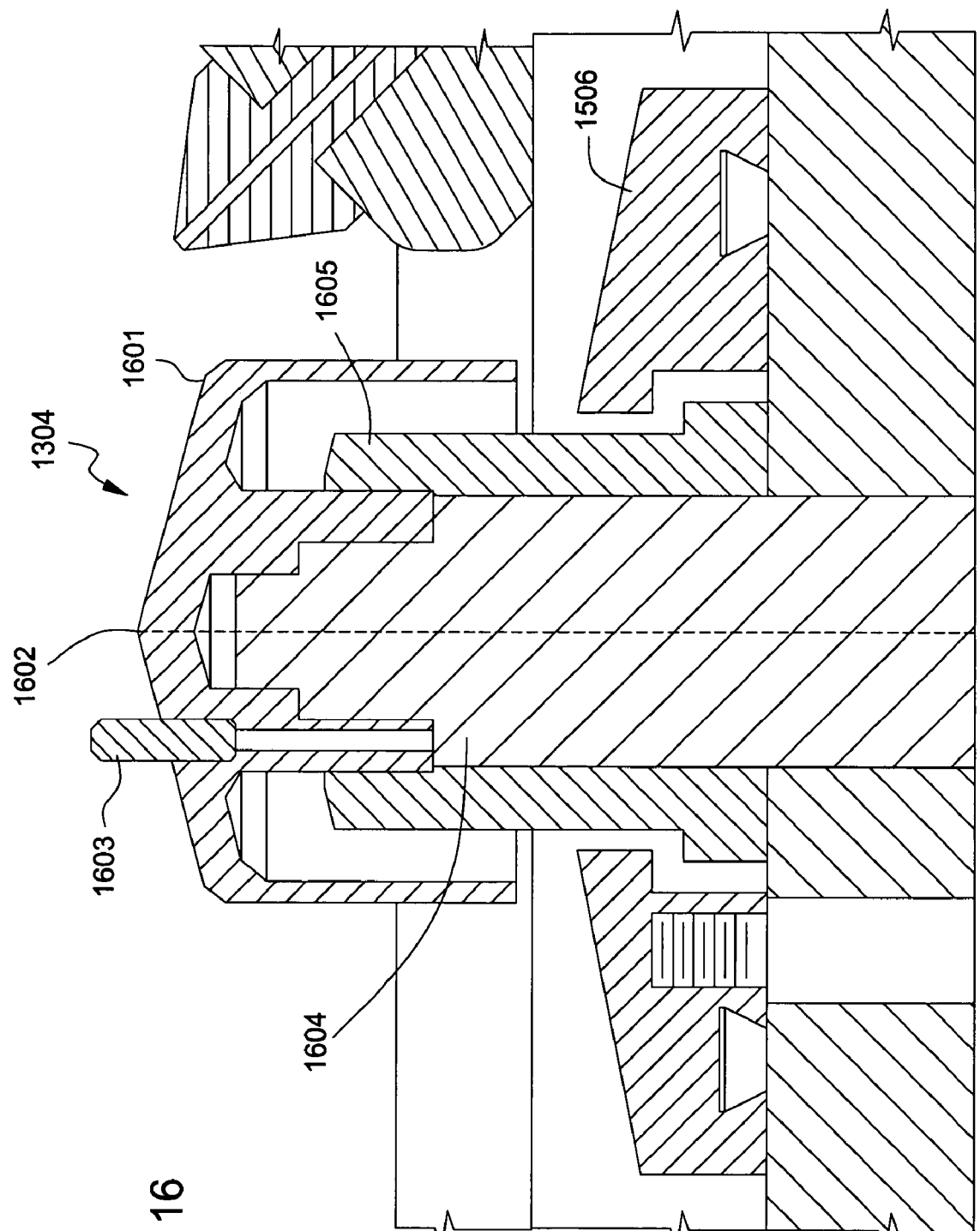
FIG. 16 illustrates a sectional view of an exemplary substrate centering member of the invention.

FIG. 16 illustrates a sectional view of an exemplary substrate centering member or post 1304 of the invention. The centering post 1304 is generally elongated, i.e., cylindrically shaped, and is configured to be received in receptacles 1506 of the substrate centering mechanism 1500. Posts 1304 generally include a core 1604 that has a cap member 1601 that covers the upper portion of the core 1604. The core 1604 is generally manufactured from a rigid material, such as a ceramic, for example. The cap member 1601 includes a raised central portion 1602 that terminates in a peak or central point. The peak or point of central portion 1602 is positioned such that it coincides with the longitudinal axis of the post 1304, such that when post 1304 is rotated, the point or peak of central portion 1602 remains in a unitary location. Cap member 1601 is generally manufactured from a rigid material that has good exposure characteristics to electrochemical plating solutions. One exemplary material that cap member 1601 may be manufactured from is PEEK. Cap member 1601 also includes a substrate centering post 1603 extending upward from the upper surface of cap 1604. The substrate centering post 1603 is positioned radially outward from the central portion 1602 or peak of cap 1601. In this manner, when the substrate centering member 1304 is rotated, the substrate centering post 1603 pivots or rotates around the longitudinal axis of core 1604, and as such, post 1603 rotates or pivots about central portion 1602. The substrate centering member 1304 also includes a sleeve member 1605 positioned radially outward of core 1604. Sleeve 1605 cooperatively engages cap 1604 and core 1604 to form a fluid seal, which prevents processing fluids from traveling through the bore containing core member 1604 and damaging the substrate centering mechanism 1500 positioned below.

Figure 17:
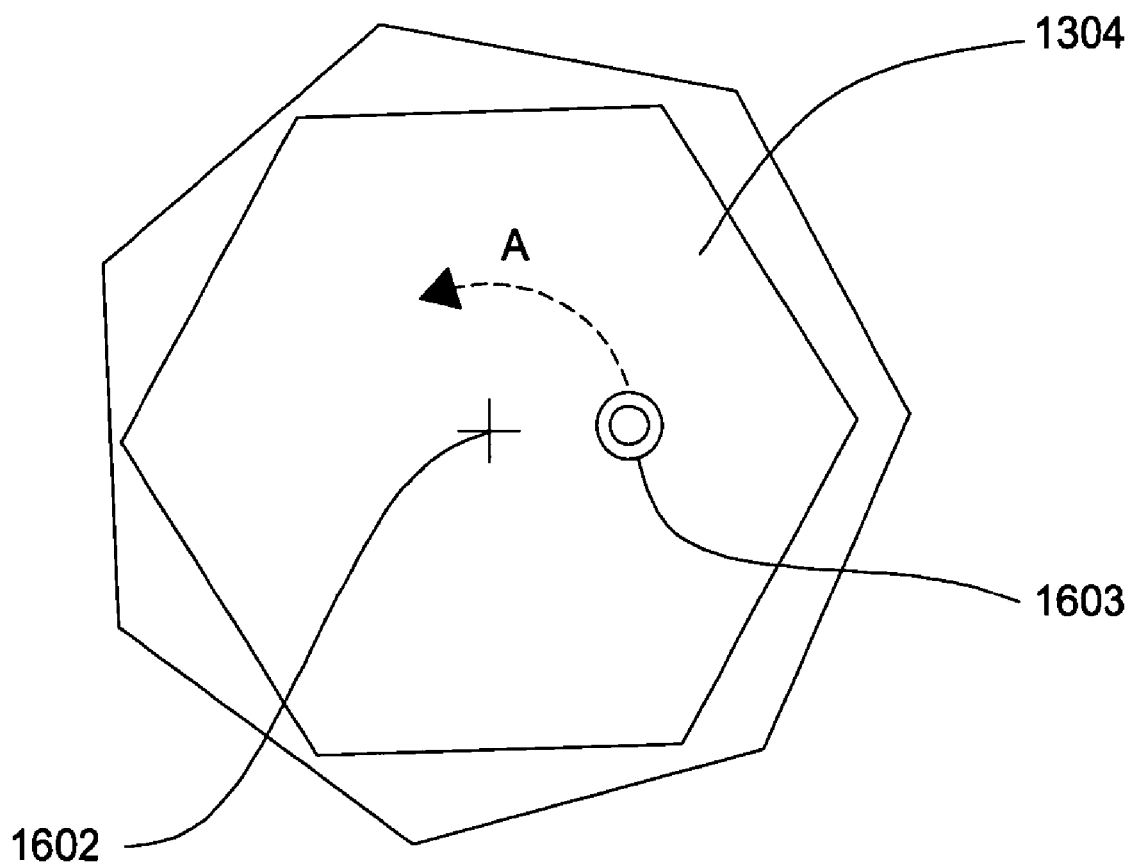
FIG. 17 illustrates a top view of an exemplary substrate centering member of the invention.

FIG. 17 illustrates a top view of an exemplary substrate centering member 1304 of the invention, and more particularly, FIG. 17 illustrates a top view of the cap member 1601 illustrated in FIG. 16. FIG. 17 illustrates the positional relationship between the center portion 1602 or peak of the center portion 1602 and the substrate centering pin 1603. Further, when centering member 1394 is rotated about its central axis, i.e., rotated about the axis that extends through point 1602 by centering mechanism 1500, then the substrate centering pin 1603 is caused to move in the direction indicated by arrow A. This motion, which will be further discussed herein, may be used to urge a substrate positioned on members 1304 to a central or center position.

In operation, the bevel cleaning cell of the invention can be used to rinse and clean substrates. The cleaning operation may be conducted on both the production surface and the non-production surface of the substrate, or on either surface individually. The cleaning cell of the invention may also be used to clean excess material from the bevel portion of the substrates, i.e., the portion of the seed layer deposited near the perimeter on the production surface, on the bevel, and partially onto the backside of the substrate. This process is often termed bevel clean or edge bead removal in the semiconductor art.

As noted above, generally, substrate processing system 100 will include plating cells positioned at locations 102, 104, 110, and 1 12, spin rinse dry and cleaning cell stacked at locations 114 and 116, and bevel clean cells positioned at locations 106 and 108. Robots and operate to transfer substrates between the respective processing cells. Generally, substrates transferred to the bevel cleaning cell locations 106 and 108 are transferred thereto from one of plating cell locations 102, 104, 110, and 112, as the bevel clean cells are generally configured to remove material deposited on the double portion of the substrate, as well as the backside of the substrate, prior to the substrate being transferred out of system 100.

The process of positioning a substrate into the bevel cleaning cell 1300 of the invention generally includes insertion, centering, and chucking. The insertion process is conducted by the substrate transfer robots, and includes bringing the substrate into bevel cleaning cell 1300 and lowering the substrate onto centering pins 1304. When the substrate is lowered onto centering pins 1304, the substrate is supported by the central peak or uppermost portion 1602 of the respective centering pins 1304. Once the substrate is positioned on the respective centering pins 1304, the robot is retracted from bevel clean cell 1300.

Once the substrate is inserted into bevel cleaning cell 1300, the centering process is conducted. The centering of the substrate in the bevel clean cell 1300 is crucial to the bevel clean process, as the tolerances for removing the edge bead material from the substrate are generally less than about 1 mm. For example, when copper is electrochemically deposited on to a semiconductor substrate, generally, the outer 3 to 5 mm perimeter of the substrate is not considered to be part of the production surface, i.e., devices are generally not formed in this outer perimeter or band, which is generally termed the exclusion zone. The exclusion zone includes an exposed portion of the seed layer where electrical contacts are generally positioned during the plating process. The seed layer deposited on to the exclusion zone generally extends onto the bevel of the substrate, and sometimes onto the backside or not production surface of the substrate. Since subsequent semiconductor processing steps will generally include contact with either the double portion of the substrate or the backside of the substrate, it is desirable to remove or clean the double and backside of the substrate, so that subsequent contact with these areas will be less likely to generate contamination particles. The removal of the material from the exclusion zone, bevel, and backside of the substrate is generally termed a bevel clean process, and includes dispensing an etchant solution onto the interface between the production surface of the substrate and the exclusion zone, while also dispensing a cleaning solution onto the backside of the substrate. Therefore, since the etchant solution dispensed on to the front side of the substrate is dispensed at the interface between the production surface and exclusion zone, it is critical that the substrate be properly centered, so that the etchant will not be dispensed onto the production, surface and damage devices.

The centering process begins by activating the frictionless actuator 1501, which gently rotates each of receptacles 1506. The substrate centering posts 1304 received in receptacles 1506 are cooperatively rotated, and therefore, substrate centering pins 1603 positioned on cap member 1601 rotated inwardly and cooperatively engage the edge of the substrate. This cooperative rotational movement of pins 1603 causes the substrate to be centered between the respective posts 1304. Once the substrate is centered between the respective posts 1304, a gentle tensioning force may be maintained on the substrate by posts 1304 via continued application of actuation pressured to frictionless cylinders 1501. However, the tensioning force is calculated to be enough force to maintain the substrate in the center position, while being an insufficient force to cause bowing or deflection of the substrate surface.

Once the substrate is centered, it may be then chucked to the substrate support member 1303. The chucking process generally includes either raising chuck 1303 to engage the lower surface of the substrate secured to the centering posts 1304, or lowering the centering posts 1304 to position the substrate on chuck 1303, or a combination of raising chuck 1303 and lowering posts 1304. Chuck 1303 can be a vacuum-type chuck, and therefore, when the substrate and chuck 1303 are brought into physical contact with each other, reduced pressure may be generated at the surface of chuck 1303 to secure the substrate thereto. Once the substrate is secured to chuck 1303, pins 1304 may be lowered or chuck 1303 may be raised, so that the substrate is supported solely by chuck 1303.

With the substrate chucked and secured, fluid processing may begin. The fluid processing generally includes pivoting the rinsing solution arm 1305 to a position approximately above the center of the substrate. The rinsing solution may then be dispensed therefrom while the substrate is rotated on the chuck 1303. The rotation causes the rinsing solution, which may be DI water, for example, to be urged radially outward toward the perimeter of the substrate. The rinsing solution flows over the bevel edge of the substrate and falls onto drain basin 1302, were it may be collected by a drain (not shown). A chemical dispensing, arm 1306 may also be positioned above the substrate, in more particularly, the chemical dispensing all arm 1306 may be specifically positioned such that an etchant solution may be dispensed therefrom onto the interface between the production surface and the exclusion zone of the substrate. The process of dispensing the etchant solution onto the interface generally includes terminating the dispensing of the rinsing solution from arm 1305, and initiating the dispensing of the etchant solution from arm 1306. This methodology allows the rinsing solution previously dispensed onto the production surface to maintain a barrier or shield layer on the production surface, which may act to dilute any etchant that may splash back onto the production surface. Further, termination of the rinsing solution dispensing process prior to dispensing the etchant and also operates to prevent unwanted dilution of the etchant solution.

Similarly, the backside fluid dispensing nozzle 1400 may also be used to dispense a rinsing solution and an etchant solution onto the backside of the substrate. The backside fluid dispensing nozzle or manifold 1400 generally includes a plurality of nozzles, which allows for the backside fluid dispensing nozzle 1400 to dispense both a rinsing solution and an etchant solution. Thus, while the cleaning and rinsing processes are being conducted on the front side of the substrate, backside nozzle 1400 may simultaneously be used to rinse and clean the backside of the substrate.

An exemplary bevel cleaning process may include the first prerinsing both of the front and backside surfaces of the substrate. The prerinsing process may include dispensing DI onto the front side of the substrate at, a flow rate of between about 1 L/min and about 2 L/min and dispensing DI onto the backside of the substrate at a flow rate of between about 50 cc/min and 100 cc/min. During this process, the substrate may be rotated between about 150 rpm and about 250 rpm, and the duration for the fluid dispensing processes may be between about eight seconds and about 20 seconds. Generally, the prerinsing process is configured to rinse off any residual electrolyte that may be adhering to the substrate surface as a result of the previous electrochemical plating process. Once the substrate is prerinsed, the rotation speed may be increased to between about 2000 rpm and about 3500 rpm for about five seconds in order to remove any DI buildup near the edge of the substrate. Thereafter, while the substrate is still rotating at between about 2000 rpm and about 3500 rpm, the etchant solution may be applied to the interface between the production surface and the exclusion zone by arm 1306, for example. The etchant solution may be delivered to the interface at a flow rate of between about 20 cc/min and about 40 cc/min, for example, and the duration may be between about 10 seconds and about 25 seconds. The flow of etchant solution is generally though a relatively fine nozzle having an aperture with an inner diameter, for example, of between 0.25 and 0.5 inches. The rotation rate is maintained at the high rate in order to minimize staining of the production surface as a result of any splashing of the etchant solution inwardly onto the production surface. Generally, the nozzle that dispenses the etchant solution onto the substrate is positioned between about 1 mm and about 3 mm from the substrate surface to allow for precise dispensing of the etchant solution onto the interface. Further, the nozzle is generally angled at between about 30° and about 50°, i.e., angled toward the substrate perimeter, to minimize splash back onto the production surface.

The chemical makeup of the etchant solution is generally based on $H_2SO_4$, and therefore, when the concentration of $H_2SO_4$ is sufficient, the etch rate does not change at a fixed $H_2O_2$ concentration. Similarly, when the $H_2SO_4$ concentration is insufficient, the etch rises with $H_2SO_4$ non linearly. Further, when $H_2SO_4$ concentration is sufficient, the etch changes linearly with $H_2O_2$ concentration, and when the $H_2SO_4$ concentration is insufficient, the etch rate flattens due to diffusion limited oxidation. Therefore, an exemplary ratio of constituents in an etching solution is between about 15 and 25 parts $H_2SO_4$, between about 350 and 450 parts $H_2O_2$, and over 1400 parts. $H_2O$, or about 20 parts $H_2SO_4$, 400 parts $H_2O_2$, and 1580 parts $H_2O$, for example. These concentrations indicate that increasing the acid concentration increases the etch rate, while the peroxide concentration has a minimal effect on the etch rate when increased. Further, when $H_2O_2$ concentration is less than 6%, oxidation of copper has shown to be slow, and therefore, at these concentrations the etch rate is generally not effected by the $H_2SO_4$ concentration. However, when $H_2O_2$ concentration is greater than 6%, copper oxidation is increased, and therefore, the etch rate of high concentration $H_2SO_4$ rises with $H_2O_2$ concentrations.

When the duration of the etchant solution dispensing process is completed, a rinsing solution may once again be dispensed onto the production surface at a flow rate of between about 1 L/min and about 2.5 L/min for between about 3 seconds and about 10 seconds, while the rotation rate may be reduced to between about 100 rpm and about 300 rpm. The step of dispensing a rinsing solution onto the production surface of the substrate may serve two purposes. First, the rinsing solution dispensed after the etchant solution operates to dilute and rinse away any splashed etchant solution from the production surface. Second, the rinsing solution also forms a secondary protection layer to protect from etching solution that may splash from the subsequent backside chemical dispensing step. When the dispensing process for the front side rinsing solution is completed, the backside chemical nozzle may be activated to dispense an etchant solution onto the backside of the substrate at a flow rate of between about 30 cc/min and about 70 cc/min for between about 4 seconds and about 10 seconds, while the rotation rate of the substrate is maintain to between about 150 rpm and about 250 rpm. More particularly, the flow rate of the etchant may be between about 35 cc/min and 45 cc/min. Higher flow rates have been shown to generate improved edge profile and bevel cleaning, however, these advantages are tempered by increased edge staining. When the backside chemical dispensing step is completed, another front side rinsing step may be conducted to rinse any splashed etchant from the front side surface. The front side rinsing process may again, include dispensing DI at the previous flow rates and rotation rates: for a duration of between about two seconds and about six seconds. When the final rinsing process is completed, all fluid dispensing nozzles may be turned off and the rotation rate of the substrate may be increased to between about 400 rpm and about 4000 rpm, generally between about 2000 rpm and 3000 rpm, to partially or completely dry the substrate.

Figure 18:
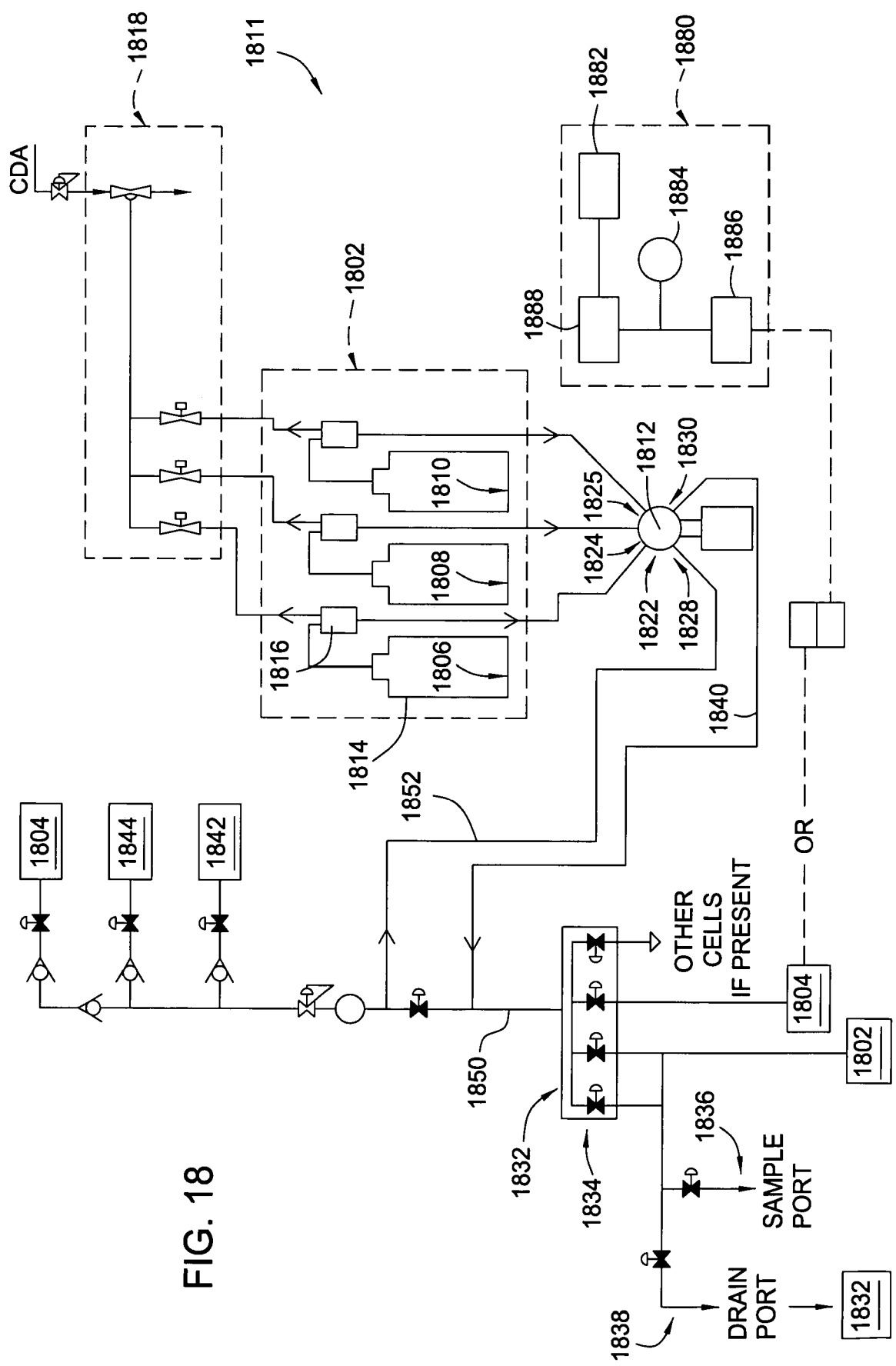
FIG. 18 illustrates an exemplary fluid delivery system of the invention.

FIG. 18 is a schematic diagram of one embodiment of a plating solution delivery system 1811. The plating solution delivery system 1811 is generally configured to supply a plating solution to each processing location on system 100 that requires the solution. More particularly, the plating solution delivery system is further configured to supply a different plating solution or chemistry to each of the processing locations. For example, the delivery system may provide a first plating solution or chemistry to processing locations 110, 112, while providing a different plating solution or chemistry to processing locations 102, 104. The individual plating solutions are generally isolated for use with a single plating cell, and therefore, there are no cross contamination issues with the different chemistries. However, embodiments of the invention contemplate that more than one cell may share a common chemistry that is different from another chemistry that is supplied to another plating cell on the system. These features are advantageous, as the ability to provide multiple chemistries to a single processing platform allows for multiple chemistry plating processes on a single platform.

In another embodiment of the invention, a first plating solution and a separate and different second plating solution can be provided sequentially to a single plating cell. Typically, providing two separate chemistries to a single plating cell requires the plating cell to be drained and/or purged between the respective chemistries, however, a mixed ratio of less than about 10 percent first plating solution to the second plating solution should not be detrimental to film properties.

Plating solution delivery system 1811 typically includes a plurality of additive sources 1802 and at least one electrolyte source 1804 that are fluidly coupled to each of the processing cells of system 100 via a manifold 1832. Typically, the additive sources 1802 include an accelerator source 1806, a leveler source 1808, and a suppressor source 1810. The accelerator source 1806 is adapted to provide an accelerator material that typically adsorbs on the surface of the substrate and locally accelerates the electrical current at a given voltage where they adsorb. Examples of accelerators include sulfide-based molecules. The leveler source 1808 is adapted to provide a leveler material that operates to facilitate planar plating. Examples of levelers are nitrogen containing long chain polymers. The suppressor source 1810 is adapted to provide suppressor materials that tend to reduce electrical current at the sites where they adsorb (typically the upper edges/corners of high aspect ratio, features). Therefore, suppressors slow the plating process at those locations, thereby reducing premature closure of the feature before the feature is completely filled and minimizing detrimental void formation. Examples of suppressors include polymers of polyethylene glycol, mixtures of ethylene oxides and propylene oxides, or copolymers of ethylene oxides and propylene oxides.

In order to prevent situations where an additive source runs out and to minimize additive waste during bulk container replacement, each of the additive sources 1802 generally includes a bulk or larger storage container coupled to a smaller buffer container 1816. The buffer container 1816 is generally filled from the bulk storage container 1814, and therefore, the bulk container may be removed for replacement without affecting the operation of the fluid delivery system, as the associated buffer container may supply the particular additive to the system while the bulk container is being replaced. The volume of the buffer container 1816 is typically much less than the volume of the bulk container 1814. It is sized to contain enough additive for 10 to 12 hours of uninterrupted operation. This provides sufficient time for operators to replace the bulk container when the bulk container is empty. If the buffer container was not present and uninterrupted operation was still desired, the bulk containers would have to be replaced prior to being empty, thus resulting in significant additive waste.

In the embodiment depicted in FIG. 18, a dosing pump 1812 is coupled between the plurality of additive sources 1802 and the plurality of processing cells. The dosing pump 1812 generally includes at least a first through fourth inlet ports 1822, 1824, 1826, 1828. As an example, the first inlet port 1822 is generally coupled to the accelerators source 1806, the second inlet port 1824 is generally coupled to the leveler source 1808, the third inlet port 1826 is generally coupled to the suppressor source 1810, and the fourth inlet port 1828 is generally coupled to the electrolyte source 1804. An output 1830 of the dosing pump 1812 is generally coupled to the processing cells via manifold 1832 by an output line 1840 wherein mixing of the sequentially supplied additives (i.e., at least one or more accelerators, levelers and/or suppressors) may be combined with electrolyte provided to the manifold 1832 through a first delivery line 1850 from the electrolyte source 1804, to form the first or second plating solutions as desired. The dosing pump 1812 may be any metering device(s) adapted to provide measured amounts of selective additives to the process cells 102, 104. The dosing pump 1812 may be a rotary metering valve, a solenoid metering pump, a diaphragm pump, a syringe, a peristaltic pump, or other positive displacement pumps used singularly or coupled to, a flow sensor. In addition, the additives could be pressurized and coupled to a flow sensor, coupled to a liquid mass flow controller, or metered by weight utilizing load cell measurement of the pressurized, dispense vessel or other fluid metering devices acceptable for flowing electrochemical plating solutions to a plating cell. In one: embodiment, the dosing pump includes a rotating and reciprocating ceramic piston that drives 0.32 ml per cycle of a predetermined additive.

In another embodiment of the invention the fluid delivery system may be configured to provide a second, completely different plating solution and associated additives. For example, in this embodiment a different base electrolyte solution (similar to the solution contained in container 1804) may be implemented to provide the processing system 100 with the ability, for example, to use plating solutions from two separate manufacturers. Further, an additional set of additive containers may also be implemented to correspond with the second base plating solution. Therefore, this embodiment of the invention allows for a first chemistry (a chemistry provided by a first manufacturer) to be provided to one or more plating cells of system 100, while a second chemistry (a chemistry provided by a second manufacturer) is provided to one or more plating cells of system 100. Each of the respective chemistries will generally have their own associated additives, however, cross dosing of the chemistries from a single additive source or sources is not beyond the scope of the invention.

In order to implement the fluid delivery system capable of providing two separate chemistries from separate base electrolytes, a duplicate of the fluid delivery system illustrated in FIG. 18 is connected to the processing system. More particularly, the fluid delivery system illustrated in FIG. 18 is generally modified to include a second set of additive containers 1802, a second pump assembly 1830, and a second manifold 1832 (shared manifolds are possible). Additionally, separate sources for virgin makeup solution/base electrolyte 1804 are also provided. The additional hardware is set up in the same configuration as the hardware illustrated in FIG. 18, however, the second fluid delivery system is generally in parallel with the illustrated or first fluid delivery system. Thus, with this configuration implemented, either base chemistry with any combination of the available additives may be provided to any one or more of the processing cells of system 100.

The manifold 1832 is typically configured to interface with a bank of valves 1834. Each valve of the valve bank 1834 may be selectively opened or closed to direct fluid from the manifold 1832 to one of the process cells of the plating-system 100. The manifold 1832 and valve bank 1834 may optionally be configured to support selective fluid delivery to additional number of process cells. In the embodiment depicted in FIG. 18, the manifold 1832 and valve bank 1834 include a sample port 1836 that allows different combinations of chemistries or component thereof utilized in the system 100 to be sampled without interrupting processing.

In some embodiments, it may be desirable to purge the dosing pump 1812, output line 1840 and/or manifold 1832. To facilitate such purging, the plating solution delivery system 1811 is configured to supply at least one of a cleaning and/or purging fluid. In the embodiment depicted in FIG. 18, the plating solution delivery system 1811 includes a deionized water source 1842 and a non-reactive gas source 1844 coupled to the first delivery line 1850. The non-reactive gas source 1844 may supply a non-reactive gas, such as an inert gas, air or nitrogen through the first delivery line 1850 to flush out the manifold 1832. Deionized water may be provided from the deionized water source 1842 to flush out the manifold 1832 in addition to, or in place of non-reactive gas. Electrolyte from the electrolyte sources 1804 may also be utilized as a purge medium.

A second delivery line 1852 is teed between the first gas delivery line 1850 and the dosing pump 1812. A purge fluid includes at least one of the electrolyte, deionized water or non-reactive gas from their respective sources 1804, 1842, 1844 may be diverted from the first delivery line 1850 through the second gas delivery line 1852 to the dosing pump 1812. The purge fluid is driven through the dosing pump 1812 and out the output line 1840 to the manifold 1832. The valve bank 1834 typically directs the purge fluid out a drain port 1838 to the reclamation system 1832. The various other valves, regulators and other flow control devices have not been described and/or shown for the sake of brevity.

In one embodiment of the invention, a first chemistry may be provided to the manifold 1832 that promotes feature filling of copper oh a semiconductor substrate. The first chemistry may include between about 180 and about 65 g/l of copper, between about 55 and about 85 ppm of chlorine, between about 20 and about 40 g/l of acid, between about 4 and about 7.5 ml/L of accelerator, between about 1 and 5 ml/L of suppressor, and no leveler. The first chemistry is delivered from the manifold 1832 to a first plating cell 102 to enable features disposed on the substrate to be substantially filled with metal. As the first chemistry generally does not completely fill the feature and has an inherently slow deposition rate, the first chemistry may be optimized to enhance the gap fill performance and the defect ratio of the deposited layer. A second chemistry makeup with a different chemistry from the first chemistry may be provided to another plating cell on system 100 via manifold 1832, wherein the second chemistry is, configured to promote planar bulk deposition of copper on a substrate. The second chemistry may include between about 185 and about 60 g/l of copper,, between about 60 and about 80 ppm of chlorine, between about 20 and about 40 g/l of acid, between about 4 and about 7.5 ml/L of accelerator, between about 1 and about 4 ml/L of suppressor, and between about 6 and about 10 ml/L of leveler, for example. The second chemistry is delivered from the manifold 1832 to the second process cell to enable an efficient bulk metal deposition process to be performed over the metal deposited during the feature fill and planarization deposition step to fill the remaining portion of the feature. Since the second chemistry generally fills the upper portion of the features, the second chemistry may be optimized to enhance the planarization of the deposited material without substantially impacting substrate throughput. Thus, the two-step, different chemistry deposition process allows for both rapid deposition and good planarity of deposited films to be realized.

Figure 19:
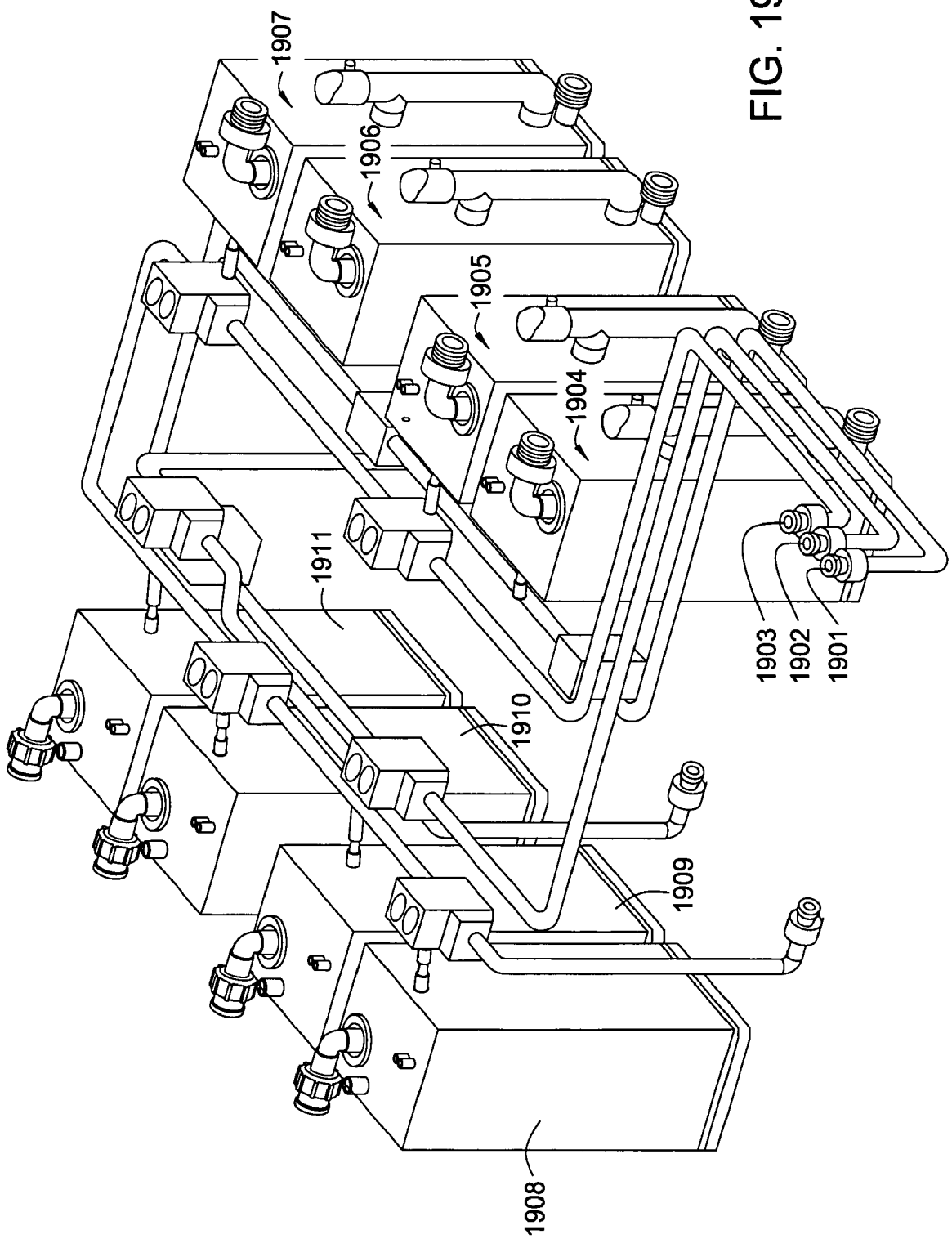
FIG. 19 illustrates an exemplary tank and conduit configuration of the invention.

Plating solution delivery system 1811 is in communication with a plurality of fluid conduits that connect the fluid delivery system 1811 to fluid storage tanks positioned on board plating system 100. More particularly, the fluid dispensing manifold 1832 is generally in communication with a plurality of conduits 1901, 1902, 1903, as illustrated in FIG. 19. Each of the conduits 1901, 1902, 1903 connect to particular fluid storage tanks 1904–1911, which will be further discussed herein. As such, the fluid delivery system 1811 may be controlled to mix and provide a particular catholyte or anolyte solution to any one of the tanks 1904–1911. The particular anolyte/catholyte solution is provided to manifold 1832, which selectively opens actuatable valves to allow the particular solution to flow into one of conduits 1901, 1902, 1903. Assuming, for example, that conduit 1901 is configured to supply a particular catholyte to a specific plating cell on platform 100, then the catholyte supplied to conduit 1901 is carried by the conduit to a particular plating cell holding tank, such as tank 1904, that is configured to supply the specified plating cell with a catholyte. The catholyte solution is delivered to tank 1904 and then a valve positioned in conduit 1901 closes and terminates the flow of solution into tank 1904. Then the tank 1904 may be used to supply catholyte to a particular plating cell on platform 100 for an electrochemical plating process. The solution remaining in the conduit 1901 may be purged or drained from the conduit prior to another solution being supplied to one or more cells through the particular conduit, so that cross contamination issues maybe minimized.

Each of the tanks illustrated in FIG. 19, i.e., tanks 1904–1911, are generally arranged in pairs. More particularly, tanks 1904 and 1905 operate as a pair, while tanks 1906 and 1907, tanks 1908 and 1909, and tanks 1910 and 1911 similarly operate as tank pairs. The tank pair generally includes a first tank configured to contain a first solution and a second tank configured to, contain a second solution that is different from the first solution. In the exemplary plating system illustrated in FIG. 1, plating location 112 may be outfitted with a plating cell, such as plating cell 200 illustrated in FIG. 2, and therefore, and first tank 1900 may be configured to supply a catholyte solution to cell 200, while the second tank 1905 may be configured to provide an anolyte solution to plating cell 200. As noted above, the catholyte solution may be prepared by fluid delivery system 1811 and delivered to tank 1904 via conduit 1901. Similarly, the anolyte solution may be prepared by fluid delivery system 1811 and provided to anolyte tank 1905 via conduit 1903.

In similar fashion to the arrangement of tanks 1904 and 1905, tanks 1906 and 1907 may be configured to provide plating solutions to a plating cell positioned at processing location 110 on platform 100. Further, tanks 1910 and 1911 and tanks 1908 and 1909 may be used to provide plating solutions to plating cells positioned at processing locations 104 and 102, respectively. Each of tank pairs 1906–1911 may be configured to provide both catholyte solutions and anolyte solutions to their respective plating cells. Alternatively, and the tanks may be configured to provide only catholyte solutions to their associated plating cells, i.e., the tanks may be combined into a single tank configured to supply a single plating solution to one or more cells on the processing platform 100.

Figure 20:
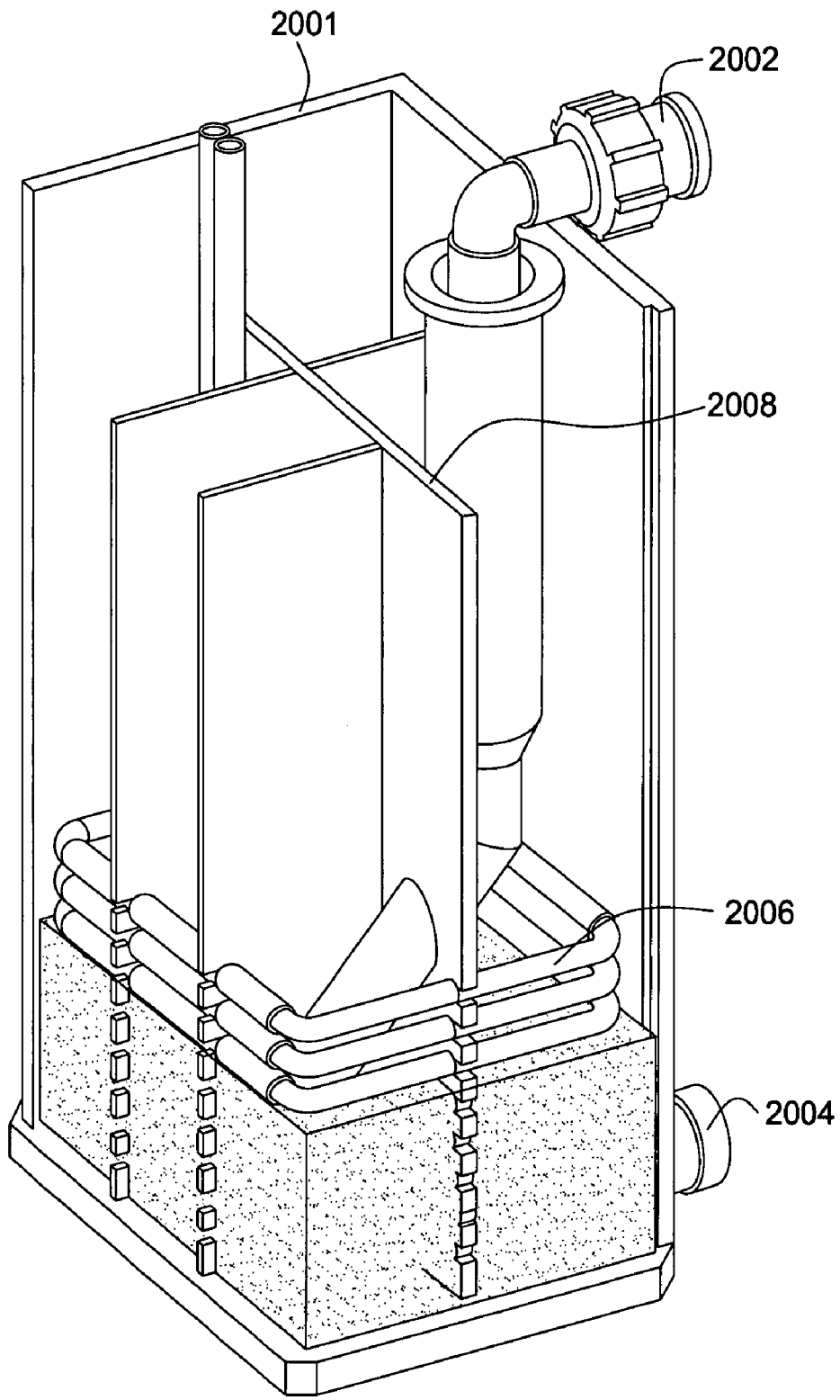
FIG. 20 illustrates a perspective view of the interior components of a fluid tank of the invention.

FIG. 20 illustrates a perspective view of an exemplary tank 2000 having two walls of the tank removed to allow for viewing of the interior components of the tank 2000. Tank 2000 generally includes an enclosed space having upstanding sidewalls 2001 that define an interior volume configured to contain a fluid solution therein. A fluid returned assembly 2002 extends downward into the tank and terminates near a lower portion of tank 2000. The interior volume of tank 2000 also includes a plurality of intersecting walls 2008 configured to baffle fluid flow within the interior volume of tank 2000. A lower portion of tank 2000 includes a heat exchanger 2006, which generally operates to provide temperature control to the processing fluid contained within tank 2000. A pump head assembly 2004 extends into the interior volume of tank 2000 and terminates adjacent the bottom portion of tank 2000, and is generally configured to draw fluid from the interior volume of tank 2000 for use in a processing step.

Figure 22:
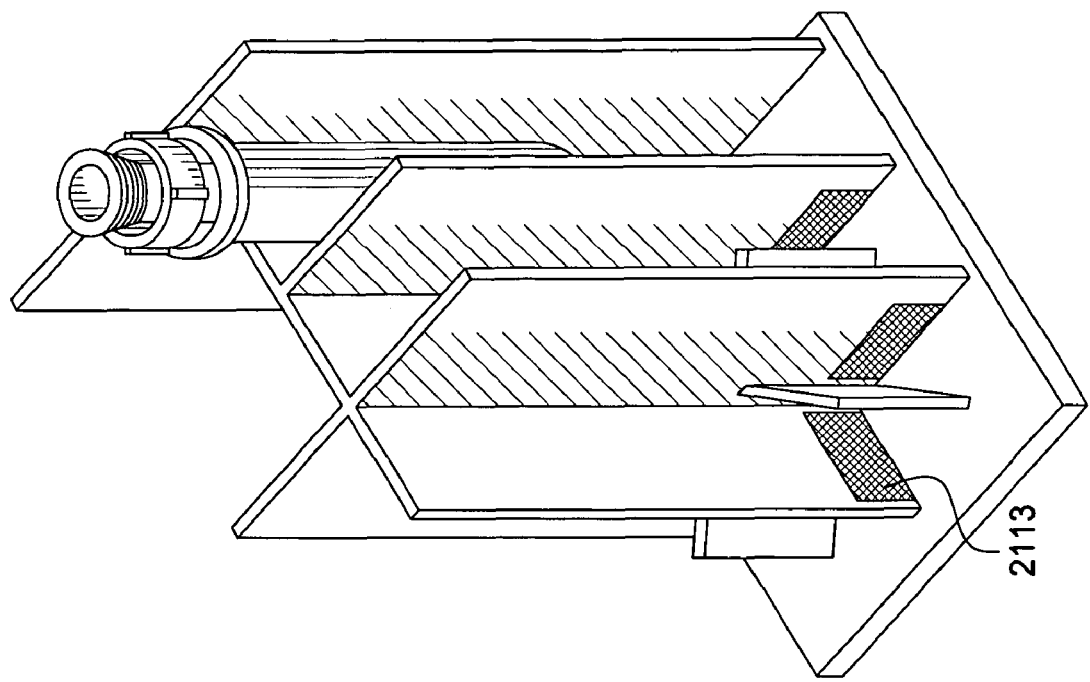
FIG. 22 illustrates a perspective view of exemplary interior wall components of the fluid tank of the invention.
Figure 21:
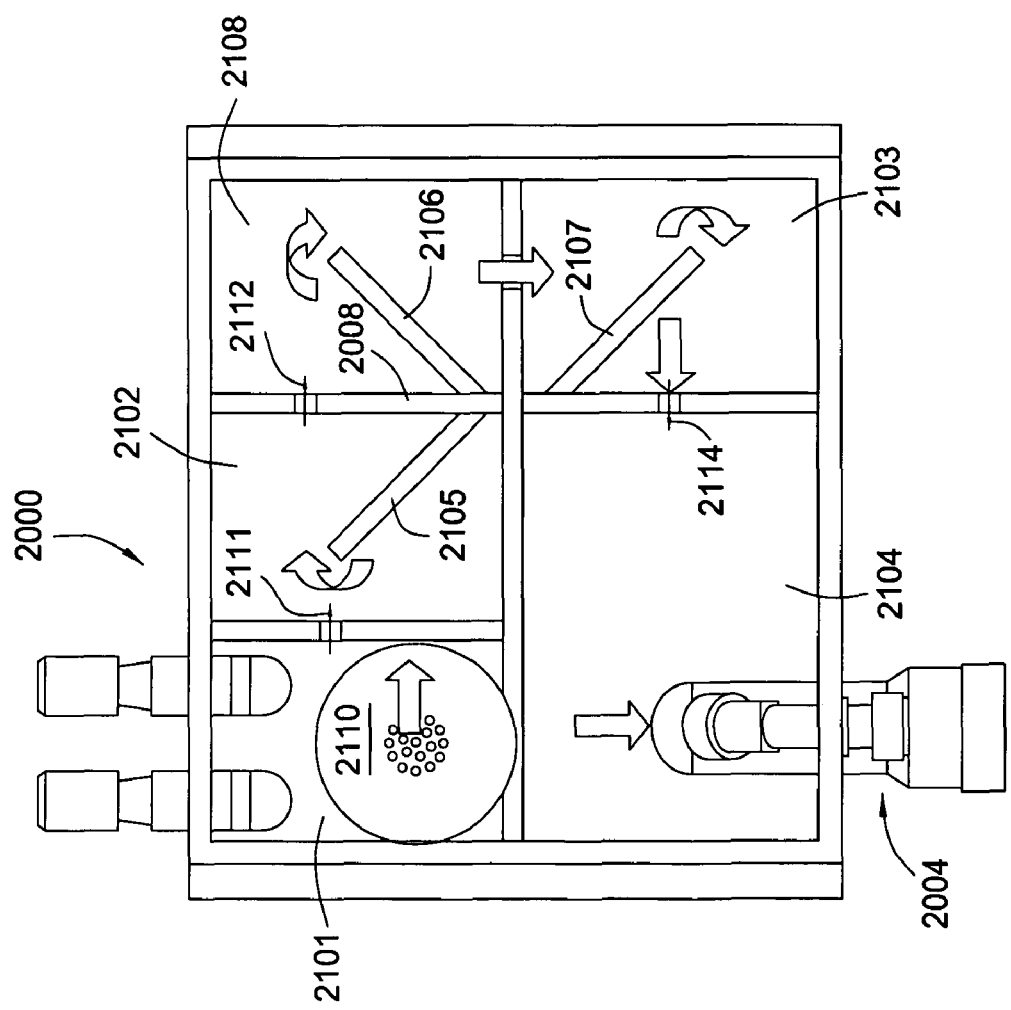
FIG. 21 illustrates a plan view of an exemplary fluid tank of the invention.

FIG. 21 illustrates a plan view of an exemplary fluid tank of the invention. As illustrated in FIG. 20, the fluid tank includes a plurality of upstanding fluid diversion walls 2008 positioned in the interior volume of the tank 2000. The positioning of the diversion walls 2008 generally operates to create a plurality of fluid compartments 2101, 2102, 2103, 2104, and 2108. Each of the fluid compartments are in communication with an adjoining fluid compartment via a fluid pass-through 2113, as illustrated in FIG. 22. Further, in addition to the interior walls 2008, selected compartments may include angled fluid diversion walls 2105, 2106, and 2107 positioned therein, as illustrated in FIG. 21. More particularly, the fluid tanks may include a slanted or angled fluid receiving wall 2300. The angled or slanted wall 2300 may be an exterior wall or an interior wall. Regardless, the slanted wall is configured to minimize bubble formation in the solution contained in the tank via minimization of bubbles generated by pouring the liquid solution vertically into the tank. In this embodiment the fluid delivered to the tank is dispensed onto the angled wall 2300 by the fluid return line 2002, such that the fluid flows onto the wall 2300 at location 2301 and flows downwardly along the surface of the wall 2300 in the direction indicated by arrow "A" into the solution contained in the tank. The flow of the solution down the sloped or slanted wall into the solution minimizes bubbles formed at the interface between solution in the tank and the solution being returned to the tank.

Therefore, in operation, fluid is generally returned to tank 2000 via a fluid supply line 2110 that terminates in a first fluid compartment 2101 (optionally the fluid supply line may terminate onto an angled wall, as described above). The fluid supplied to compartments 2101 travels through a first fluid pass-through 2111 into a second fluid compartment 2102. Once the fluid enters the second fluid compartment 2102, the fluid is directed toward an angled fluid diversion wall 2105. The fluid travels around the angled fluid diversion wall 2105 and travels through a second fluid pass-through 2112 into a second fluid compartment 2108. In similar fashion to the first fluid compartment, the fluid closed against an angled wall and through another fluid pass-through into a third fluid compartment 2103, where the same process is repeated until the fluid passes through a final fluid pass-through 2114 into a final fluid compartment 2104. Each of the individual angled walls are, configured to interact with the fluid flow in a manner that minimizes bubbles in the tank, as will be further discussed herein. Further, the positioning of the pass throughs 2111–2114 also operates to minimize bubbles in the tanks, as the buoyancy of the bubbles generally prevents the bubbles from traveling through the pass throughs positioned in the lower portion of the respective walls. The pump head 2000 generally terminates in the final fluid compartment 2104, and therefore, fluid is pumped from tank 2000 via a pump head 2004 out of final compartment 2104.

As noted above, the positioning of the plurality of upstanding walls 2008 and angled fluid diversion walls 2105, 2106, 2107 operates to minimize bubbles in the fluid solution being pumped from tank 2000. More particularly, the configuration of tank 2000 is designed such that fluid delivered to tank 2000 is required to flow against several walls, around several walls, and through several fluid pass-throughs before the fluid is pumped from tank 2000 via pump head 2004. In operation, when fluid is caused to flow against a stationary surface, bubbles within the solution are prone to adhere to the stationary surface, and thus, the bubbles are removed from the flowing liquid. Similarly, passage of the fluid through a plurality of fluid feed through 2101 has been shown to cause bubbles suspended in the fluid solution to be removed therefrom. As such, the tank configuration of the present invention is configured to minimize bubbles in the fluid solution being pumped from tank 2000. This is of particular importance to electrochemical plating systems, as bubbles in the fluid solution, i.e., the electrolyte, that is provided to the plating cell have been shown to cause substantial defects in plated substrates.

In another embodiment of the invention, tank 2000 is modified to further minimize bubble formation resulting from fluid being delivered to tank 2000. More particularly, conventional fluid storage tanks for electrochemical plating systems generally deliver fluid to the storage tank via an aperture positioned in upper portion of the tank. As such, fluid delivered to the tank falls as a result of gravity and is essentially poured into the solution in the tank. This pouring action has been shown to generate bubbles in the plating solution. Therefore, embodiments of the present invention provide for an improved method for delivering fluid to electrochemical plating system storage tank with minimal bubble formation. The method generally includes positioning an angled wall within the first compartment 2101 of tank 2000, as generally discussed above and illustrated in FIG. 23. The angled wall may attach to one of the upstanding walls surrounding container 2101, and the fluid delivered to tank 2000 is dispensed directly onto the angled wall. The fluid flows downward on the angled wall into the fluid in the bottom of the tank. In this configuration the fluid does not fall, get poured, or splash into the tank, rather the fluid is dispensed onto the angled wall and is caused to evenly flow into the bulk solution in a sheet like action with minimal bubble formation in the bulk solution.

Each of the tanks of the present invention are also configured to have a high aspect ratio, i.e., the ratio of the height of the tank to the sides or cross sectional area of the tank. As such, the tanks generally have small cross sectional areas, i.e., length and width, and have large height dimensions. This provides for optimal pump head depth even when reduced volumes of solution are being used. For example, embodiments of the present invention utilize a tank having an interior volume of approximately 17 liters, wherein the width is about 9 inches, length is about 7.75 inches, and the height is about 19 inches. As such, the aspect ratio would be greater than 1:1 (19:(9+7.75)). Another feature of the invention that maximizes pump head depth, is the positioning of the heat exchanger in the lower portion of the tank. This displaces a substantial volume within the lower portion of the tank, and therefore, increases pump head depth.

In operation, embodiments of the invention generally provide a plumbing system for a plating system, wherein the plumbing system is configured to provide multiple chemistries to multiple plating cells positioned on a unitary electrochemical plating platform. More particularly, the plumbing system of the invention is configured to provide, for example, a first plating solution to a first plating cell on an electrochemical plating platform, while providing a second chemistry that is different from the first chemistry to a second plating cell on the electrochemical plating platform. The plumbing system of the invention may be expanded to provide, for example, four different plating chemistries to four different plating cells positioned on a unitary system platform. Further, in plating systems using plating cells configured to utilize both in anolyte and a catholyte, such as plating cell 200 illustrated in FIG. 2, the plumbing system of the present invention is generally configured to provide separate catholyte solutions to each plating cell positioned on the processing platform, while providing in anolyte solution to each plating cell positioned on the processing platform. In similar fashion to previous embodiments, the catholyte solutions may all be different, and further, the anolyte solutions may also be different from each other.

When operating electrochemical plating platform, such as platform 100 illustrated in FIG. 1, delivery system 1811 may be activated to generate a catholyte solution for plating cells positioned at processing locations 112 and 110. The catholyte solution may contain an appropriate amount of acid, halides, supporting electrolyte, additives, and/or other components generally used in electrochemical plating solutions. The solution may be mixed in fluid delivery system 1811, pumped via manifold 1832, and supplied to conduit 1901 for delivery to tanks 1904 and 1906. In this configuration, tanks 1904 and 1906 are in the fluid communication with a catholyte chamber of plating cell 200 positioned at processing locations 110 and 112. Since plating cell 200 is the type of plating cell requiring both a catholyte and an anolyte, fluid delivery system 1811 may also be activated to generate in anolyte for use in the cells. The anolyte may be generated in fluid delivery system 1811, transmitted to manifold 1832, and delivered to tanks 1905 and 1907 via fluid conduit 1903. Tanks 1905 and 1907 are generally in fluid communication with an anode or anolyte compartment of plating cell 200 positioned at processing locations 110 and 112.

The particular combination of anolyte and catholyte supplied to tanks 1904–1907 may be configured to optimize bottom up fill characteristics for semiconductor substrates. More particularly, the additive concentration, i.e., levelers, suppressors, and accelerators, for example, in the catholyte solutions provided to tanks 1904 and 1906:may be configured to facilitate the initial stages of plating where high aspect ratio features on semiconductor substrates are nearly void of plated material. The process of beginning feature fill on semiconductor substrates is critical to the overall plating process, as is generally difficult to fill high aspect ratio features from the bottom up without obtaining closure of the feature and generating voids in the plated metal. Therefore, the plumbing system of the present invention allows for the feature fill process to be conducted in particular processing locations with specific chemistries designed to facilitate bottom up fill.

Similarly, once the bottom up or feature fill process is completed, substrates are generally put through a secondary plating process wherein the features are bulk filled or overfilled. The bulk filling process is generally conducted at a greater plating rate than the feature fill process, and therefore, generally uses an increased current density. As such, the chemistry used to promote feature fill may not be optimal for promoting bulk fill processes. Therefore, the plumbing system of the invention provides for additional chemistry capability, such that the feature fill processes and the bulk fill processes may be both conducted on the same platform, even though different chemistries are required to optimize each process. More particularly, processing locations 102 and 104 may include plating cells 200 positioned thereon, wherein the plating cells are configured to promote pulp fill plating processes. Although the plating cell used for feature fill may be essentially identical to the plating cell used for bulk fill, the chemistries supplied to the respective cells is generally, different. Thus, the plumbing system of the present invention may be configured to provide a separate catholyte and/or anolyte to tanks 1918–1911, which are generally configured to supply these respective solutions to processing locations 102 104. Specifically, fluid delivery system 1811 may be activated and caused to generate a catholyte solution configured to promote pulp fill plating processes. The catholyte solution may be delivered to manifold 1832, which supplies the catholyte solution to fluid conduit 1902. Fluid conduit 1902 may deliver the bulk fill catholyte solution to tanks 1909 and 1911. Similarly, fluid delivery system 1811 may be used to generate an anolyte solution for the bulk fill process, and this anolyte solution may be delivered to tanks 1908 and 1910 via conduit 1903.

Once plating solutions delivered to the respective tanks, substrates may be introduced into processing platform 100 and positioned in one of processing locations 110 or 112. Features formed onto the substrate may be filled in a feature fill plating process conducted at processing locations 110 or 112. Thereafter, the substrates may be transferred, to processing locations 102 or 104 for a bulk fill process. The process is conducted in processing locations 110 112 may use a separate or different chemistry from the process is conducted at cell locations 102 104. Further still, the chemical solution used at anyone processing locations, i.e. processing locations 112, may be different from any other processing location, i.e. processing locations 110, as the fluid delivery system 1811 and the plumbing system of the present invention allows for separate chemistries to be supplied to each individual plating cell on the processing platform 100.

In another embodiment of the invention a degasser may be positioned in one of the fluid conduits of the invention to remove bubbles from the fluid flowing through the conduit. The degasser may, for example, be positioned in one of the conduits that connects the tanks to the plating cells and operate to remove any bubbles from the fluid (plating solution) supplied to the plating cells. Additionally, since a plurality of pumps may be needed to generate fluid flow in the plating system of the invention, filters may be positioned in one or more of the fluid conduits. The filters may be configured to remove any particles generated by the mechanical components of the pumps from the fluid flow prior to the fluid reaching the plating cells.

In order to minimize defects in plated films, bubbles adhering to the substrate surface during the process of immersing the substrate into the plating solution contained in a plating cell should be minimized. Therefore, embodiments of the invention provide a method for immersing a substrate into a processing fluid that generates minimal bubbles. The immersion method of the invention begins with the process of loading a substrate into a head assembly that is configured to support and electrically contact the substrate. The head assembly generally includes a contact ring and a thrust plate assembly that are separated by a loading space. A more detailed description of the contact ring and thrust plate assembly may be found in commonly assigned U.S. patent application Ser. No. 10/278,527, now U.S. Pat. No. 7,025,862 which was filed on Oct. 22, 2002 under the title "Plating Uniformity Control By Contact Ring Shaping", which is hereby incorporated by reference in its entirety. A robot is used to position a substrate on the contact ring via an access space. More particularly, the robot may be a vacuum-type robot configured to engage a backside of the substrate with a reduced pressure engaging device. The substrate may then be supported in a face down (productions surface facing down) orientation with the vacuum engaging device attached to the backside or non-production surface of the substrate. The robot may then extend into contact ring via the access space, lower to position the substrate on the contact pins/substrate support surface of contact ring, disengage the vacuum engaging device, rise to a withdrawal height, and then withdraw from the contact ring.

Figure 24:
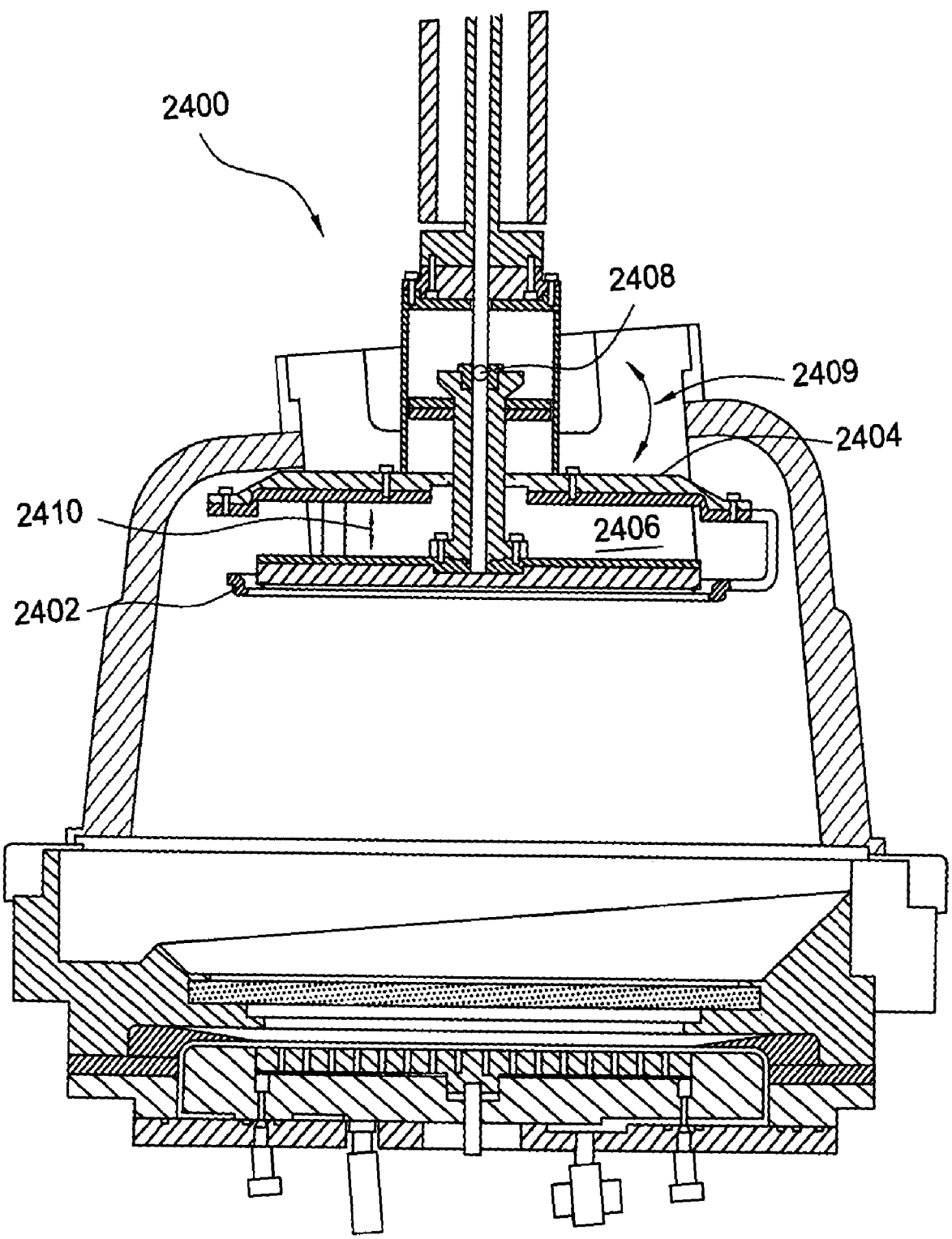
FIG. 24 illustrates a sectional view of a plating cell and head assembly during a tilting process.

Once the substrate is positioned on the contact ring 2402, thrust plate assembly 2404 may be lowered into a processing position. More particularly, FIG. 24 illustrates thrust plate 2404 in a substrate loading position, i.e., thrust plate 2404 is vertically positioned above the lower surface of contact ring 2402 such that the access space 2406 is maximized. In this position, robot 120 has the most amount of space available to loading the substrate onto the contact ring 2402. However, once the substrate is loaded, thrust plate 2404 may be actuated vertically, i.e., in the direction indicated by arrow 2410 in FIG. 24, to engage the backside of the substrate positioned on the, contact ring 2402. The engagement of the thrust plate 2404 with the backside of the substrate positioned on the contact ring 2402 operates to mechanically bias the substrate against the electrical contact pins positioned on contact ring 2402, while also securing the substrate to the contact ring 2402 for processing.

Once the substrate is secured to the contact ring 2402 by the thrust plate 2404, the lower portion of the head assembly 2400, i.e., the combination of the contact ring 2402 and the thrust plate 2404, are pivoted to a tilt angle. The lower portion of the head assembly is pivoted to the tilt angle via pivotal actuation of the head assembly about a pivot point 2408. The lower portion of head assembly 2400 is actuated about pivot point 2408, which causes pivotal movement of the lower portion of head assembly 2400 in the direction indicated by arrow 2409 in FIG. 24. The lower portion of head assembly 2400 and the plating surface of the substrate positioned on the contact ring 2402 are tilted to the tilt angle as a result of the movement of head assembly 2400, wherein the tilt angle is defined as the angle between horizontal and the plating surface/production surface of the substrate secured to the contact ring 2402. The tilt angle is generally between about 3° and about 30°, and more particularly, between about 3° and about 10°.

Figure 25:
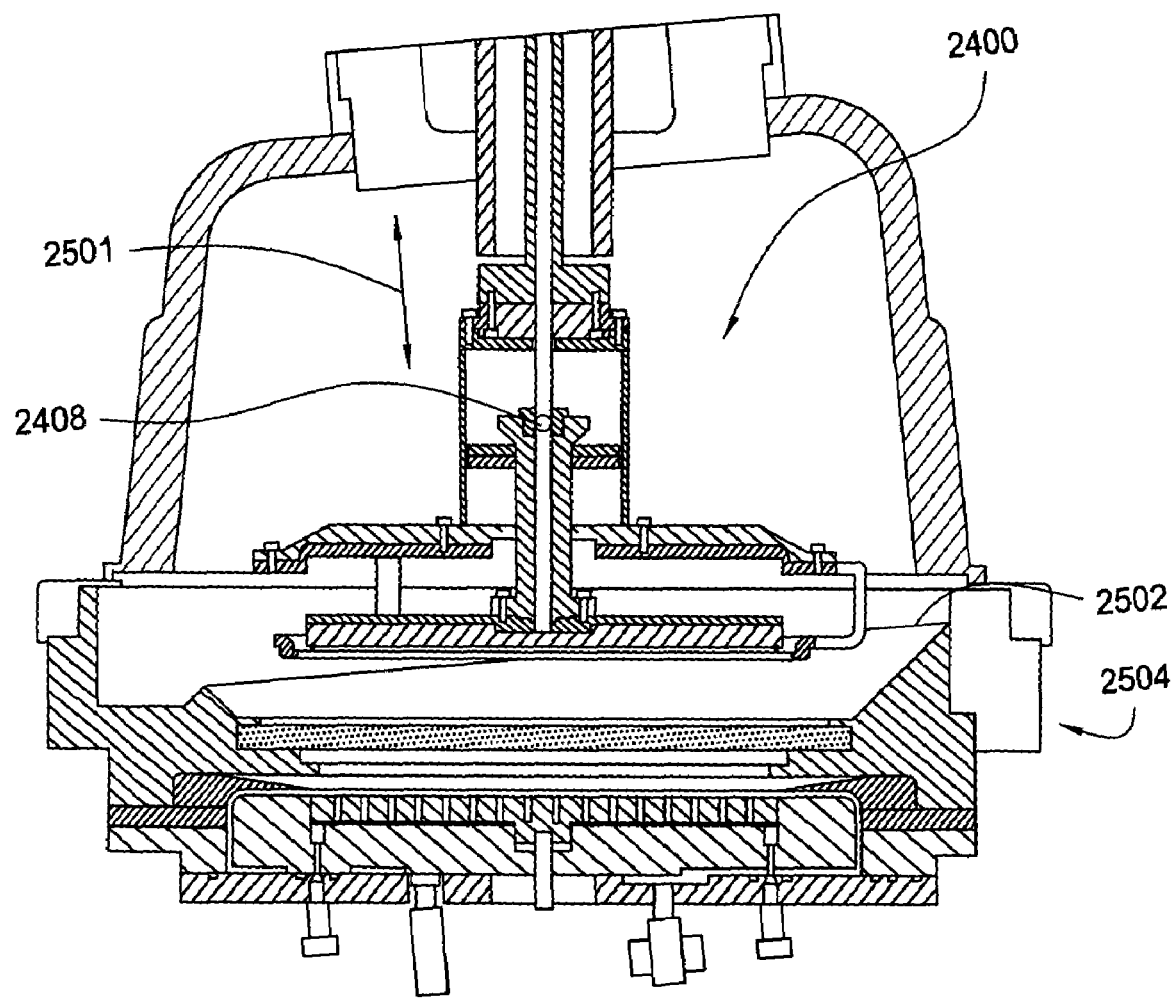
FIG. 25 illustrates a sectional view of a plating cell and head assembly during an immersion process, i.e., during vertical actuation.

Once the head assembly 2400 is tilted, it may be actuated in the Z-direction to begin the immersion process. More particularly, head assembly 2400 may be actuated in the direction indicated by arrow 2501, as illustrated in FIG. 25, to bring the substrate positioned in the contact ring 2402 toward the plating solution contained Within the plating cell 2504 positioned below head assembly 2400. Plating cell 2504, which is generally similar to plating cell 200 illustrated in FIG. 2, is configured to contain a plating solution therein. The plating solution is generally contained within the inner weir of the plating cell 2504 and overflows the uppermost point 2502 of the inner weir. Therefore, as head assembly 2400 is moved toward plating cell 2504, the lower side of contact ring 2402, i.e., the side of contact ring 2402 positioned closest to the plating cell 2504 as a result of the tilt angle, contacts the plating solution as the head assembly, 2400 is actuated toward cell 2502. The process of actuating head assembly 2400 toward cell 2502 may further include imparting rotational movement to contact ring 2402. Thus, during the initial stages of the immersion process, contact ring 2402 is being actuated in a vertical or Z-direction, while also being rotated about a vertical axis extending upward through head assembly 2400. Generally, the vertical axis about which contact ring 2402 is rotated is generally orthogonal to the substrate surface. The process of immersing the substrate into the plating solution while applying a bias to the substrate is described in commonly assigned U.S. patent application Ser. No. 09/766,060, now U.S. Pat. No. 6,551,484 filed on Jan. 18, 2001 entitled "Reverse Voltage Bias for Use in Electro-Chemical Plating System," which claims benefit of U.S. Pat. No. 6,258,220, filed Apr. 8, 1999, both of which are hereby incorporated by reference in their entirety.

Figure 26:
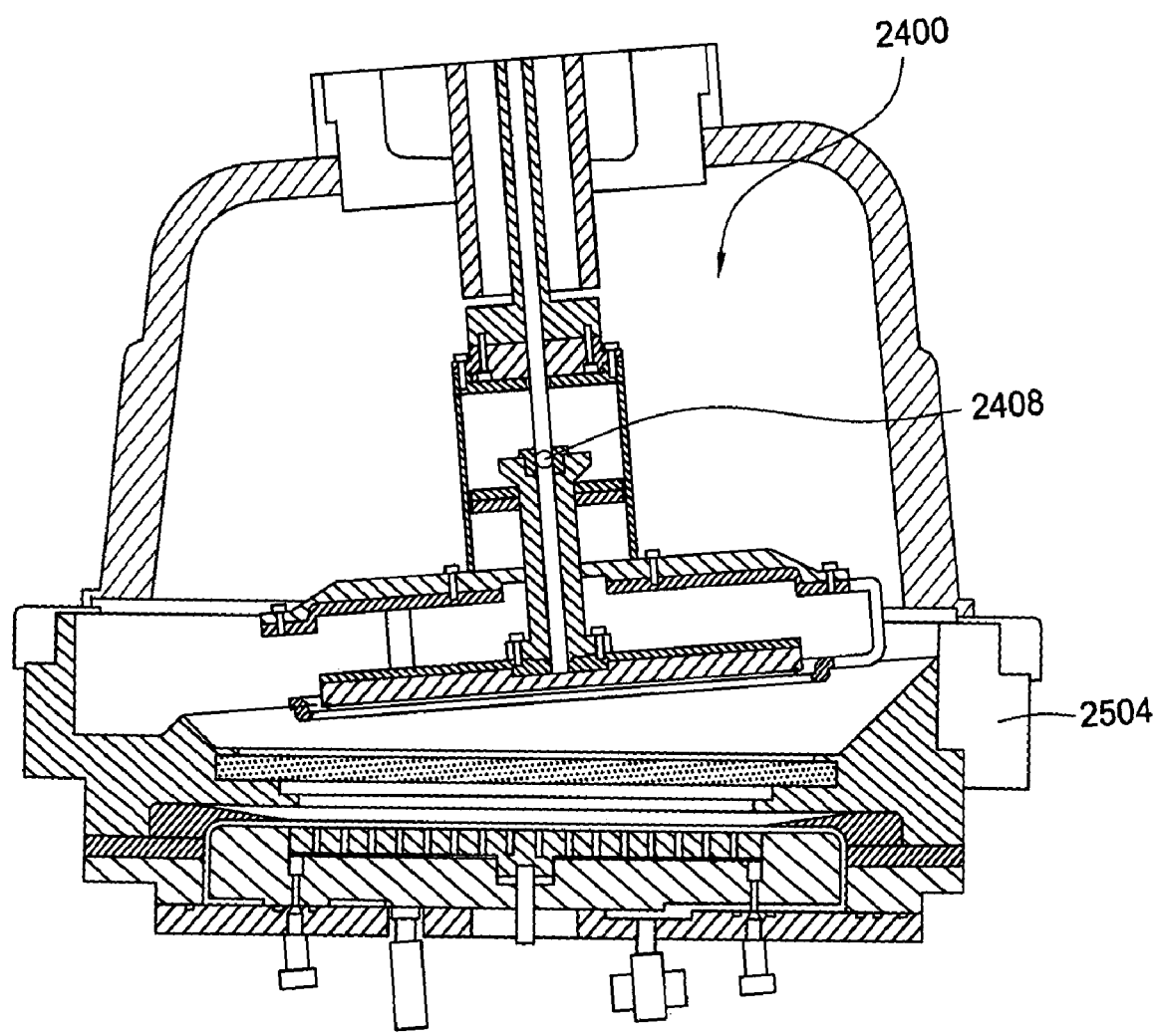
FIG. 26 illustrates a sectional view of a plating cell and head assembly during a tilting process after immersion.

As the substrate becomes immersed in the plating solution contained within plating cell 2504, the Z-motion of head assembly 2400 is terminated and the tilt position of contact ring 2402 is returned to horizontal, as illustrated in FIG. 26. The termination of the vertical or the Z-direction movement is calculated to maintain the substrate in the plating solution contained in cell 2504 when the tilt angle is removed. Further, embodiments of the invention contemplate that the removal of the tilt angle, i.e., the return of contact ring 2402 to a horizontal position, may be conducted simultaneously with the vertical movement of contact ring 2402 into the plating solution. As such embodiments of the invention contemplate that the substrate may first contact the plating solution with the substrate being positioned at a tilt angle, and then the tilt angle may be returned to horizontal while the substrate continues to be immersed into the plating solution. This process generates a unique movement that includes both vertical actuation and tilt angle actuation, which has been shown to reduce bubble formation and adherence to the substrate surface during the immersion process. Further, the vertical and pivotal actuation of the substrate during immersion process may also include rotational movement of contact ring 2402, which has been shown to further minimize bubble formation and adherence to the substrate surface during the immersion process.

Figure 27:
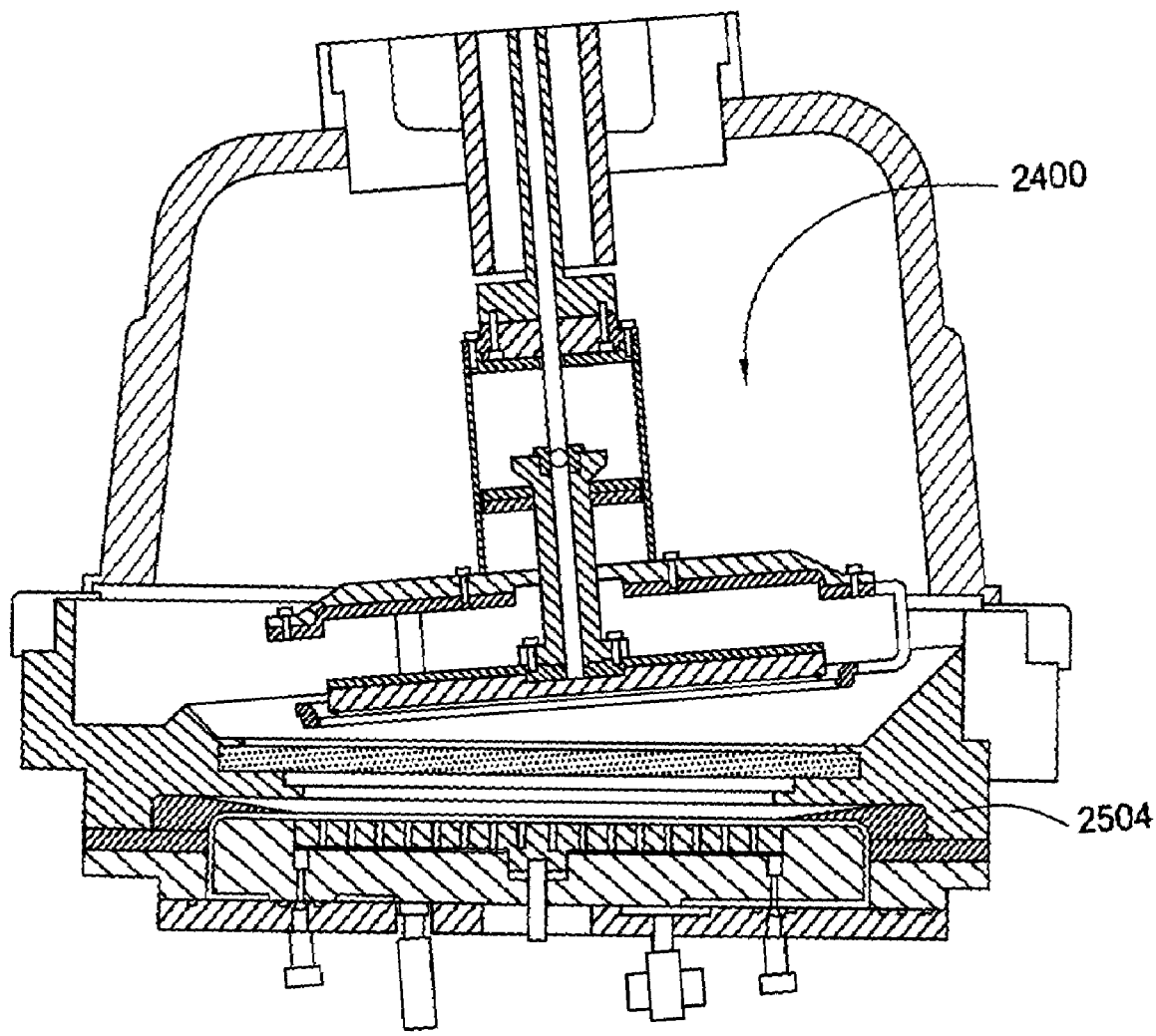
FIG. 27 illustrates a sectional view of a plating cell and head assembly during an immersion process wherein the head assembly is positioning the substrate deeper in the plating solution.
Figure 28:
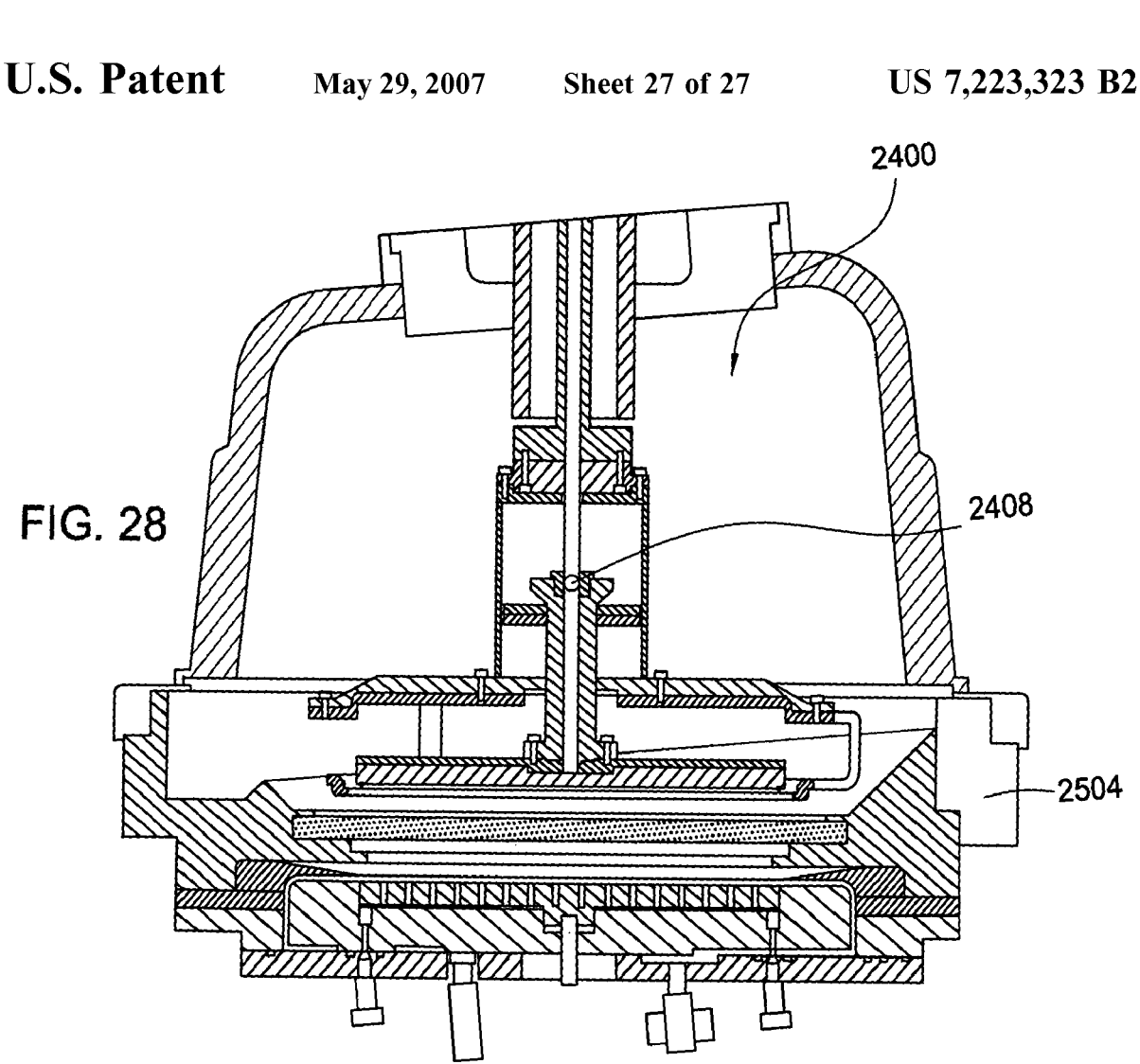
FIG. 28 illustrates a sectional view of a plating cell and head assembly positioned in a processing position.

Once the substrate is completely immersed into the plating solution contained within cell 2504, head assembly 2400 may be further actuated in a vertical direction (downward) to further immerse the substrate into the plating solution, i.e., to position the substrate further or deeper into the plating solution, as illustrated in FIG. 27. This process may also include rotating the substrate, which operates to dislodge any bubbles formed during the immersion process from the substrate surface. Once the substrate is positioned deeper within the plating solution, the head assembly 2400 may again be pivoted about pivot point 2408, so the substrate surface may be positioned at the tilt angle, as illustrated in FIG. 8. Further, inasmuch head assembly 2400 just actuated the substrate downward into the plating solution in the previous step, the tilting motion illustrated in FIG. 8 generally will not raise the surface of the substrate out of the plating solution on the high side of the tilted contact ring. More particularly, since pivot point 2408 is positioned in the middle of head assembly 2400, when the head assembly pivots the contact ring 2402 about pivot point 2408, one side of the contact ring 2402 is immersed further into the plating solution, while the opposing side of the contact ring 2402 is raised upward toward the surface of the plating solution as a result of the pivotal motion. Thus, since the substrate is intended to be maintained within the plating solution once immersed therein, head assembly 2400 must be actuated further into the plating solution in order to move the contact ring 2402 from the horizontal position illustrated in FIG. 27 to the tilted position illustrated in FIG. 28 without raising at least a portion of the substrate out of the plating solution. This final tilting motion of head assembly 2400 generally corresponds to positioning contact ring 2402 in a processing position, i.e., a position where the substrate supported by contact ring 2402 is generally parallel to an anode positioned in a lower portion of the plating cell 2502. Further, positioning contact ring 2402 in the processing position may include further actuating head assembly 2400 toward the anode positioned in the lower portion of the plating cell, so that the plating surface of the substrate may be positioned at a particular distance from the anode for the plating process.

Additionally, the immersion process of the invention may include an oscillation motion configured to further enhance the bubble removal process. More particularly, head assembly 2400 may be tilted back and forth between a first tilt angle and a second tilt angle in an oscillatory manner, i.e., in a manner where the substrate is tilted between a first angle and a second angle several times, once the substrate is immersed in the plating solution. This tilting motion may be conducted in a quick manner, i.e., from about 2 tilts per second up to about 20 tilts per second. The tilting motion may be accompanied by rotation, which further facilitates dislodging bubbles that are adhering to the substrate surface.

The immersion process of the invention may also include vertical oscillation of the substrate in the plating solution. More particularly, once the substrate is immersed in the plating solution, the substrate may be actuated up and down. When the substrate is raised upward in the plating solution, the volume of solution below the substrate is increased, and therefore, a rapid flow of solution to the area below the substrate is generated. Similarly, when the substrate is lowered, the volume decreases and an outward flow of solution is generated. As such, actuation of the substrate vertically, i.e. repeated upward and downward motions, causes reversing or oscillating fluid flows to occur at the substrate surface. The addition of rotation to the oscillation further increases the oscillating fluid flows across the substrate surface. These oscillating fluid flows have been shown to improve bubble removal, and therefore, decrease defects.

The immersion process of the invention may further include oscillating the rotation of the substrate once it is immersed in the plating solution. More particularly, the substrate is generally rotated during both the immersion and plating processes. This rotation generally increases fluid flow at the substrate surface via circulation of the depleted plating solution that is generated at the substrate surface. These rotation and fluid flow characteristics may also be used during the immersion process to facilitate bubble removal. More particularly, embodiments of the invention contemplate that the substrate may be rotated at varying rotation rates and in varying directions during and/or after the substrate is immersed. For example, once the substrate is immersed in the solution, the substrate may first be rotated in a clockwise direction for a predetermined period of time before the rotation direction is switched to counter clockwise for a predetermined period of time. The rotation direction may be switched several times, or only once, depending upon the application.

Additionally, embodiments of the invention may implement a combination of the oscillation methods described above. For example, an immersion process of the invention may include tilt actuation, rotational actuation, and vertical actuation, or any combination thereof.

Figure 29:
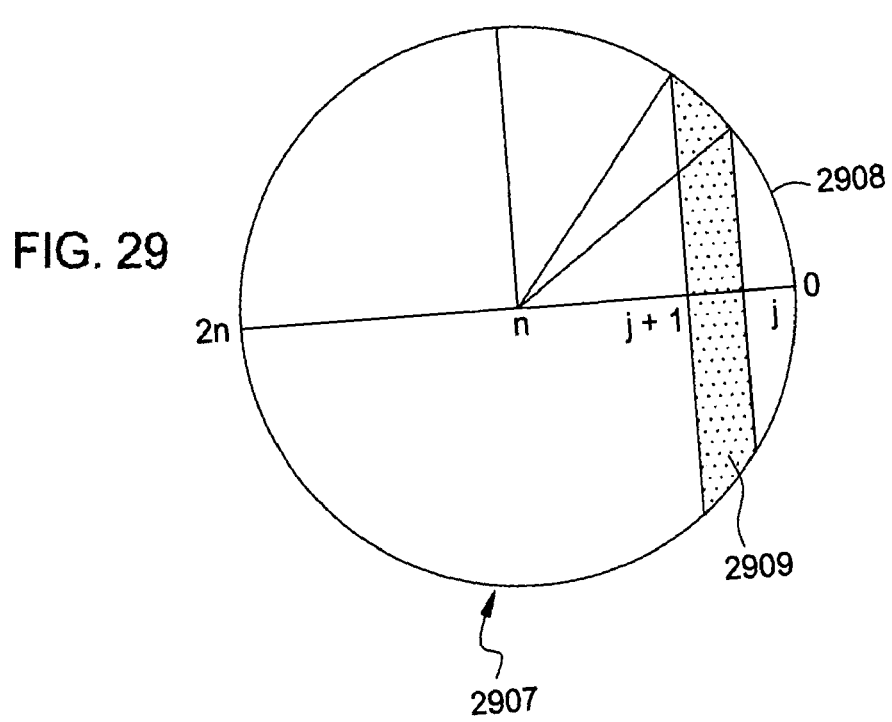
FIG. 29 illustrates a view of the substrate area during immersion.

FIG. 29 illustrates a diagram of a substrate surface as the substrate surface is being immersed into electrolyte solution without being rotated and with the substrate tilted from horizontal to a tilt angle. In this embodiment, substrate 2907 begins the immersion as the edge of the substrate first contacts the electrolyte solution at a first edge 2908 of substrate 2907. As the vertical motion of the substrate support member or head assembly continues, the area of the substrate immersed in the electrolyte solution proportionally increases, as illustrated by the shaded area 2909. It is to be noted, however, that the shaded area 2909 does not represent the total immersed area. Rather, area 2909 generally represents the most recently immersed area, and therefore, the area from the edge of the substrate to the line labeled j+1 would represent the total immersed area of the substrate at time J+1. Therefore, and in order for a power supply to provide a constant current density across the surface of the substrate during the immersion process, the time varying area of the substrate being immersed may be calculated, or otherwise estimated or determined, and used to determine a time varying current necessary to provide a constant current density across the area of the substrate immersed in the electrolyte solution. As such, embodiments of the present invention supply current to the substrate as a function of the immersion speed of the substrate, as the immersion speed of the substrate, i.e., the vertical rate at which the substrate is immersed into the plating solution, directly corresponds to the change of the immersed area of the substrate during the immersion process. Additionally, although the substrate is generally rotated during the immersion process, the area calculation will be unchanged in non-rotation embodiments, as the rotation of the substrate does not increase or decrease the area of the substrate being immersed in the plating solution per unit time.

The calculation of the time varying area of the substrate immersed in the electrolyte solution generally includes incrementally calculating the area of minute sections of the immersed portion of the substrate and summing the sections together to obtain the total area immersed for a particular time. The calculation and application of current to the substrate during the immersion process is illustrated in co-pending and commonly assigned U.S. patent application Ser. No. 10/135,546, now U.S. Pat. No. 6,911,136 entitled Apparatus and Method for Regulating the Electrical Power Applied to a Substrate During Immersion, filed on Apr. 29, 2002, which is hereby incorporated by reference in its entirety. Further, although the referenced application is generally directed to controlling an immersion bias, Applicants contemplate that the methodology may be utilized to control a removal bias, as will be further discussed herein.

In one embodiment of the invention, the current supplied to the substrate is increased as the immersion surface area increases in accordance with a time calculation. For example, the total time for an immersion process can be determined through experimentation. Thereafter, a correlation between the elapsed time in the immersion process and the immersed surface area can be determined through calculation. As such, with the correlation between the elapsed time and immersion area determined, the current and supply to the substrate can then be determined in accordance with the increase in the immersion time, as the time is proportional to the immersion area. Therefore, knowing the correlation between the immersion time and the immersion surface area, processing recipes can be modified to include a proportional change in the current supplied to the substrate during the immersion process so that a uniform current density across the immersed surface area can be maintained throughout the immersion process.

In another embodiment of the invention, a sensor may be used to determine the exact radial or tilting position of the substrate during the immersion process. As such, the position is transmitted to the controller, which may then calculate the immersed area in a real-time manner. The calculated, immersed area may then be used to determine the current to be supplied to the substrate in order to maintain a uniform current density across the immersed substrate area. The granularity/incremental section sampling of the measurement process may be increased simply by taking more measurements per unit time, and therefore, adjusting the current supplied to the immersed surface area more per unit time. Although the end result of the present embodiment is to provide a uniform current density across the immersed surface area of the substrate, the present embodiment also provides for a uniform current density across the immersed area of the substrate during nonuniform immersion processes. For example, if the immersion speed of the substrate is not constant or is not repeatable between respective immersion processes, the invention may be utilized to maintain a uniform current density across the immersed area of the substrate regardless of the immersion speed, as the current calculation is independent of the elapsed immersion time. Therefore, the feedback loop type system of the present embodiment may provide advantages over other embodiments of the invention in specific configurations wherein the elapsed time of the immersion process is not constant across several substrate immersions.

In another embodiment of the invention, the method for maintaining a uniform current density across the surface of the substrate is utilized during the process of removing a substrate from a plating cell. For example, once a plating process for a substrate is complete, the substrate is removed from the plating chamber be reversing the steps of the immersion process. In the reverse immersion process, it may be desirable to maintain a constant current density across the immersed surface of the substrate in order to avoid variances in uniformity, in similar fashion to the constant current density maintained during the immersion process. Therefore, in the reverse immersion process, the current supplied to the substrate may be decreased as the immersed area of the substrate decreases, so that a uniform current density across the immersed area of the substrate may be maintained. The process of controlling the current to the substrate during the reverse immersion process is, for example, conducted to a feedback loop type system or a time varying current control type system, as discussed in the previous embodiments. Regardless of the type of current control system implemented, the current supplied to the substrate during the reverse immersion process will generally be proportional to the surface area of the substrate remaining immersed in the plating solution.

Plating processes involve applying an electrical bias to the substrate via the contact ring 2402. The plating bias is a forward bias, i.e., the plating bias is configured such that the substrate is electrically charged to be more negative than the anode 205 in the plating cell, so that the positively charged metal ions in the plating solution will plate on the negatively charged substrate. In conventional, plating systems, once the plating process is completed, the electrical bias is terminated and the substrate is removed from the plating cell. However, as noted above, conventional plating systems and methods generally include at least a small time delay between the termination of the plating bias and the removal of the substrate from the plating solution. During this time delay, the substrate is in contact with the plating solution, and since plating solutions are often acidic in nature, the plating solution can etch the surface of the plated layer during the time delay. This etching causes the smooth surface of the plated layer to roughen, which is not beneficial to subsequent processing steps, such as CMP processes.

Therefore, the method and apparatus of the present invention is configured to apply a forward substrate removal bias (the substrate is negative relative to the anode) to the substrate during the delay time. The removal bias is configured to prevent etching of the surface of the plated layer, and therefore, the removal bias is configured to preserve the smooth surface of the plated layer. The removal bias is generally applied to the substrate immediately after the plating bias is terminated, i.e., the transition from the plating bias to the removal bias may be seamless, such that the substrate is not exposed to the plating solution without a forward bias applied thereto. The removal bias is calculated to be sufficient to prevent or counteract etching of the plated layer, however, the removal bias is also configured to minimize deposition on the surface of the plated layer. As such, the removal bias may be configured to be just above the plating potential of the system, and the driving current of the removal bias may be minimized, i.e., just enough current to prevent etching while not causing significant deposition on the smooth upper surface of the plated layer.

In similar fashion to the immersion bias control features of the invention described above, embodiments of the invention are also configured to control the current applied during the removal or withdrawal bias. For example, controller 111 may be used to control the current and/or voltage applied to the substrate during the withdrawal process. The electrical current or voltage supplied to the substrate during withdrawal may be controlled in order to prevent additional deposition on areas of the substrate that remain immersed in the plating solution longer than other areas of the substrate, as deposition thickness in an electrochemical plating process is generally a function of exposure time to the plating solution. Further, the voltage or current may be controlled during the substrate withdrawal process in order to prevent the current density on the immersed portion of the substrate from increasing, which will also generally cause an increased plating..rate on the portions of the substrate that remain immersed in the plating solution.

Embodiments of the invention contemplate that either a voltage control (control system where the voltage is monitored and adjusted in order to control the electrical current or power applied) or a current control system (control system where the current itself is monitored and controlled) may be used to control the removal bias. A current control system may be used to control the removal bias by maintaining a constant current density across the substrate surface during the entire substrate removal process. More particularly, as noted above with regard to maintaining a constant current density across the substrate surface during the immersion process, as the substrate is removed from the plating solution, the resistance of the electrical circuit supplying the removal bias changes. The resistance change is a result of the decreasing immersed conductive surface area of the substrate, which results in an increase in the resistance of the circuit. Therefore, as the resistance of the circuit increases and the immersed surface area decreases, the current control system of the invention may react to these changes to decrease the current supplied to the substrate so that the current density across the surface of the substrate remains constant through the withdrawal process. The control system may control the current in a closed loop manner, i.e., the current control system may be configured to measure the resistance or other electrical parameter of the removal bias circuit and control the current supplied thereto accordingly. Alternatively, the current control system may be configured to control the removal bias in response to a mechanical condition, such as the position off the substrate or another measurable mechanical parameter. For example, the position of the substrate, i.e., the vertical position of the substrate relative to the plating solution during the withdrawal process, may be correlated with the immersed surface area of the substrate, and therefore, the position of the substrate may also be used to control the electrical removal bias applied to the substrate. Further still, the electrical bias may be controlled in a time dependent manner, i.e., the electrical removal bias may be adjusted per unit of time that the substrate continues through a removal process, thus essentially equating time or duration of the removal process with the immersed surface area of the substrate.

During the substrate removal process, the substrate may be rotated, tilted, pivoted, vertically actuated, horizontally actuated, and/or vibrated with sonic or ultrasonic energy. For example, during a removal process of the invention, a substrate may be rotated in the plating solution while the removal bias is initiated. The substrate may then be raised vertically out of the solution to remove the substrate from the solution. During the raising process the surface area of the substrate is incrementally removed from the plating solution and the electrical bias supplied thereto is controlled in accordance with the proportion of the surface area removed from the solution (or remaining in the solution), as noted above. The substrate may be held in a horizontal position, i.e., in a position where the surface of the substrate is generally parallel to the upper surface of the plating solution contained in a weir-type plater. Alternatively, the surface of the substrate may be tilted from horizontal, i.e., the surface of the substrate may be positioned such that a tilt angle is formed between the substrate surface and the upper surface of the plating solution in a weir-type plater. In this configuration, when the substrate is vertically moved or raised out of the solution, the tilt angle between the substrate surface and the upper surface of the plating solution remains constant. However, embodiments of the invention also contemplate that the tilt angle may be varied during the removal process. For example, the tilt angle may be increased or decreased during the substrate removal process, such that the vertical movement of the substrate out of the solution does not result in the tilt angle remaining constant, rather, the tilt angle increases or decreases as the substrate is removed.

During the removal process, for example, the substrate may be,rotated between about 5 rpm and about 100 rpm, or more particularly, between about 20 rpm and about 60 rpm. The tilt angle of the substrate may be between about 3° and about 30°, or more particularly, between about 5° and about 20°. The tilt angle may also be increased or decreased, as well as pivoted or oscillated during the removal process. The electrical bias applied to the substrate during the removal process may be configured to generate an electrical current density across the surface of the substrate of between about 0.5 mA/cm$^3$ and about 5 mA/cm$^3$, or more particularly, between about 0.5 mA/cm$^3$ and about 1 mA/cm$^3$, or more particularly, between about 1.0 mA/cm$^3$ and about 3 mA/cm$^3$. The voltage applied to the substrate during removal may be between about 0.3 volts and about 10 volts, for example, and more particularly, between about 0.8 volts and about 5 volts.

While the foregoing is directed to embodiments of the present invention, other and further embodiments of the invention may be devised without departing from the basic scope thereof, and the scope thereof is determined by the claims that follow.

What is claimed is:

1. An electrochemical plating system comprising:
    a substrate loading station positioned in communication with a mainframe processing platform;
    at least one substrate plating cell positioned on the mainframe;
    at least one substrate bevel cleaning cell positioned on the mainframe;
    at least one spin rinse dry cell positioned on the mainframe in a substrate transfer path between the at least one substrate plating cell and the substrate loading station, wherein the at least one spin rinse dry cell comprises:
        a cell bowl having an upstanding cylindrical wall;
        an annular and inwardly curving pressure reducing surface positioned on a top portion of the upstanding cylindrical wall;
        a fluid receiving shield attached to, and extending radially inward from, an upper portion of the upstanding cylindrical wall, wherein the fluid receiving shield has a plurality of holes;
        a rotatable substrate support member centrally positioned in the cell bowl; and
        a fluid dispensing nozzle configured to dispense a rinsing solution onto an upper surface of a substrate positioned on the support member; and
    a stacked substrate annealing station positioned in communication with at least one of the mainframe and the loading station, each chamber in the stacked substrate annealing station having a substrate heating plate and a substrate cooling plate adjacently positioned therein.

* * * * *

UNITED STATES PATENT AND TRADEMARK OFFICE
CERTIFICATE OF CORRECTION

PATENT NO.      : 7,223,323 B2
APPLICATION NO. : 10/616284
DATED           : May 29, 2007
INVENTOR(S)     : Yang et al.

It is certified that error appears in the above-identified patent and that said Letters Patent is hereby corrected as shown below:

In the Specification:
In Column 5, Line 56, please delete "position" and insert --positioned--;
In Column 6, Line 56, please delete "an," and insert --an--;
In Column 7, Line 23, please delete "generally," and insert --generally--;
In Column 7, Line 25, please delete "region," and insert --region--;
In Column 8, Line 48, please delete "tabs," and insert --tabs--;
In Column 8, Lines 48-49, please delete "generally," and insert --generally--;
In Column 8, Line 58, please delete "to";
In Column 16, Line 4, please delete "gas," and insert --gas--;
In Column 16, Line 67, please delete "includes" and insert --include--;
In Column 17, Line 60, please delete "solution," and insert --solution--;
In Column 18, Line 2, please delete "dispending" and insert --dispensing--;
In Column 18, Line 44, please delete "the:fluid" and insert --the fluid--;
In Column 18, Line 47, please delete "projecting," and insert --projecting--;
In Column 20, Line 18, please delete "When" and insert --when--;
In Column 21, Line 19, please delete "the," and insert --the--;
In Column 22, Line 1, please delete "in," and insert --in--;
In Column 22, Line 12, please delete "process" and insert --process,--;
In Column 22, Line 20, please delete "bowing" and insert --bowing.--.
In Column 22, Line 33, please delete "the," and insert --the--;
In Column 24, Line 18, please delete "production," and insert --production--;
In Column 24, Line 58, please delete "were" and insert --where--;
In Column 24, Line 59, please delete "dispensing," and insert --dispensing--;
In Column 25, Line 22, please delete "at," and insert --at--;
In Column 25, Line 67, please delete "parts." and insert --parts--;
In Column 26, Line 42, please delete "again," and insert --again--;
In Column 26, Line 43, please delete "rates:" and insert --rates--;
In Column 27, Line 29, please delete "ratio," and insert --ratio--;
In Column 28, Line 12, please delete "to," and insert --to--;
In Column 28, Line 18, please delete "one:" and insert --one--;
In Column 28, Line 22, please delete "second," and insert --second--;
In Column 29, Line 34, please delete "oh" and insert --on--;
In Column 29, Line 52, please delete "copper,," and insert --copper,--;
In Column 30, Line 36, please delete "to," and insert --to--;
In Column 31, Line 57, please delete "are," and insert --are--;
In Column 32, Line 58, please delete "depth," and insert --depth--.
In Column 33, Line 45, please delete "1906:may" and insert --1906 may--;
In Column 34, Line 8, please delete "generally," and insert --generally--;
In Column 34, Line 32, please delete "anyone" and insert --any one--;
In Column 35, Line 25, please delete "the," and insert --the--;
In Column 35, Line 54, please delete "Within" and insert --within--;

UNITED STATES PATENT AND TRADEMARK OFFICE
CERTIFICATE OF CORRECTION

PATENT NO. : 7,223,323 B2
APPLICATION NO. : 10/616284
DATED : May 29, 2007
INVENTOR(S) : Yang et al.

It is certified that error appears in the above-identified patent and that said Letters Patent is hereby corrected as shown below:

In the Specification:
In Column 35, Line 64, please delete "assembly," and insert --assembly--;
In Column 36, Line 26, please delete "such" and insert --such,--;
In Column 39, Line 32, please delete "be" and insert --by--;
In Column 39, Line 57, please delete "conventional," and insert --conventional--;
In Column 40, Line 39, please delete "plating..rate" and insert --plating rate--;
In Column 41, Line 2, please delete "off" and insert --of--;
In Column 41, Line 46, please delete "be," and insert --be--.

Signed and Sealed this

Twenty-eighth Day of August, 2007

JON W. DUDAS
*Director of the United States Patent and Trademark Office*